United States Patent
Kang et al.

(10) Patent No.: US 11,498,987 B2
(45) Date of Patent: Nov. 15, 2022

(54) POLYMER, COATING COMPOSITION COMPRISING SAME, AND ORGANIC LIGHT EMITTING ELEMENT USING SAME

(71) Applicant: LG Chem, Ltd., Seoul (KR)

(72) Inventors: Esder Kang, Daejeon (KR); Jaesoon Bae, Daejeon (KR); Jaechol Lee, Daejeon (KR); Jinseck Kim, Daejeon (KR); Hwakyung Kim, Daejeon (KR); Kwanghyun Kim, Daejeon (KR); Byungjae Kim, Daejeon (KR)

(73) Assignee: LG Chem, Ltd.

( * ) Notice: Subject to any disclaimer, the term of this patent is extended or adjusted under 35 U.S.C. 154(b) by 414 days.

(21) Appl. No.: 16/650,697

(22) PCT Filed: Feb. 28, 2019

(86) PCT No.: PCT/KR2019/002410
§ 371 (c)(1),
(2) Date: Mar. 25, 2020

(87) PCT Pub. No.: WO2019/168365
PCT Pub. Date: Sep. 6, 2019

(65) Prior Publication Data
US 2020/0321529 A1    Oct. 8, 2020

(30) Foreign Application Priority Data

Feb. 28, 2018    (KR) .................. 10-2018-0024565

(51) Int. Cl.
*H01L 51/50*    (2006.01)
*C08F 212/14*    (2006.01)
(Continued)

(52) U.S. Cl.
CPC .......... *C08F 212/26* (2020.02); *C08F 212/32* (2013.01); *C09D 5/24* (2013.01);
(Continued)

(58) Field of Classification Search
None
See application file for complete search history.

(56) References Cited

U.S. PATENT DOCUMENTS

2004/0067387 A1    4/2004    Kim et al.
2006/0142520 A1*   6/2006    Jones ............... C08F 230/02
                                                526/328.5
(Continued)

FOREIGN PATENT DOCUMENTS

JP    2012111719 A    6/2012
JP    2012146811 A    8/2012
(Continued)

OTHER PUBLICATIONS

Supplemental European Search Report for EP19760366.5 dated Nov. 16, 2020; 6 pages.
(Continued)

*Primary Examiner* — Gregory D Clark
(74) *Attorney, Agent, or Firm* — Lerner, David, Littenberg, Krumholz & Mentlik, LLP

(57) ABSTRACT

The present specification relates to a polymer including: a first unit represented by Formula 1; and a second unit represented by Formula 2, a coating composition including the same, and an organic light emitting device formed by using the same.

19 Claims, 1 Drawing Sheet

(51) Int. Cl.
    *C08F 212/32*     (2006.01)
    *C09D 5/24*     (2006.01)
    *C09D 125/18*     (2006.01)
    *C09K 11/06*     (2006.01)
    *H01L 51/00*     (2006.01)

(52) U.S. Cl.
    CPC ............ *C09D 125/18* (2013.01); *C09K 11/06* (2013.01); *H01L 51/0035* (2013.01); *H01L 51/0043* (2013.01); *C09K 2211/1466* (2013.01); *H01L 51/5012* (2013.01); *H01L 51/5016* (2013.01); *H01L 51/5056* (2013.01); *H01L 51/5088* (2013.01)

(56) References Cited

U.S. PATENT DOCUMENTS

| | | |
|---|---|---|
| 2016/0025998 A1 | 1/2016 | Ruhland et al. |
| 2016/0181535 A1 | 6/2016 | Tsuji et al. |
| 2016/0225998 A1* | 8/2016 | Kato .................. H01L 51/0043 |
| 2019/0106390 A1 | 4/2019 | Lee et al. |

FOREIGN PATENT DOCUMENTS

| | | |
|---|---|---|
| KR | 20040028954 A | 4/2004 |
| KR | 101136878 B1 | 4/2012 |
| KR | 20170112039 A | 10/2017 |
| WO | 2013096918 A1 | 6/2013 |
| WO | 2016159293 A1 | 10/2016 |
| WO | 2017031622 A1 | 3/2017 |
| WO | 2017065983 A1 | 4/2017 |
| WO | 2017107117 A1 | 6/2017 |
| WO | 2018000176 A1 | 1/2018 |
| WO | 2018005318 A1 | 1/2018 |

OTHER PUBLICATIONS

Cho, et al.. "Diversification of Carbazoles by LiCl-mediated Catalytic CuI Reaction," Bull. Korean Chemical Society, Jul. 20, 2011, pp. 2461-2464, vol. 32, No. 7.
International Search Report for Application No. PCT/KR2019/002410 dated Jun. 13, 2019, 4 pages.
Ma, B. et al., "New thermally cross-linkable polymer and its application as a hole-transporting layer for solution processed multilayer organic light emitting diodes," Chemistry of Materials, Aug. 25, 2007, pp. 4827-4832, vol. 19, No. 19, abstract only included.

* cited by examiner

| |
|---|
| 701 |
| 601 |
| 501 |
| 401 |
| 301 |
| 201 |
| 101 |

POLYMER, COATING COMPOSITION COMPRISING SAME, AND ORGANIC LIGHT EMITTING ELEMENT USING SAME

CROSS-REFERENCE TO RELATED APPLICATIONS

This application is a national phase entry under 35 U.S.C. § 371 of International Application No. PCT/KR2019/002410 filed Feb. 28, 2019, which claims priority from Korean Patent Application No. 10-2018-0024565 filed Feb. 28, 2018, all of which are incorporated herein by reference.
[Technical Field]

The present specification relates to a polymer, a coating composition including the same, and an organic light emitting device formed by using the same.

BACKGROUND ART

An organic light emission phenomenon is one of the examples of converting an electric current into visible rays through an internal process of a specific organic molecule. The principle of the organic light emission phenomenon is as follows. When an organic material layer is disposed between an anode and a cathode, if an electric current is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic electroluminescent device using the principle may be generally composed of a cathode, an anode, and an organic material layer disposed therebetween, for example, an organic material layer including a hole injection layer, a hole transport layer, a light emitting layer, an electron transport layer, and an electron injection layer.

A material used in the organic light emitting device is mostly a pure organic material or a complex compound where an organic material and metal form a complex, and may be classified into a hole injection material, a hole transport material, a light emitting material, an electron transport material, an electron injection material, and the like according to the use thereof. Herein, an organic material having a p-type property, that is, an organic material, which is easily oxidized and has an electrochemically stable state during oxidation, is usually used as the hole injection material or the hole transport material. Meanwhile, an organic material having an n-type property, that is, an organic material, which is easily reduced and has an electrochemically stable state during reduction, is usually used as the electron injection material or the electron transport material. As the light emitting material, a material having both p-type and n-type properties, that is, a material having a stable form in both oxidation and reduction states is preferred, and a material having high light emitting efficiency for converting an exciton into light when the exciton is formed is preferred.

In addition to those mentioned above, it is preferred that the material used in the organic light emitting device additionally has the following properties.

First, it is preferred that the material used in the organic light emitting device has excellent thermal stability. This is because joule heating occurs due to the movement of electric charges in the organic light emitting device. Since N,N"-di (1-naphthyl)-N,N"-diphenyl-(1,1"-biphenyl)-4,4"-diamine (NPB) currently and mainly used as a hole transport layer material has a glass transition temperature value of 100° C. or less, there is a problem in that it is difficult to use the material in an organic light emitting device requiring a high electric current.

Second, in order to obtain a high-efficiency organic light emitting device which is capable of being driven at low voltage, it is necessary for holes or electrons injected into the organic light emitting device to be smoothly transferred to a light emitting layer, and simultaneously, it is necessary for the injected holes and electrons not to go out of the light emitting layer. For this purpose, a material used in the organic light emitting device needs to have an appropriate band gap and an appropriate highest occupied molecular orbital (HOMO) or lowest unoccupied molecular orbital (LUMO) energy level. Since poly(3,4-ethylenediocythiophene) doped:poly(styrenesulfonic acid) (PEDOT:PSS) currently used as a hole transport material in an organic light emitting device to be manufactured by a solution application method has a lower LUMO energy level than the LUMO energy level of an organic material used as a light emitting layer material, it is difficult to manufacture an organic light emitting device having high efficiency and a long service life.

In addition, the material used in the organic light emitting device needs to have excellent chemical stability, excellent charge mobility, excellent interface characteristics with electrodes or adjacent layers, and the like. That is, the material used in the organic light emitting device needs to be minimally deformed by moisture or oxygen. Further, by having appropriate hole or electron mobility to make a balance between densities of holes and electrons in a light emitting layer of the organic light emitting device, the material used in the organic light emitting device needs to enable excitons to be maximally formed. Moreover, the material used in the organic light emitting device needs to enable the interface with an electrode including a metal or a metal oxide to be improved for the stability of the device.

In addition to those mentioned above, a material used in an organic light emitting device for a solution process needs to additionally have the following properties.

First, the material used in the organic light emitting device needs to form a storable homogenous solution. Since a commercialized material for a deposition process has good crystallinity so that the material is not dissolved well in a solution or the crystals thereof are easily formed even though the material forms a solution, it is highly likely that according to the storage period, the concentration gradient of the solution varies or a defective device is formed.

Second, layers where the solution process is performed need to have solvent and material resistance to other layers. For this purpose, a material capable of forming a polymer self-crosslinked on a substrate through a heat treatment or ultraviolet (UV) irradiation after a curing group is introduced and a solution is applied, like N4,N4"-di(naphthalen-1-yl)-N4,N4"-bis(4-vinylphenyl)biphenyl-4,4"-diamine (VNPB), or capable of forming a polymer having sufficient resistance in the next process is preferred, and a material capable of having solvent resistance itself, like hexaazatriphenylenehexacarbonitrile (HATCN), is also preferred. Since an arylamine-based single molecule generally used in an organic light emitting device (OLED) itself does not have resistance to a solvent in the next process in any cases, a curing group needs to be introduced into the arylamine-based single molecule compound which can be used in the OLED for a solution process.

Therefore, there is a need for developing an organic material having the aforementioned requirements in the art.

DETAILED DESCRIPTION OF INVENTION

Technical Problem

The present specification has been made in an effort to provide a polymer, a coating composition including the same, and an organic light emitting device formed by using the same.

Technical Solution

The present specification provides a polymer including: a first unit represented by the following Formula 1; and a second unit represented by the following Formula 2.

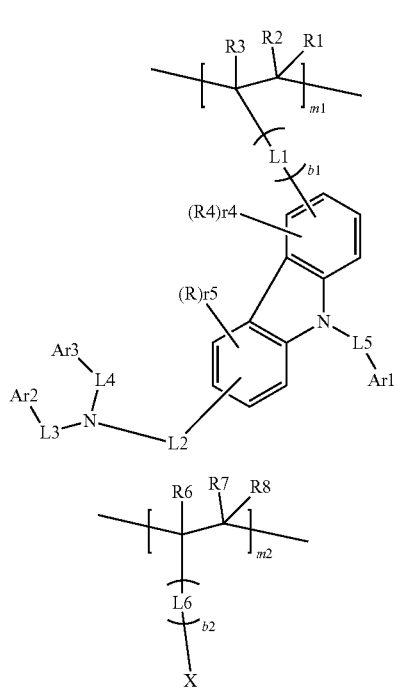

[Formula 1]

[Formula 2]

In Formulae 1 and 2,

L1 to L6 are the same as or different from each other, and are each independently a direct bond; —O—; a substituted or unsubstituted alkylene group; a substituted or unsubstituted arylene group; a substituted or unsubstituted divalent amine group; or a substituted or unsubstituted heteroarylene group, b1 and b2 are each an integer from 1 to 10, when b1 and b2 are each 2 or more, two or more L1's and L6's are each the same as or different from each other, Ar1 to Ar3 are the same as or different from each other, and are each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R1 to R8 are the same as or different from each other, and are each independently hydrogen; deuterium; a halogen group; a hydroxyl group; a nitrile group; a substituted or unsubstituted alkyl group; a substituted or unsubstituted cycloalkyl group; a substituted or unsubstituted aryl group; or a substituted or unsubstituted heterocyclic group, r4 and r5 are each an integer from 1 to 3, when r4 and r5 are each 2 or more, two or more R4's and R5's are each the same as or different from each other, m1 is a mole fraction and 0<m1<1, m2 is a mole fraction and 0<m2<1, m1+m2≤1, X is any one selected from the following structures,

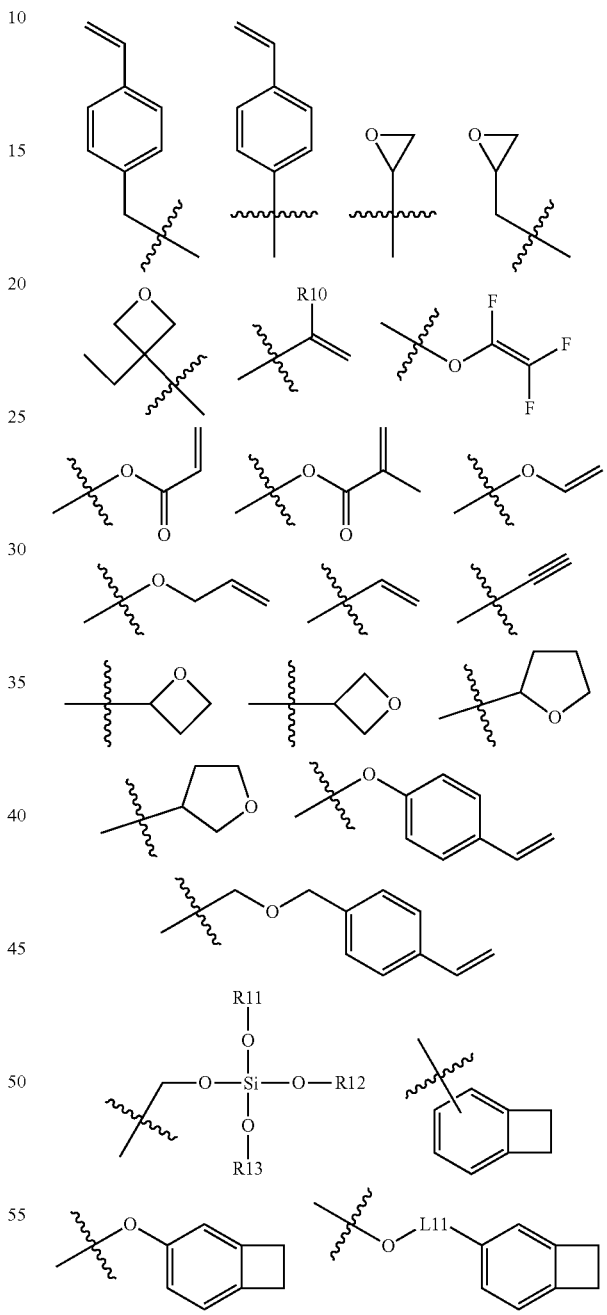

in the structures,

L11 is a substituted or unsubstituted alkylene group; or a substituted or unsubstituted arylene group, R10 to R13 are the same as or different from each other, and are each independently hydrogen; or a substituted or unsubstituted alkyl group having 1 to 6 carbon atoms, and when X is

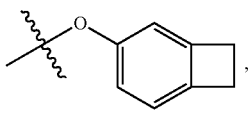, b2 is an integer from 1 to 3.

Further, the present specification provides a coating composition including the polymer.

In addition, the present specification provides an organic light emitting device including: a first electrode; a second electrode provided to face the first electrode; and an organic material layer having one or more layers provided between the first electrode and the second electrode, in which one or more layers of the organic material layer include a cured product of the coating composition.

Advantageous Effects

An organic material layer formed by using the polymer according to an exemplary embodiment of the present specification has excellent thermal and optical stability after curing through heat and light and does not have solubility to other solvents, so that a stacking film-formation process may be performed on the formed film through another solvent process.

Further, the polymer according to an exemplary embodiment of the present specification is used as a material for an organic material layer of an organic light emitting device, so that it is possible to lower a driving voltage of the organic light emitting device.

In addition, the polymer according to an exemplary embodiment of the present specification is used as a material for an organic material layer of an organic light emitting device, so that it is possible to improve the light efficiency.

Furthermore, the polymer according to an exemplary embodiment of the present specification is used as a material for an organic material layer of an organic light emitting device, so that it is possible to improve service life characteristics of the device.

BRIEF DESCRIPTION OF DRAWINGS

The FIG. illustrates an example of an organic light emitting device according to an exemplary embodiment of the present specification.
101: Substrate
201: Anode
301: Hole injection layer
401: Hole transport layer
501: Light emitting layer
601: Layer which simultaneously injects and transports electrons
701: Cathode

BEST MODE

Hereinafter, the present specification will be described in more detail.

The present specification provides a polymer including: the first unit represented by Formula 1; and the second unit represented by Formula 2.

In an exemplary embodiment of the present specification, a polymer including the first unit represented by Formula 1 is a random polymer or a block polymer.

In an exemplary embodiment of the present specification, a polymer including the second unit represented by Formula 2 is a random polymer or a block polymer.

In one exemplary embodiment of the present specification, the first unit represented by Formula 1 and the second unit represented by Formula 2 may constitute a random polymer.

In the present specification, the "unit" means a structure in which a monomer is included and repeated in a polymer, and a structure in which the monomer is bonded into the polymer by polymerization.

In the present specification, "including a unit" means that the unit is included in a main chain in a polymer.

In the present specification, the "monomer" means a monomer or a unit body which is a unit constituting the polymer.

In an exemplary embodiment of the present specification, the first unit represented by Formula 1 has excellent solubility to an organic solvent. Accordingly, when the polymer including the first unit represented by Formula 1 is used in a hole transport layer or a hole injection layer in an organic light emitting device, a solution process is easily applied and uniformity, surface characteristics, and the like of a hole transport layer or hole injection layer manufactured are also excellent, so that it is possible to improve performance and service life characteristics of the device.

In an exemplary embodiment of the present specification, the second unit represented by Formula 2 is derived from a compound having a curing group and a vinyl group. A polymer which does not include an additional curing group has a disadvantage in that the polymer cannot exhibit sufficient solvent resistance. However, the second unit represented by Formula 2 according to the present specification may form a cross-linking bond through a heat treatment due to an additional curing group, and has an effect of exhibiting sufficient solvent resistance.

In the present specification, the "curing group" may mean a reactive substituent which cross-links compounds by being exposed to heat and/or light. The cross-linkage may be produced while radicals produced by decomposing carbon-carbon multiple bond and cyclic structures by means of a heat treatment or light irradiation are linked to each other.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

Examples of the substituents in the present specification will be described below, but are not limited thereto.

In the present specification,

means a moiety to be linked.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; an alkyl group; a cycloalkyl group; an amine group; a silyl group; a phosphine oxide group; an aryl group; and a heteroaryl group including one or more of N, O, S, Se, and Si atoms, being substituted with a substituent to which two or more substituents among the substituents exemplified above are linked, or having no substituent.

In the present specification, examples of a halogen group include fluorine, chlorine, bromine or iodine. In the present specification, for an ether group, the oxygen of the ether group may be substituted with a straight-chained, branched, or cyclic alkyl group having 1 to 30 carbon atoms, or an aryl group having 6 to 30 carbon atoms. Specifically, the ether group may be a compound having the following structural formulae, but is not limited thereto.

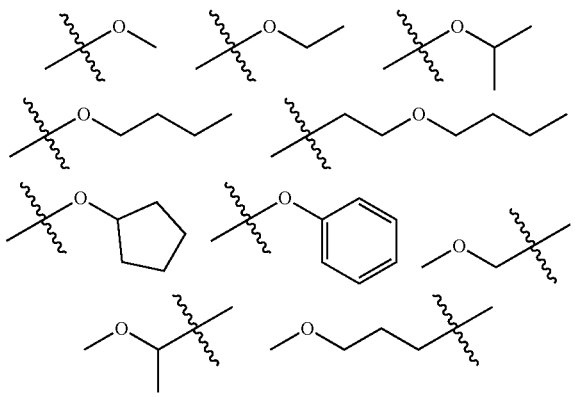

In the present specification, an alkoxy group may be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, examples of an aryloxy group include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthracenyloxy group, a 2-anthracenyloxy group, a 9-anthracenyloxy group, a 1-phenanthryloxy group, a 3-phenanthryloxy group, a 9-phenanthryloxy group, and the like, but are not limited thereto.

In the present specification, an alkyl group may be straight-chained or branch-chained, and the number of carbon atoms thereof is not particularly limited, but is preferably 1 to 50, and more preferably 1 to 30. Specific examples thereof include methyl, ethyl, propyl, n-propyl, isopropyl, butyl, n-butyl, isobutyl, tert-butyl, sec-butyl, 1-methylbutyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 4-methylhexyl, 5-methylhexyl, and the like, but are not limited thereto.

In the present specification, a cycloalkyl group is not particularly limited, but has preferably 3 to 60 carbon atoms, and more preferably 3 to 30 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, when an aryl group is a monocyclic aryl group, the number of carbon atoms thereof is not particularly limited, but is preferably 6 to 50, and more preferably 6 to 30. Specific examples of the monocyclic aryl group include a phenyl group, a biphenyl group, a terphenyl group, a quarterphenyl group, and the like, but are not limited thereto.

When the aryl group is a polycyclic aryl group, the number of carbon atoms thereof is not particularly limited, but is preferably 10 to 50, and more preferably 10 to 30. Specific examples of the polycyclic aryl group include a naphthyl group, an anthracenyl group, a phenanthryl group, a pyrenyl group, a perylenyl group, a triphenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the substituent may be,

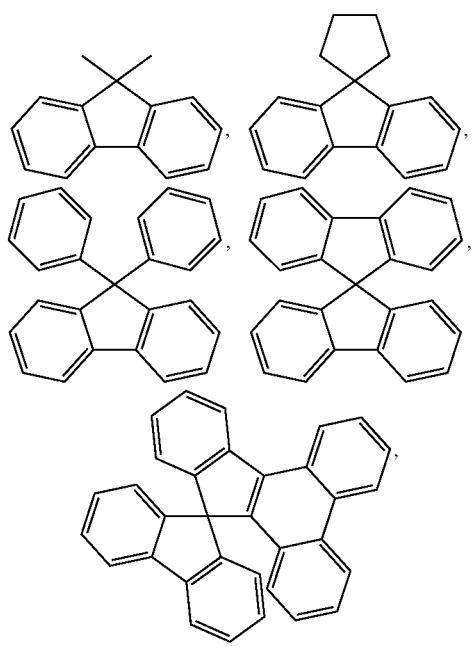

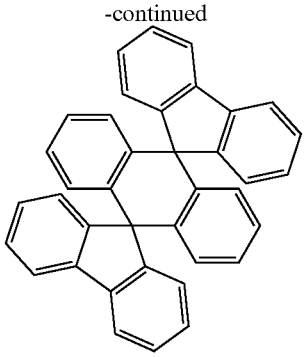

and the like, but is not limited thereto.

In the present specification, a heterocyclic group includes one or more of N, O, S, Si, and Se as a heteroatom, and the number of carbon atoms thereof is not particularly limited, but is preferably 2 to 60, and more preferably 2 to 30. Examples of the heterocyclic group include a thiophene group, a furan group, a pyrrole group, an imidazole group, a triazole group, an oxazole group, an oxadiazole group, a triazole group, a pyridine group, a bipyridine group, a pyrimidine group, a triazine group, an acridine group, a pyridazine group, a pyrazine group, a quinoline group, a quinazoline group, a quinoxaline group, a phthalazine group, a pteridine group, a pyrido pyrimidine group, a pyrido pyrazine group, a pyrazino pyrazine group, an isoquinoline group, an indole group, a pyrido indole group, indeno pyrimidine (5H-indeno pyrimidine), a carbazole group, a benzoxazole group, a benzimidazole group, a benzothiazole group, a benzocarbazole group, a benzothiophene group, a dibenzothiophene group, a benzofuran group, a dibenzofuran group, a phenanthroline group, a thiazolyl group, an isoxazolyl group, an oxadiazolyl group, a thiadiazolyl group, and the like, but are not limited thereto.

In the present specification, a heteroaryl group may be selected from the examples of the heterocyclic group except for an aromatic heteroaryl group, but is not limited thereto.

In the present specification, an alkylene group means a group having two bonding positions in an alkyl group, that is, a divalent group. The above-described description on the alkyl group may be applied to the alkylene group, except for a divalent alkylene group.

In the present specification, an arylene group means a group having two bonding positions in an aryl group, that is, a divalent group. The above-described description on the aryl group may be applied to the arylene group, except for a divalent arylene group.

In the present specification, a heteroarylene group means a group having two bonding positions in a heteroaryl group, that is, a divalent group. The above-described description on the heteroaryl group may be applied to the heteroarylene group, except for a divalent heteroarylene group.

In an exemplary embodiment of the present specification, L1 to L6 are the same as or different from each other, and are each independently a direct bond; —O—; a substituted or unsubstituted alkylene group; a substituted or unsubstituted arylene group; a substituted or unsubstituted divalent amine group; or a substituted or unsubstituted heteroarylene group.

In an exemplary embodiment of the present specification, L1 to L6 are the same as or different from each other, and are each independently a substituted or unsubstituted arylene group having 6 to 30 carbon atoms.

In an exemplary embodiment of the present specification, L1 to L6 are the same as or different from each other, and are each independently a substituted or unsubstituted phenylene group; a substituted or unsubstituted biphenylene group; a substituted or unsubstituted naphthylene group; or a substituted or unsubstituted fluorenylene group.

In an exemplary embodiment of the present specification, L1 is a substituted or unsubstituted arylene group having 6 to 30 carbon atoms.

In an exemplary embodiment of the present specification, L1 is a substituted or unsubstituted phenylene group, a substituted or unsubstituted biphenylene group, a substituted or unsubstituted naphthylene group, or a substituted or unsubstituted fluorenylene group.

In an exemplary embodiment of the present specification, L1 is a phenylene group or a biphenylene group.

In an exemplary embodiment of the present specification, L1 is a phenylene group.

In an exemplary embodiment of the present specification, L2 is a direct bond.

In an exemplary embodiment of the present specification, L2 is a substituted or unsubstituted arylene group having 6 to 30 carbon atoms.

In an exemplary embodiment of the present specification, L2 is a substituted or unsubstituted phenylene group, a substituted or unsubstituted biphenylene group, a substituted or unsubstituted naphthylene group, or a substituted or unsubstituted fluorenylene group.

In an exemplary embodiment of the present specification, L2 is a phenylene group or a biphenylene group.

In an exemplary embodiment of the present specification, L3 and L4 are the same as or different from each other, and are each independently a substituted or unsubstituted arylene group having 6 to 30 carbon atoms.

In an exemplary embodiment of the present specification, L3 and L4 are the same as or different from each other, and are each independently a substituted or unsubstituted phenylene group, a substituted or unsubstituted biphenylene group, a substituted or unsubstituted naphthylene group, or a substituted or unsubstituted fluorenylene group.

In an exemplary embodiment of the present specification, L3 is a direct bond.

In an exemplary embodiment of the present specification, L3 is a phenylene group.

In an exemplary embodiment of the present specification, L4 is a direct bond.

In an exemplary embodiment of the present specification, L4 is a phenylene group.

In an exemplary embodiment of the present specification, L5 is a direct bond.

In an exemplary embodiment of the present specification, L5 is a substituted or unsubstituted arylene group having 6 to 30 carbon atoms.

In an exemplary embodiment of the present specification, L5 is a phenylene group.

In an exemplary embodiment of the present specification, L6 is a direct bond.

In an exemplary embodiment of the present specification, L6 is a substituted or unsubstituted arylene group having 6 to 30 carbon atoms.

In an exemplary embodiment of the present specification, L6 is a phenylene group.

In an exemplary embodiment of the present specification, L6 is a biphenylene group.

In an exemplary embodiment of the present specification, L6 is a substituted or unsubstituted divalent amine group.

In an exemplary embodiment of the present specification, L6 is a divalent amine group which is unsubstituted or substituted with an aryl group.

In an exemplary embodiment of the present specification, L6 is a divalent amine group which is unsubstituted or substituted with a phenyl group.

In an exemplary embodiment of the present specification, L6 is —O—.

In an exemplary embodiment of the present specification, L6 is a substituted or unsubstituted alkylene group having 1 to 20 carbon atoms.

In an exemplary embodiment of the present specification, L6 is a substituted or unsubstituted alkylene group having 1 to 10 carbon atoms.

In an exemplary embodiment of the present specification, L6 is a methylene group, an ethylene group, a propylene group, a butylene group, a pentylene group, or a hexylene group.

In an exemplary embodiment of the present specification, L6 is a methylene group.

In an exemplary embodiment of the present specification, (L6)b2 is a direct bond; a methylene group; an ethylene group; a phenylene-O-hexylene group; a phenylene-methylene group; a divalent amine group substituted with a phenylene-phenyl group; a divalent amine group substituted with a phenyl group; a phenylene group; or a biphenylene group.

The phenylene-methylene group is a group in which a phenylene group and a methylene group are linked. The phenylene-O-hexylene group is a group in which a phenylene group, —O—, and a hexylene group are consecutively linked. The divalent amine group substituted with the phenylene-phenyl group is a group in which a divalent amine group substituted with the phenylene group and the phenyl group is linked.

In an exemplary embodiment of the present specification, b1 and b2 are each an integer from 1 to 10, and when b1 and b2 are each 2 or more, two or more L1's and L6's are each the same as or different from each other.

In an exemplary embodiment of the present specification, b2 is an integer from 1 to 5.

In an exemplary embodiment of the present specification, b2 is an integer from 1 to 3.

In an exemplary embodiment of the present specification, b2 is 1 or 2.

In an exemplary embodiment of the present specification, Ar1 to Ar3 are the same as or different from each other, and are each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group.

In an exemplary embodiment of the present specification, Ar1 is an aryl group having 6 to 30 carbon atoms which is unsubstituted or substituted with a substituent to which one or more substituents selected from the group consisting of an alkyl group; an alkoxy group; an aryloxy group; an aryl group; and a heterocyclic group, or two or more substituents selected from the above group are linked.

In an exemplary embodiment of the present specification, Ar1 is an aryl group having 6 to 30 carbon atoms which is unsubstituted or substituted with a substituent to which one or more substituents selected from the group consisting of an alkyl group having 1 to 10 carbon atoms; an alkoxy group having 1 to 10 carbon atoms; an aryloxy group having 6 to 30 carbon atoms; an aryl group having 6 to 30 carbon atoms; and a heterocyclic group having 2 to 30 carbon atoms or two or more substituents selected from the above group are linked.

In an exemplary embodiment of the present specification, Ar1 is a substituted or unsubstituted alkyl group having 1 to 30 carbon atoms.

In an exemplary embodiment of the present specification, Ar1 is a methyl group, an ethyl group, an isopropyl group, or a tert-butyl group.

In an exemplary embodiment of the present specification, Ar1 is a substituted or unsubstituted alkoxy group having 1 to 20 carbon atoms.

In an exemplary embodiment of the present specification, Ar1 is a methoxy group.

In an exemplary embodiment of the present specification, Ar1 is an ethoxy group.

In an exemplary embodiment of the present specification, Ar1 is an isopropoxy group.

In an exemplary embodiment of the present specification, Ar1 is a tert-butoxy group.

In an exemplary embodiment of the present specification, Ar1 is a substituted or unsubstituted aryl group having 6 to 30 carbon atoms.

In an exemplary embodiment of the present specification, Ar1 is a substituted or unsubstituted phenyl group, a substituted or unsubstituted biphenyl group, a substituted or unsubstituted naphthyl group, or a substituted or unsubstituted fluorenyl group.

In an exemplary embodiment of the present specification, Ar1 is a phenyl group.

In an exemplary embodiment of the present specification, Ar2 and Ar3 are the same as or different from each other, and are each independently a substituted or unsubstituted aryl group having 6 to 30 carbon atoms.

In an exemplary embodiment of the present specification, Ar2 and Ar3 are the same as or different from each other, and are each independently a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, or a substituted or unsubstituted fluorenyl group.

In an exemplary embodiment of the present specification, Ar2 is a phenyl group, a biphenyl group, or a naphthyl group.

In an exemplary embodiment of the present specification, Ar2 is a fluorenyl group which is substituted with an alkyl group.

In an exemplary embodiment of the present specification, Ar2 is a fluorenyl group which is substituted with a methyl group.

In an exemplary embodiment of the present specification, Ar3 is a phenyl group, a biphenyl group, or a naphthyl group.

In an exemplary embodiment of the present specification, Ar3 is a fluorenyl group which is substituted with an alkyl group.

In an exemplary embodiment of the present specification, Ar3 is a fluorenyl group which is substituted with a methyl group.

In an exemplary embodiment of the present specification, R1 to R8 are the same as or different from each other, and are each independently hydrogen; deuterium; a halogen group; a hydroxyl group; a nitrile group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, R1 to R8 are each hydrogen.

In an exemplary embodiment of the present specification, r4 and r5 are each an integer from 1 to 3, and when r4 and r5 are each 2 or more, two or more R4's and R5's are each the same as or different from each other.

In an exemplary embodiment of the present specification, m1 is a mole fraction and 0<m1<1, m2 is a mole fraction and 0<m2<1, and m1+m2≤1.

In an exemplary embodiment of the present specification, m1 is 0.01<m1<0.99, and m2 is 0.01<m2<0.59.

In an exemplary embodiment of the present specification, m1 is 0.5<m1<0.99, and m2 is 0.01<m2<0.5.

In an exemplary embodiment of the present specification, m1>m2.

In an exemplary embodiment of the present specification, m1+m2 is 1.

In an exemplary embodiment of the present specification, X may be any one selected from the following structures.

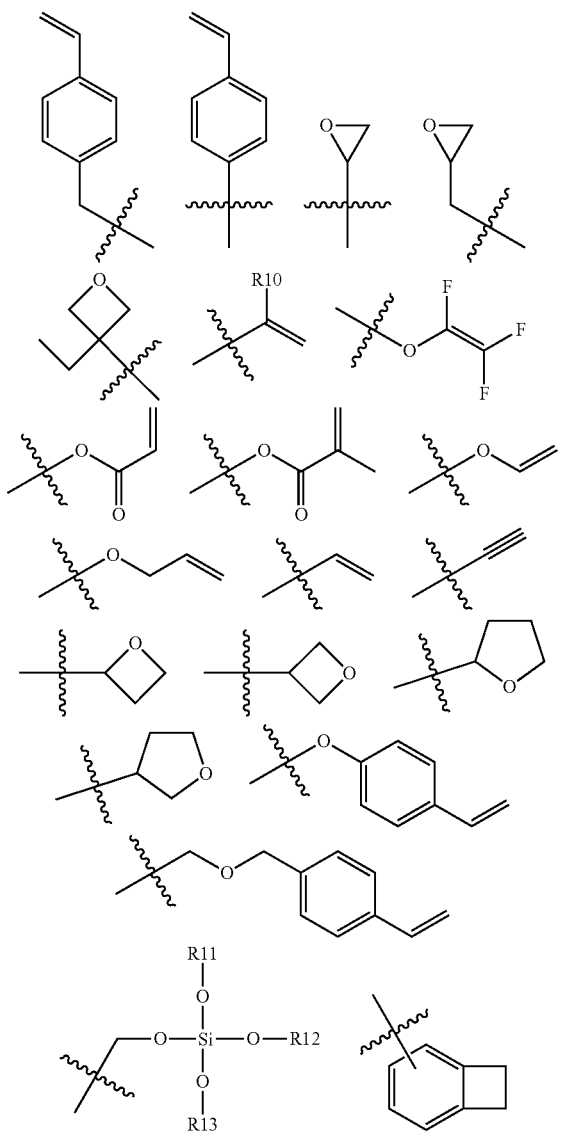

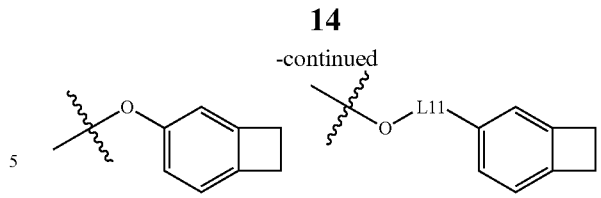

In the structures,

L11 is a substituted or unsubstituted alkylene group; or a substituted or unsubstituted arylene group, and R10 to R13 are the same as or different from each other, and are each independently hydrogen; or a substituted or unsubstituted alkyl group having 1 to 6 carbon atoms.

In an exemplary embodiment of the present specification, when X is

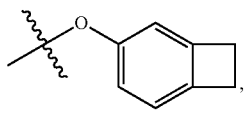 [SMILES: *Oc1ccc2c(c1)CC2], b2 is an integer from 1 to 3.

In an exemplary embodiment of the present specification, X is selected from the following structures.

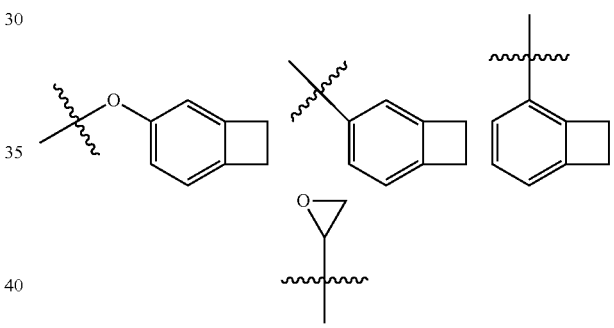

In an exemplary embodiment of the present specification, X is

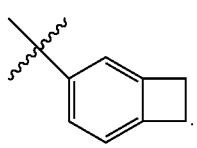 [SMILES: *c1ccc2c(c1)CC2].

In an exemplary embodiment of the present specification, X is cyclobutabenzene or oxetane.

When X is cyclobutabenzene or oxetane, there are advantages in that the structure is not damaged during the process (AIBN: a radical initiation reaction using azobisisobutyronitrile) of vinyl polymerization, and when heat is subsequently applied, curing begins, and as a result, a cross-linked polymer may be formed, and the polymer exhibits high resistance, and thus is easy to be used for the solution process.

In an exemplary embodiment of the present specification, L11 is a substituted or unsubstituted alkylene group having 1 to 10 carbon atoms; or a substituted or unsubstituted arylene group having 6 to 30 carbon atoms.

In an exemplary embodiment of the present specification, L11 is a methylene group; an ethylene group; a propylene group; a butylene group; a phenylene group, or a biphenylene group.

In an exemplary embodiment of the present specification, R10 to R13 are the same as or different from each other, and are each independently hydrogen; a methyl group; an ethyl group; a propyl group; an isopropyl group; a butyl group; or a t-butyl group.

In an exemplary embodiment of the present specification, Formula 1 is represented by the following Formula 101.

[Formula 101]

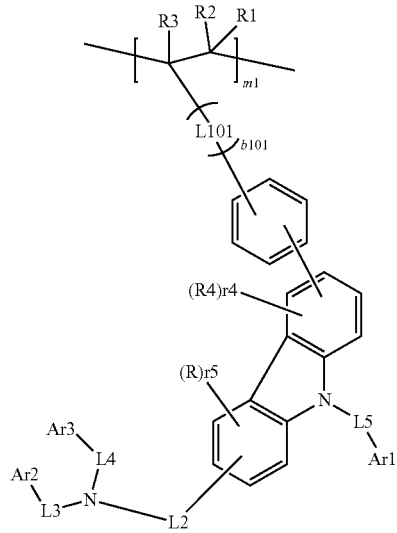

In Formula 101, definitions of L2 to L5, Ar1 to Ar3, R1 to R5, r4, r5, and m1 are the same as those defined in Formula 1, L101 is a direct bond; —O—; a substituted or unsubstituted alkylene group; a substituted or unsubstituted arylene group; a substituted or unsubstituted divalent amine group; or a substituted or unsubstituted heteroarylene group, b101 is an integer from 1 to 9, and when b101 is 2 or more, two or more L101's are each the same as or different from each other.

In an exemplary embodiment of the present specification, L101 of Formula 101 is the same as the definition of L1 of Formula 1.

In an exemplary embodiment of the present specification, b101 of Formula 101 is 1 or 2.

In an exemplary embodiment of the present specification, L101 of Formula 101 is a direct bond.

In an exemplary embodiment of the present specification, Formula 101 is represented by the following Formula 102.

[Formula 102]

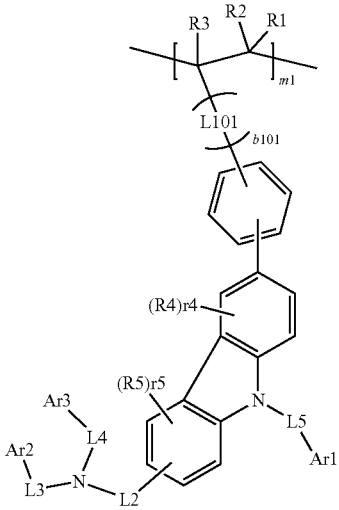

In Formula 102, definitions of L101, b101, L2 to L5, Ar1 to Ar3, R1 to R5, r4, r5, and m1 are the same as those defined in Formula 101.

In an exemplary embodiment of the present specification, Formula 101 is represented by the following Formula 103.

[Formula 103]

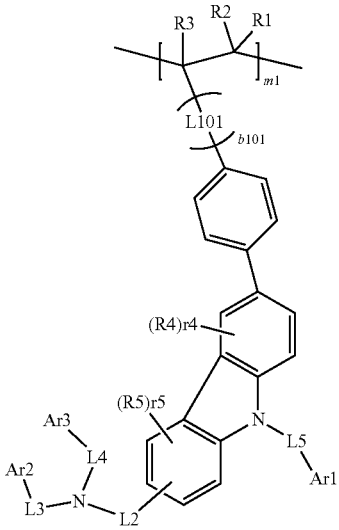

In Formula 103, definitions of L101, b101, L2 to L5, Ar1 to Ar3, R1 to R5, r4, r5, and m1 are the same as those defined in Formula 101.

In an exemplary embodiment of the present specification, L101 of Formula 103 is a direct bond.

In an exemplary embodiment of the present specification, Formula 2 is represented by the following Formula 201 or 202.

[Formula 201]

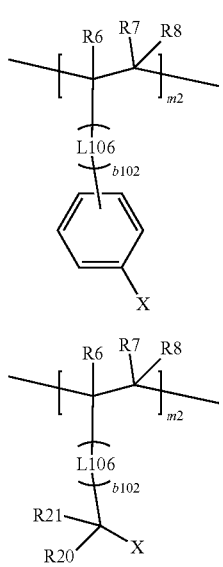

[Formula 202]

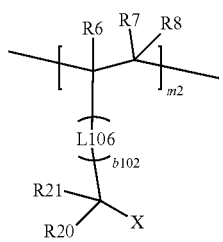

In Formulae 201 and 202, definitions of R6 to R8, m2, and X are the same as those defined in Formula 1, L106 is a direct bond; —O—; a substituted or unsubstituted alkylene group; a substituted or unsubstituted arylene group; a substituted or unsubstituted divalent amine group; or a substituted or unsubstituted heteroarylene group, b102 is an integer from 1 to 9, and R20 and R21 are the same as or different from each other, and are each independently hydrogen; deuterium; a halogen group; a nitrile group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, L106 of Formulae 201 and 202 is the same as the definition of L6 of Formula 2.

In an exemplary embodiment of the present specification, b102 of Formulae 201 and 202 is 1 or 2.

In an exemplary embodiment of the present specification, L106 of Formulae 201 and 202 is a direct bond.

In an exemplary embodiment of the present specification, R20 and R21 of Formulae 201 and 202 are the same as or different from each other, and are each independently hydrogen; deuterium; or an alkyl group.

In an exemplary embodiment of the present specification, R20 and R21 of Formulae 201 and 202 are the same as or different from each other, and are each independently hydrogen; deuterium; or a methyl group. In an exemplary embodiment of the present specification, the first unit represented by Formula 1 may be represented by any one of the following structures.

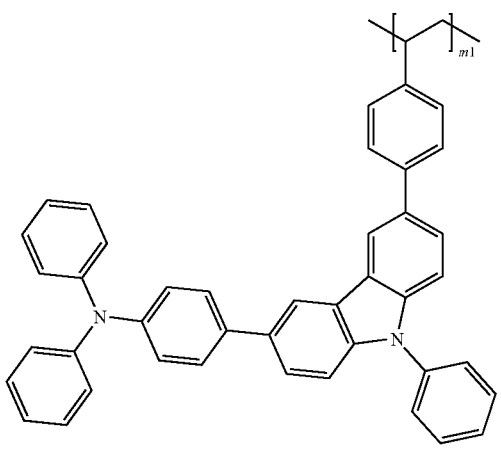

P1

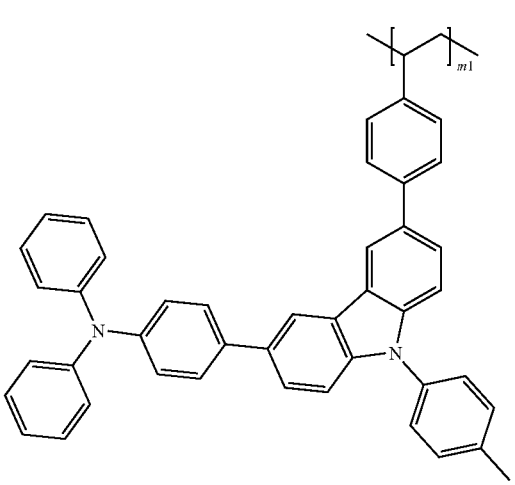

P2

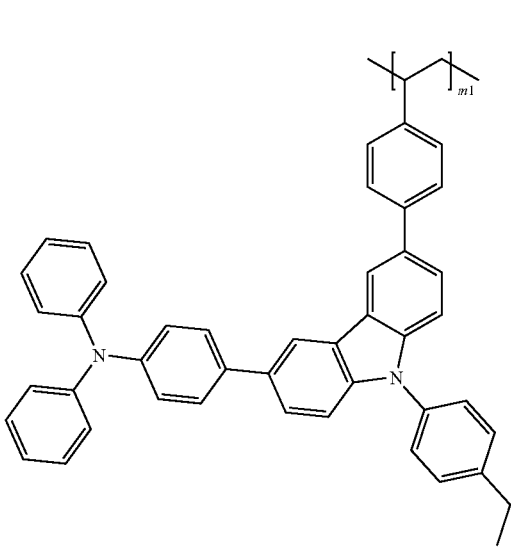

P3

P4
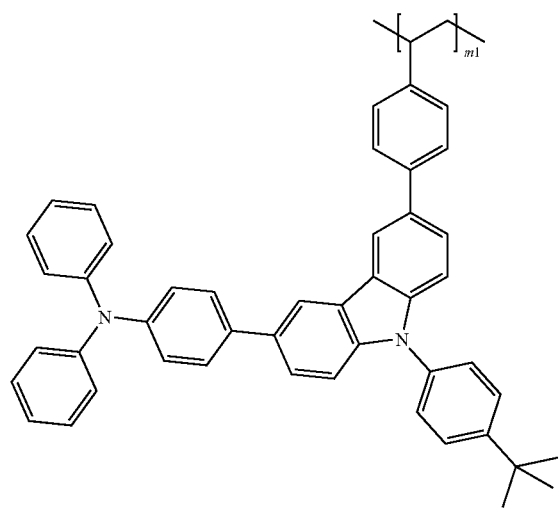
P7
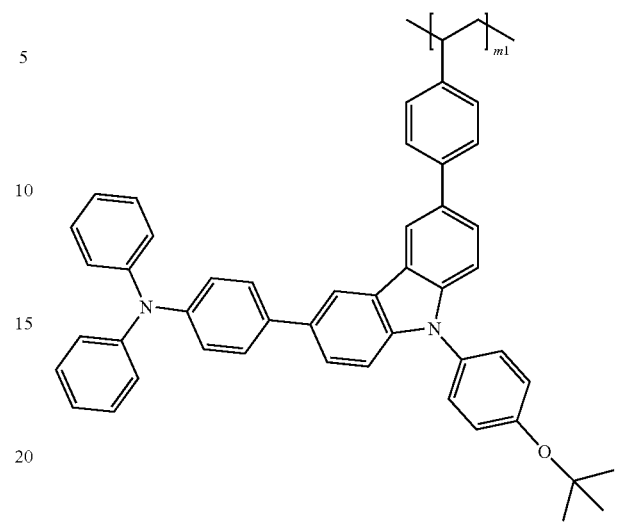
P5
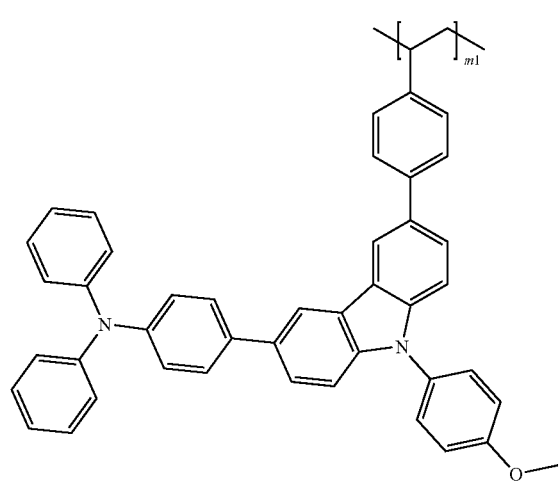
P8
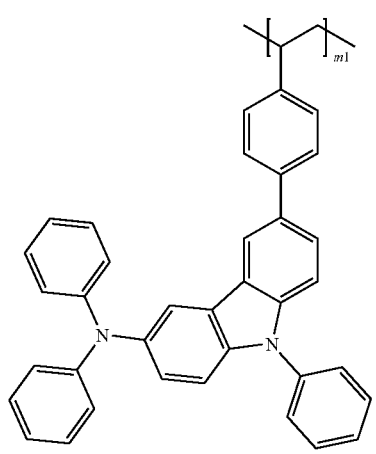
P6
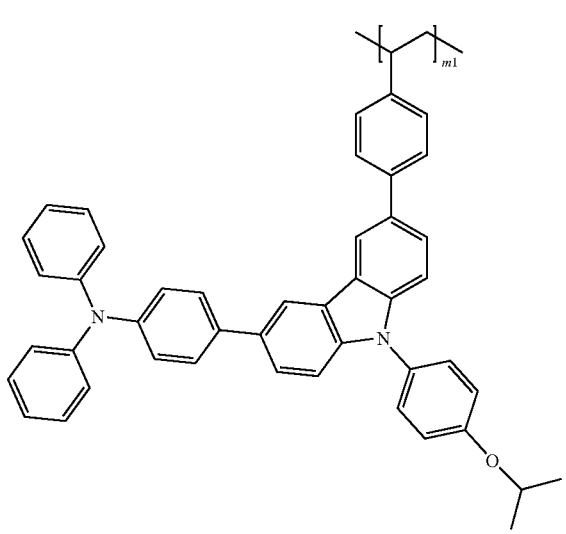
P9
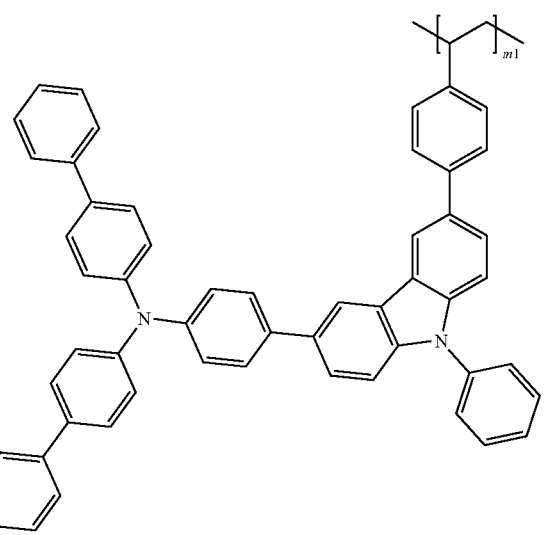

P10 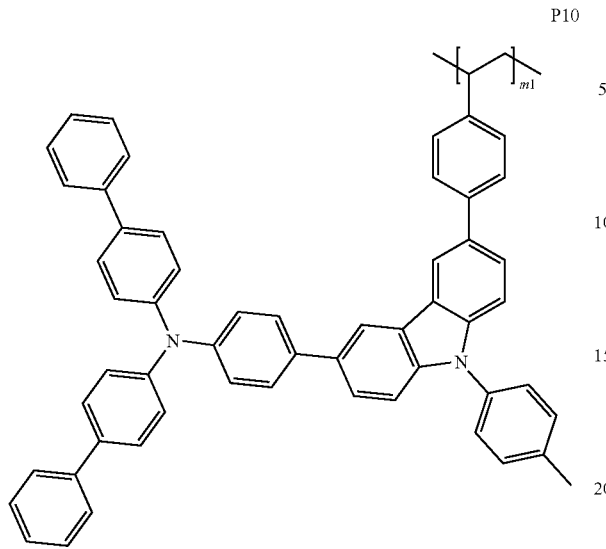
P13 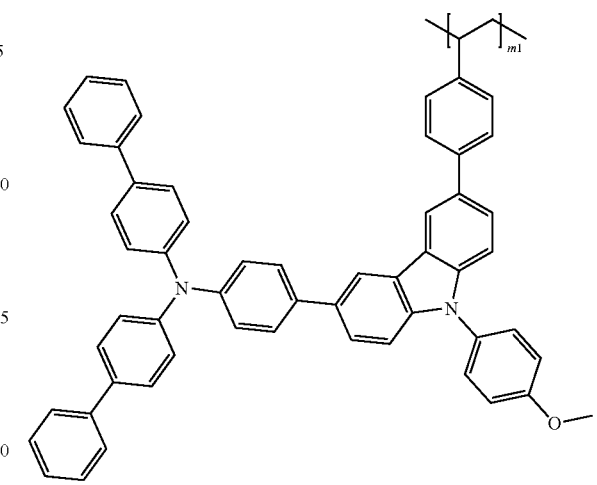
P11
P12 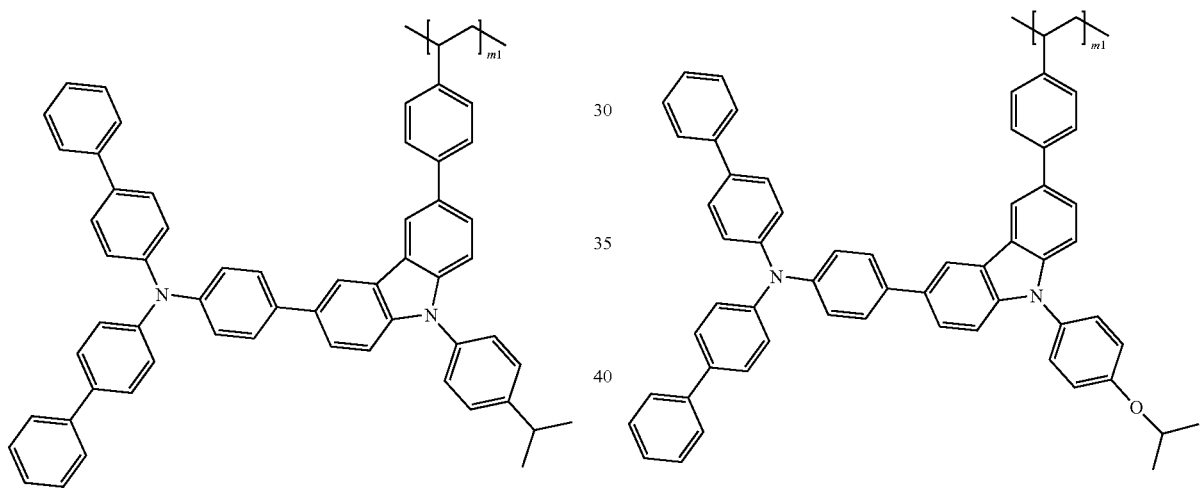
P14
P15 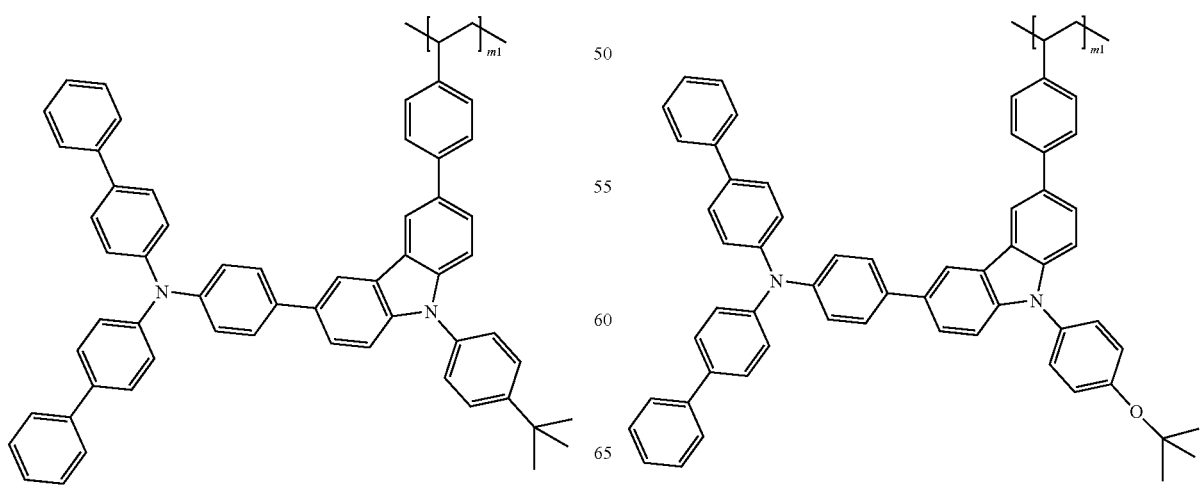

P16
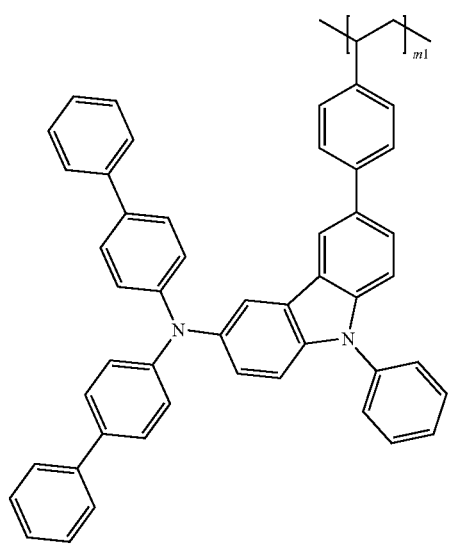
P17
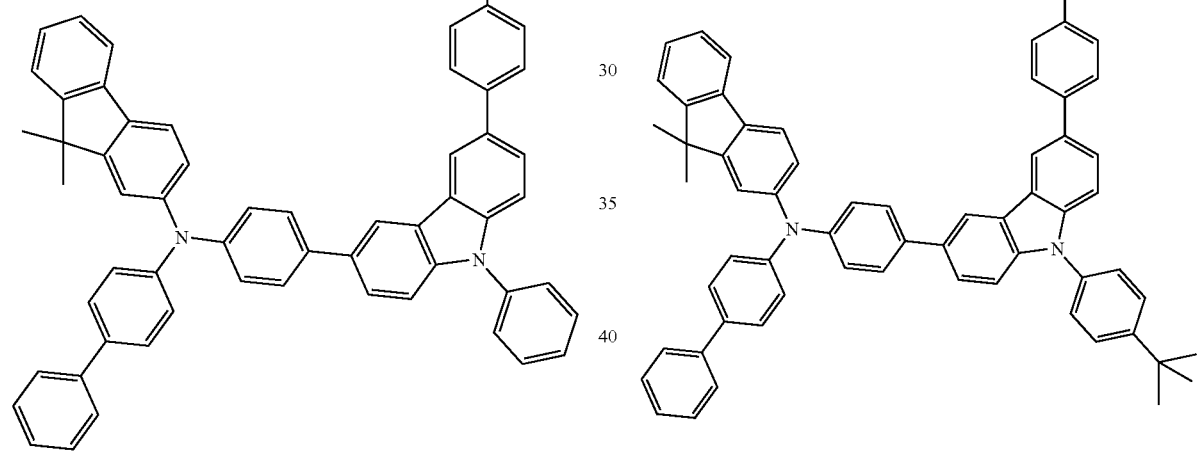
P18
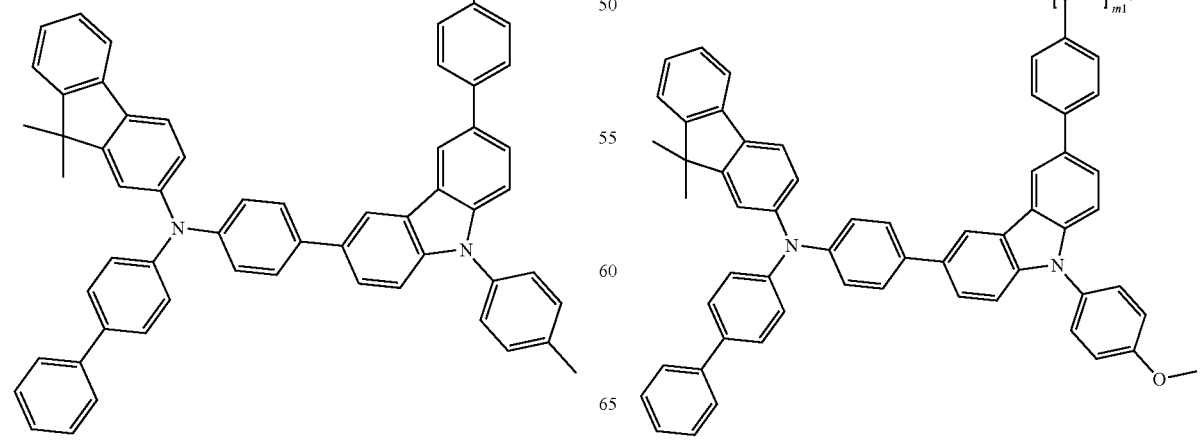
P19
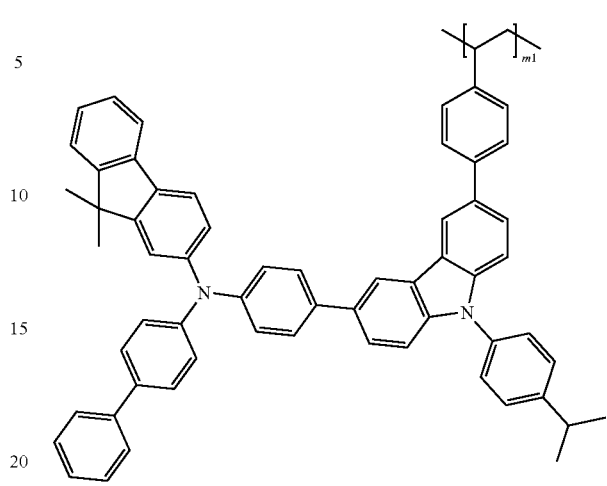
P20
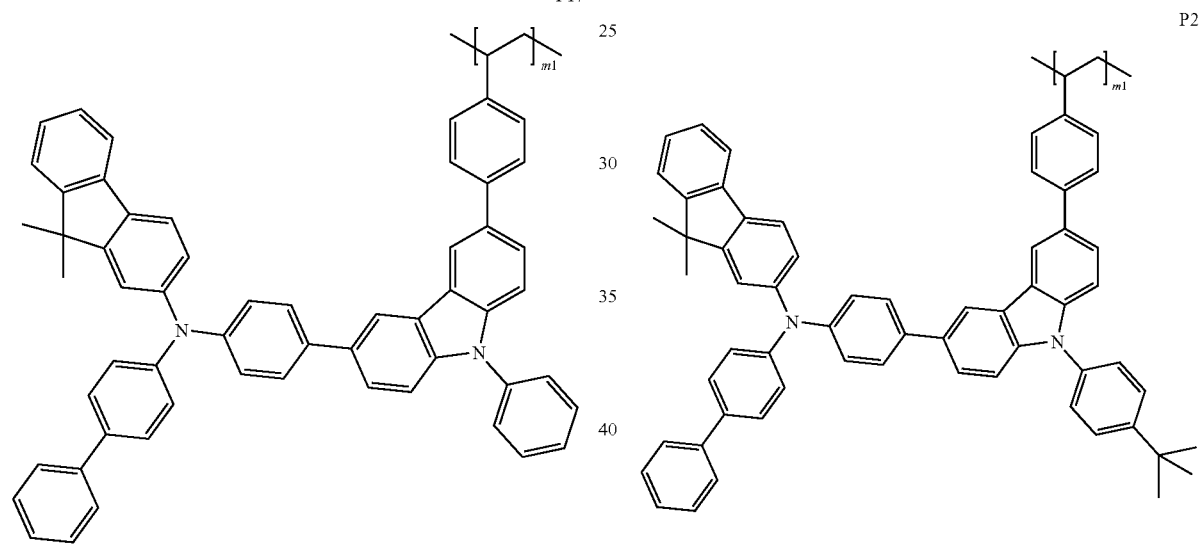
P21
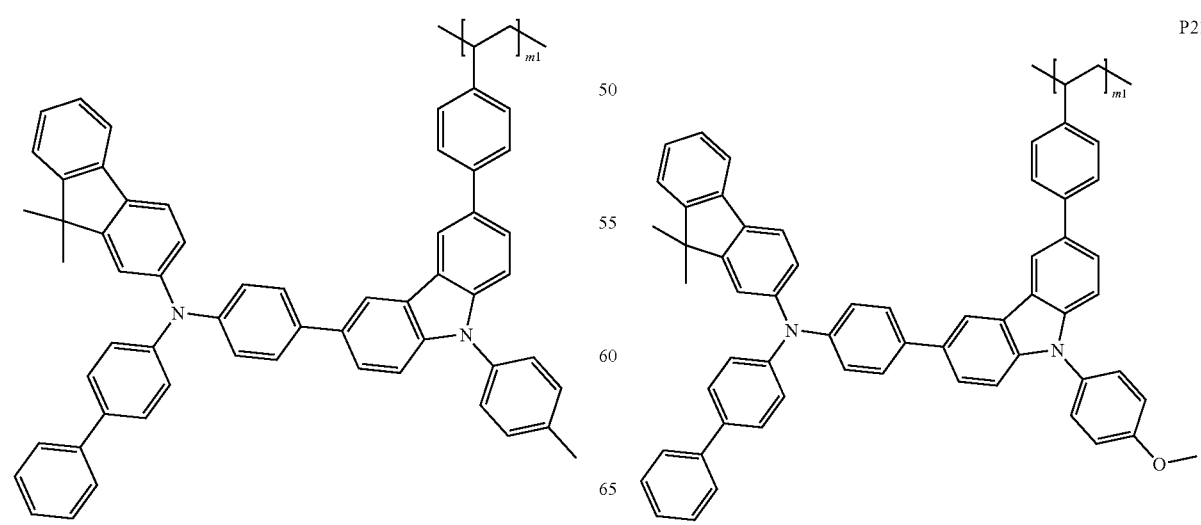

P22
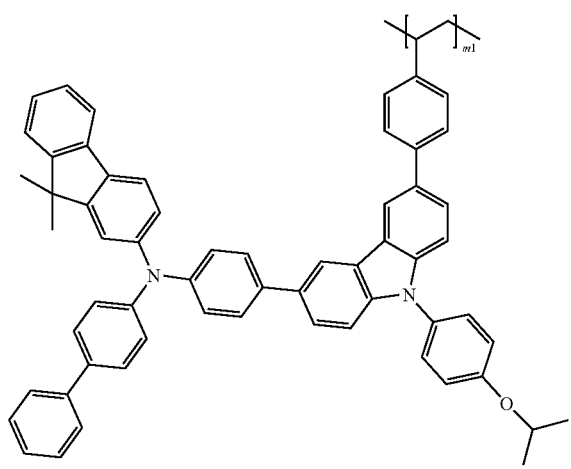
P25
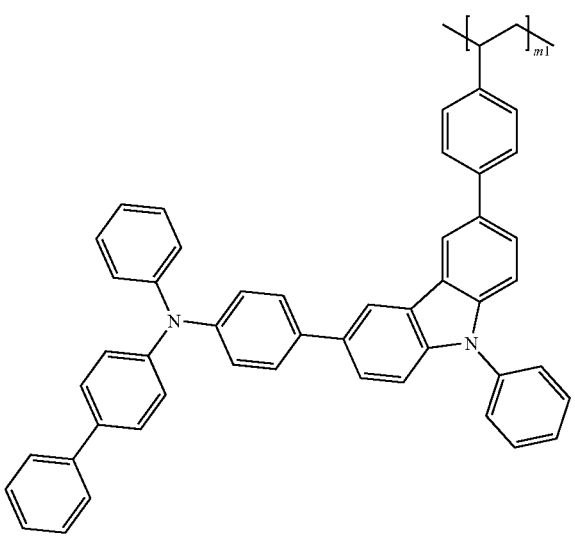
P23
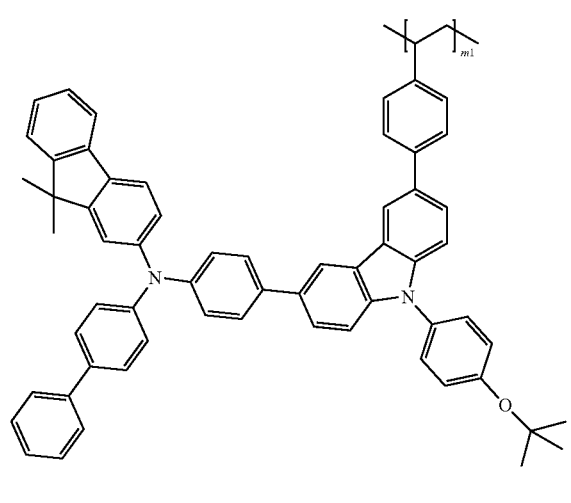
P24
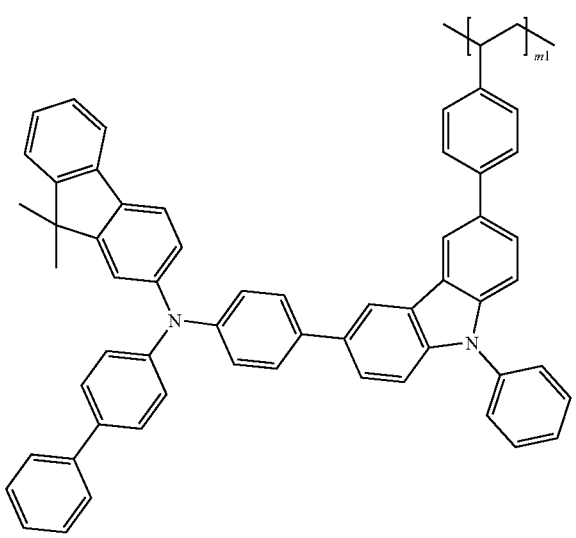
P26
P27
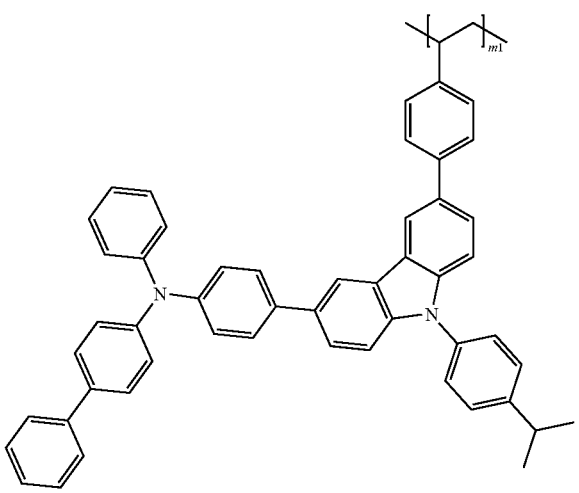

P28
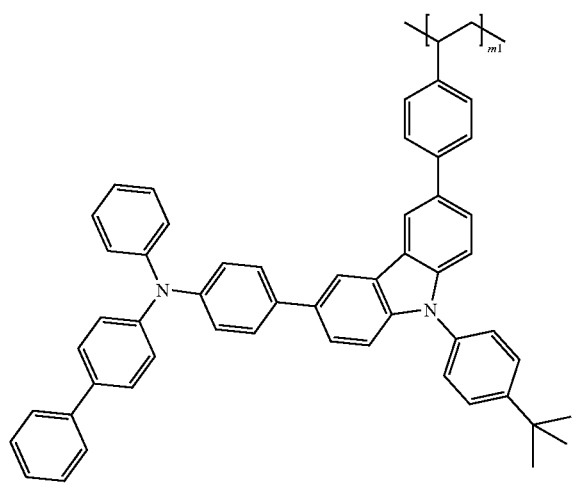
P29
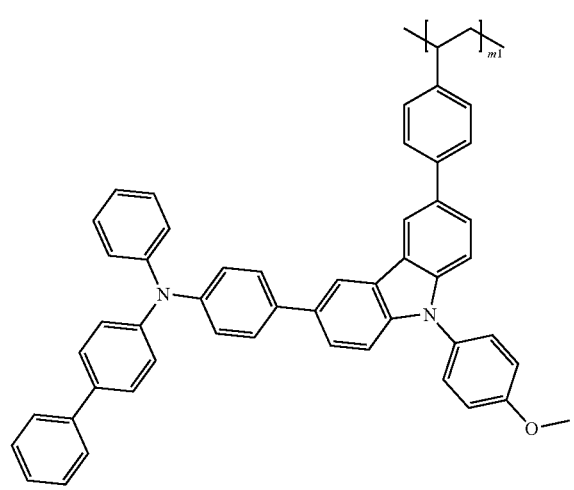
P30
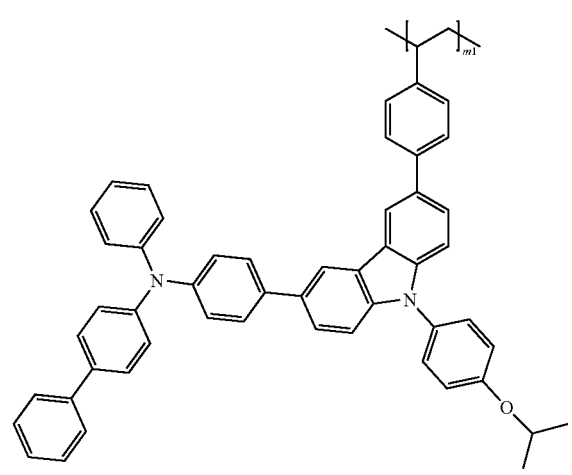
P31
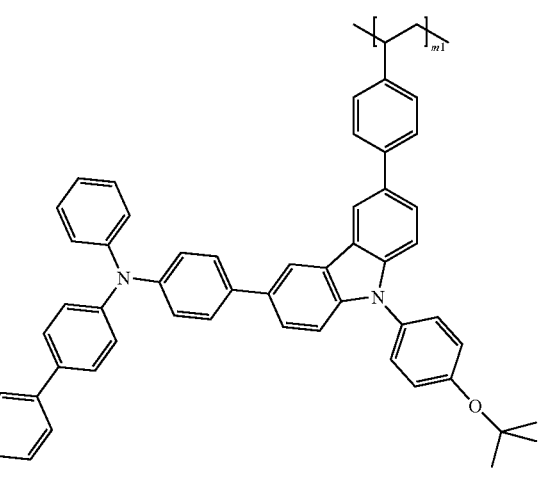
P32
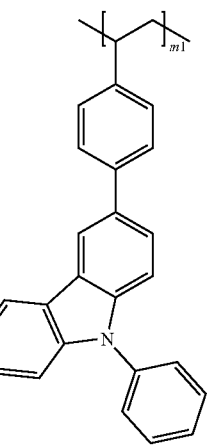
P33
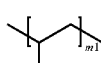

P34
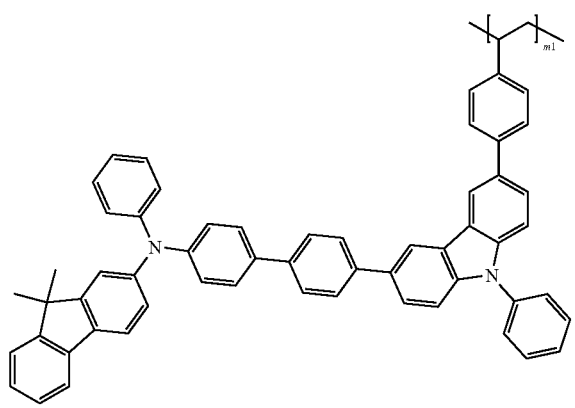
P35
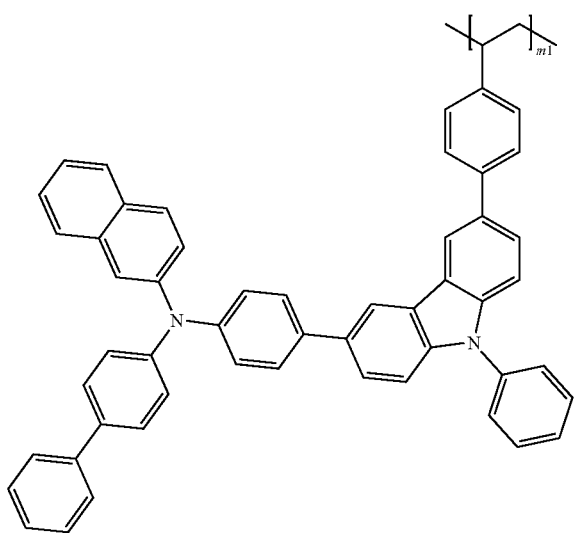
P36
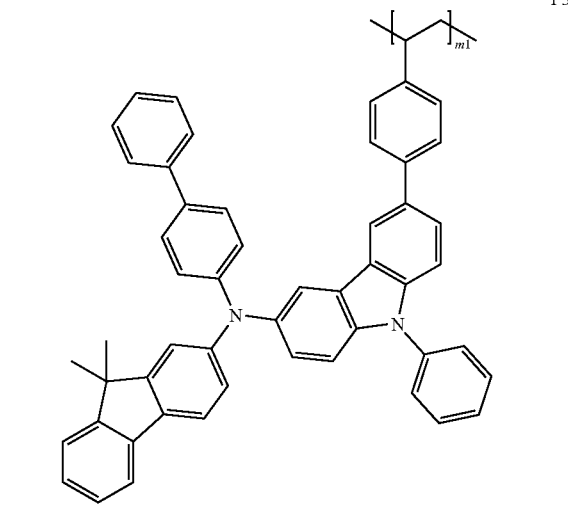
P37
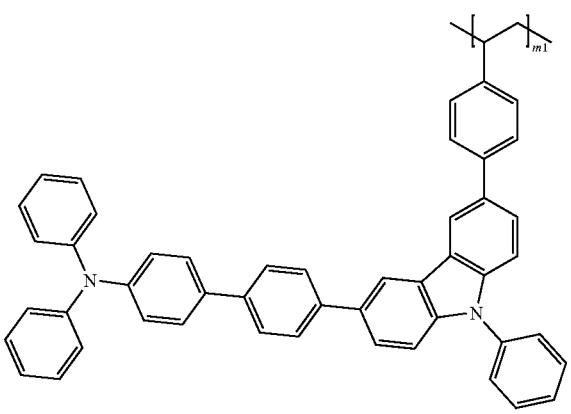
P38
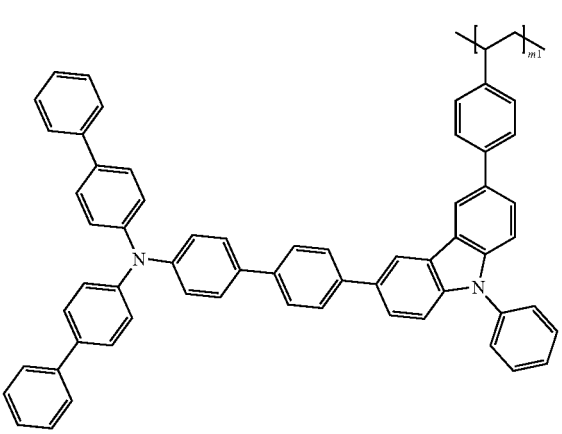
P39
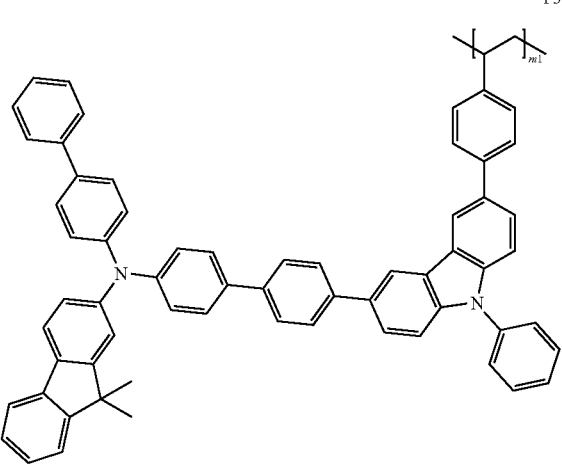

P40
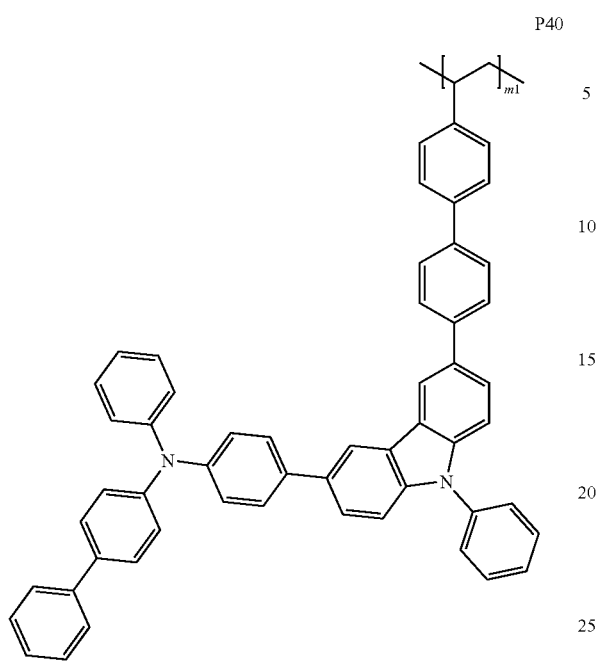
In the structures, m1 is a mole fraction and 0<m1<1.
In an exemplary embodiment of the present specification, the second unit represented by Formula 2 may be represented by any one of the following structures.
Q1
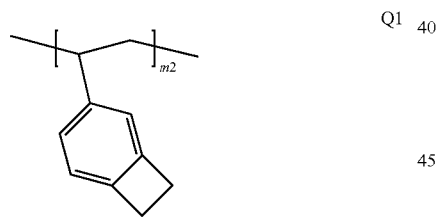
Q2
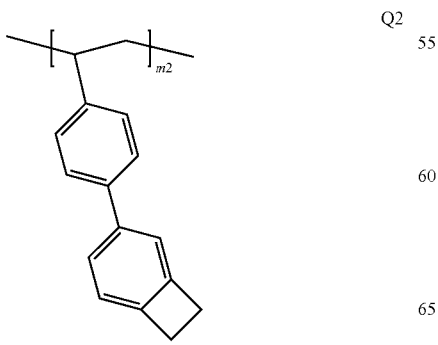
Q3
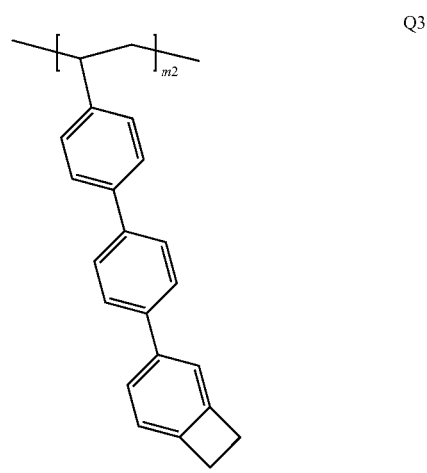
Q4
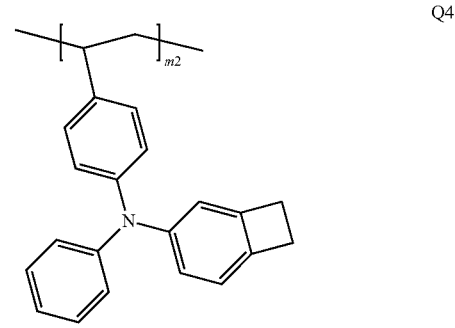
Q5
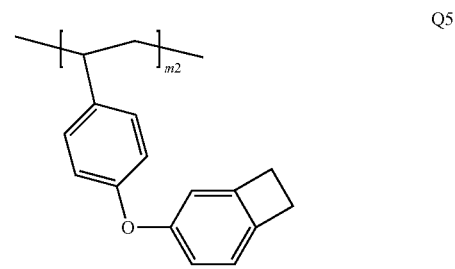

Q6

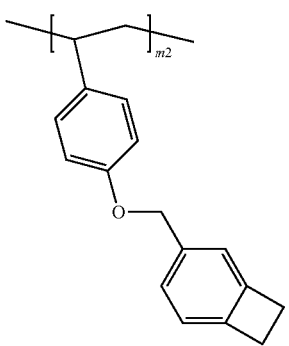

Q7

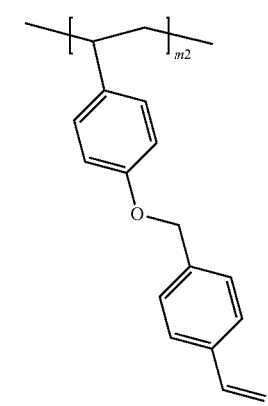

Q8

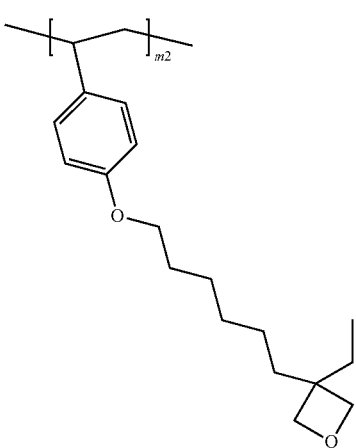

In the structures, m2 is a mole fraction and 0<m2<1.

In an exemplary embodiment of the present specification, a polymer including the first unit represented by Formula 1 and the second unit represented by Formula 2 may be represented by the following Formula 11 or 12.

[Formula 11]

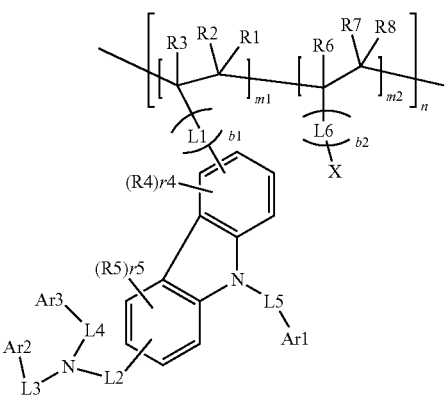

[Formula 12]

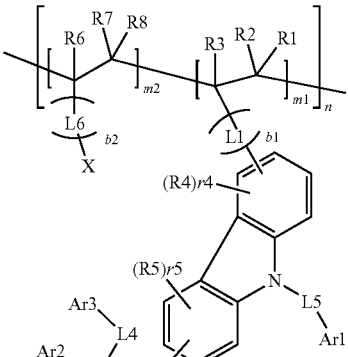

In Formulae 11 and 12, definitions of X, L1 to L6, b1, b2, Ar1 to Ar3, R1 to R8, r4, r5, m1, and m2 are the same as those defined in Formulae 1 and 2, and n is a repeating number of the unit, and an integer from 1 to 10,000.

In an exemplary embodiment of the present specification, the polymer including the first unit represented by Formula 1 and the second unit represented by Formula 2 may be any one selected from the following structures.

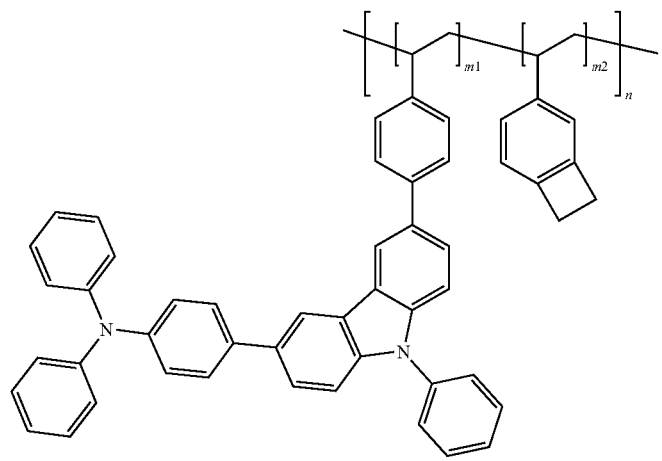
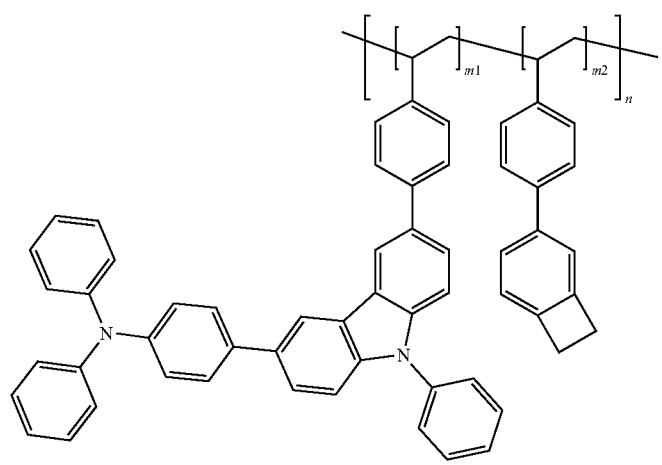
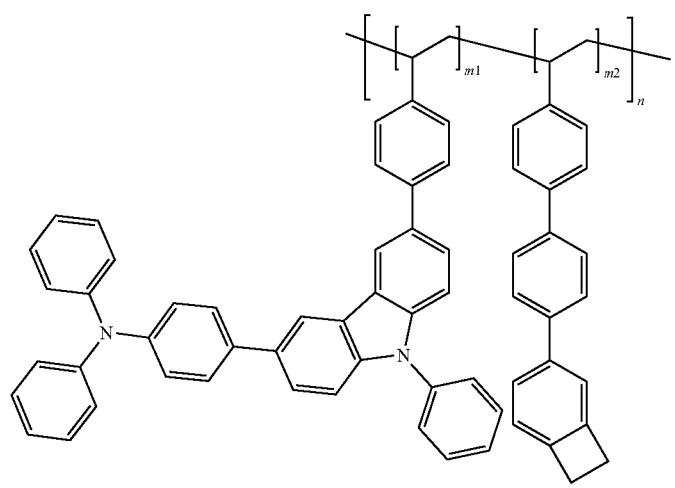

-continued
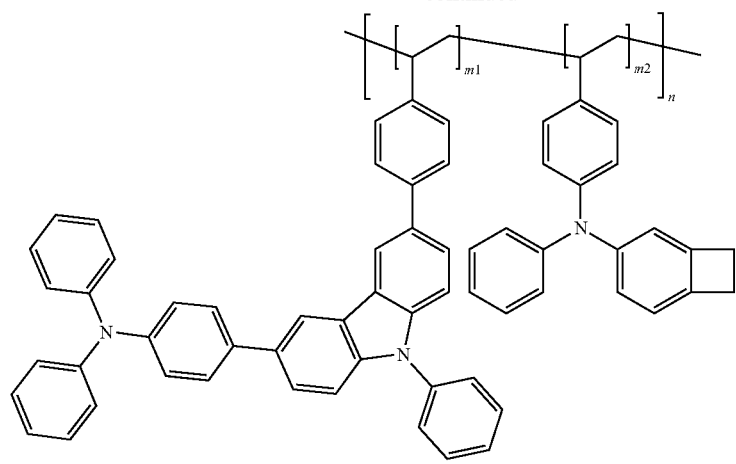
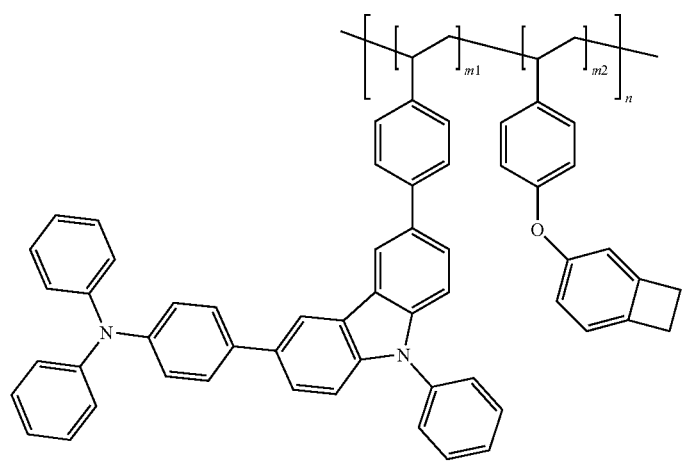
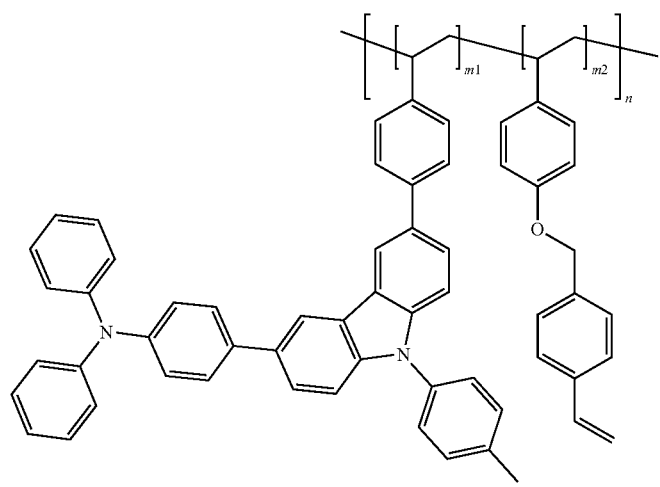

-continued
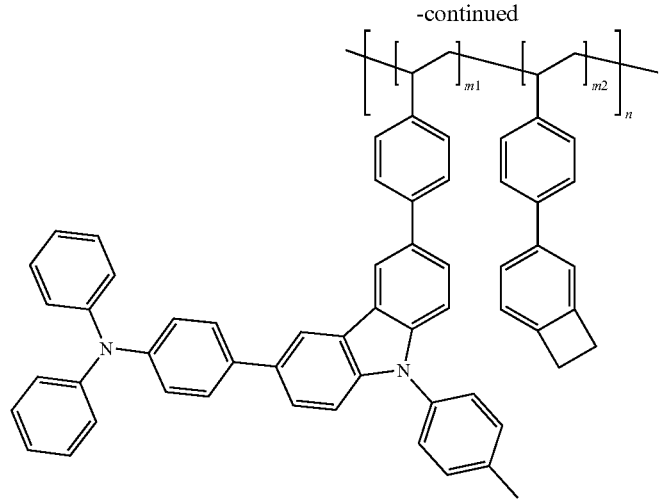
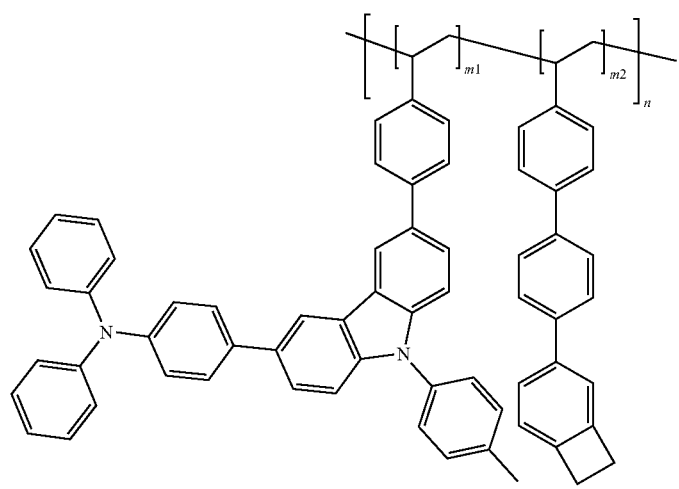
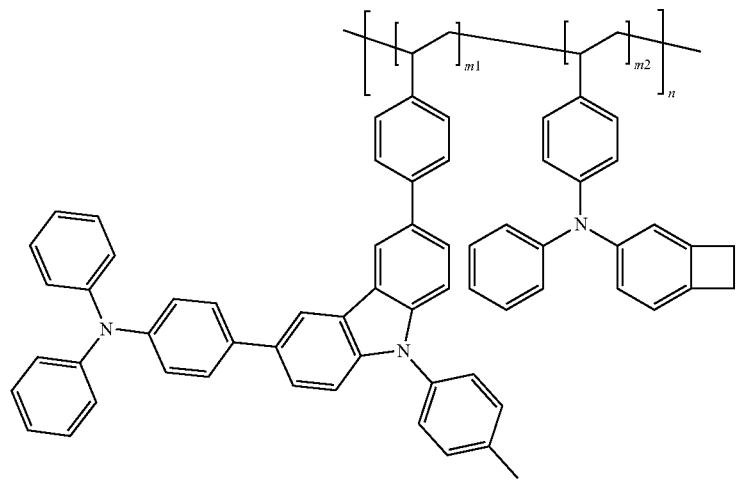

-continued
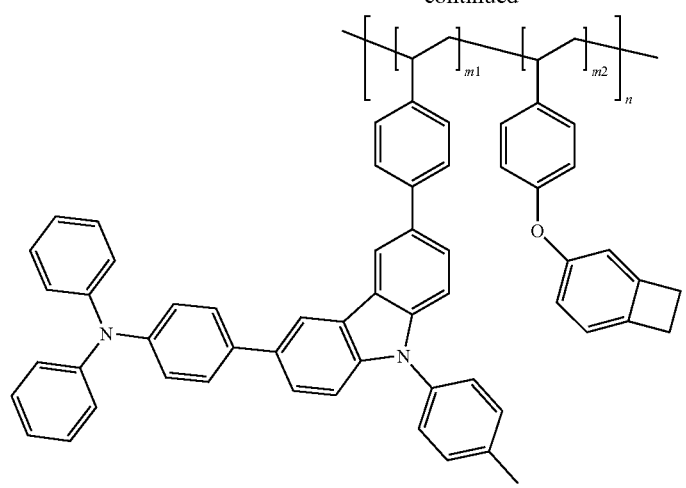
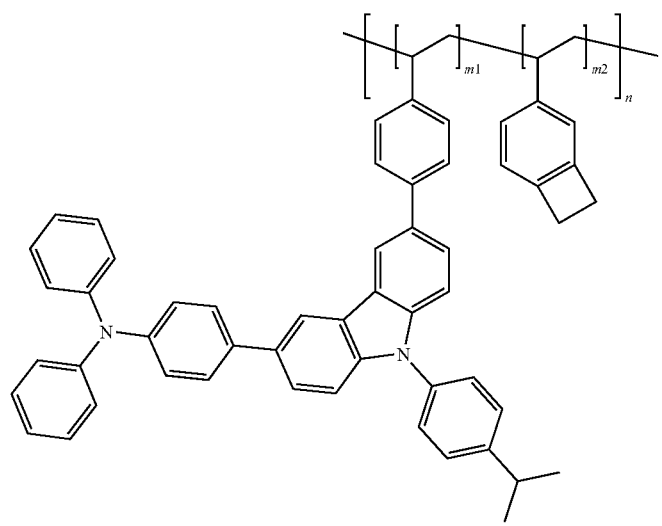
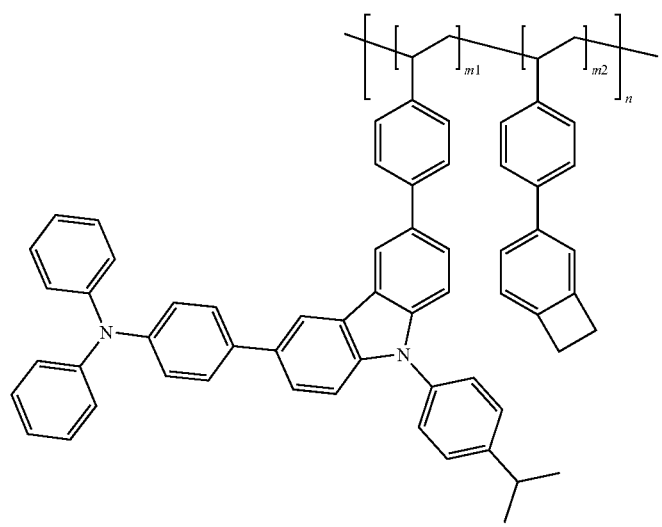

-continued
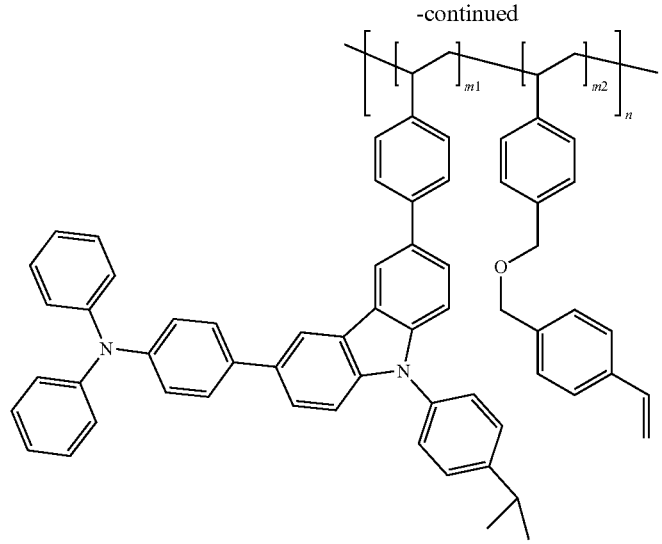
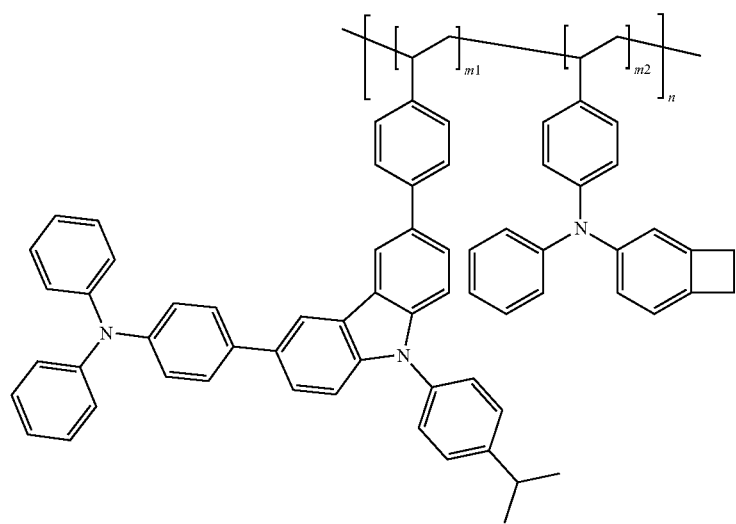
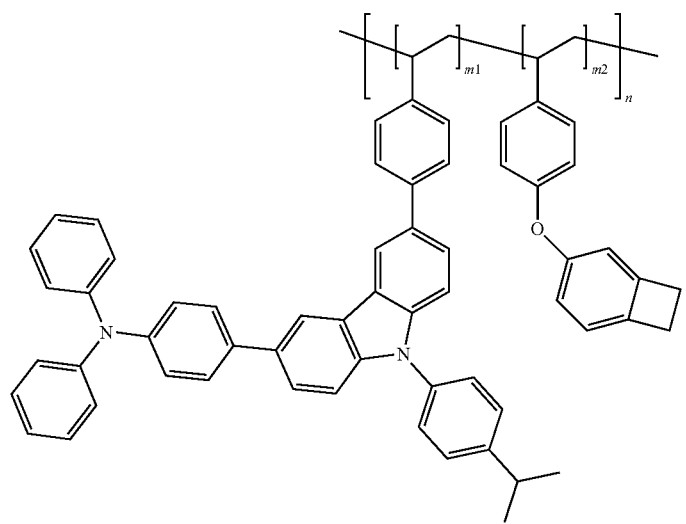

-continued
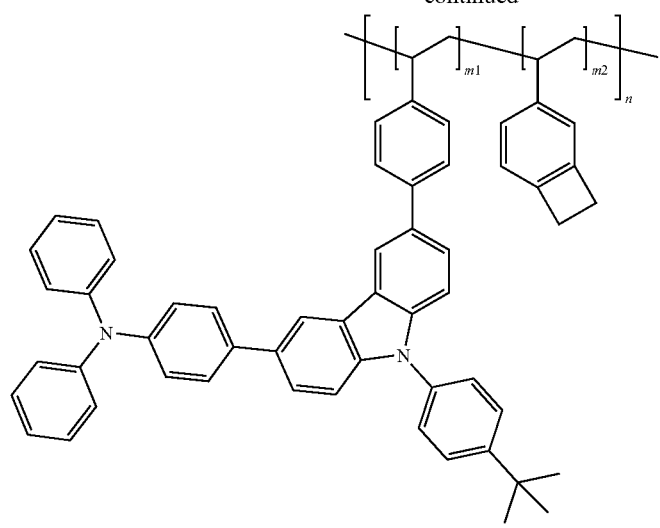
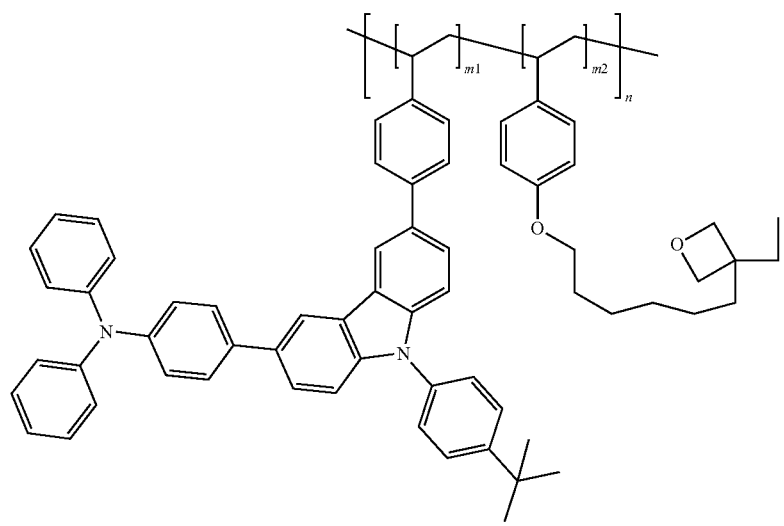
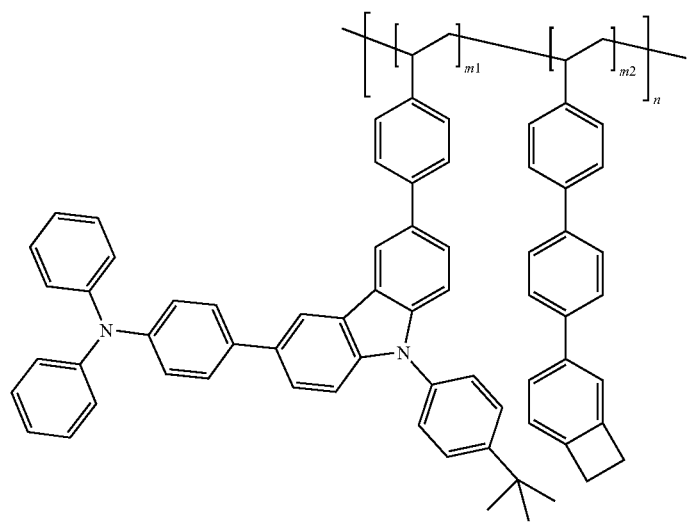

-continued
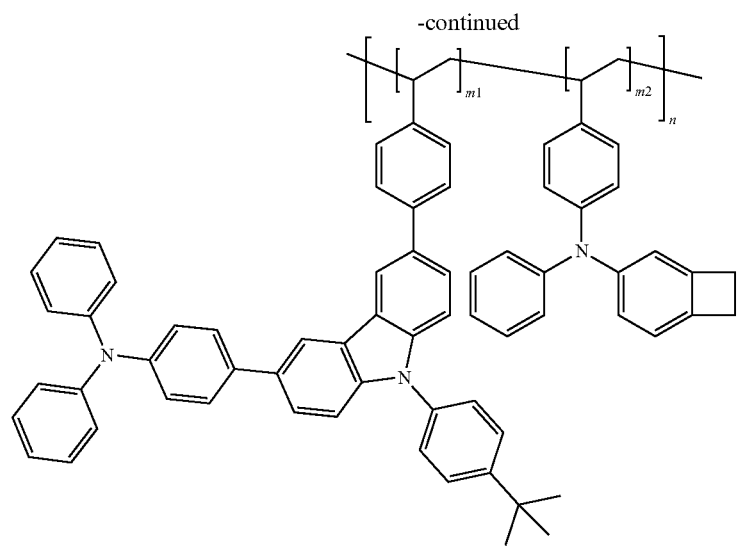
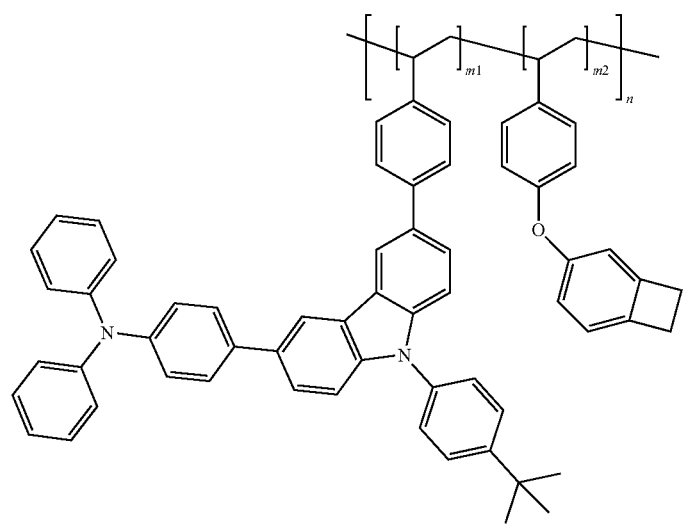
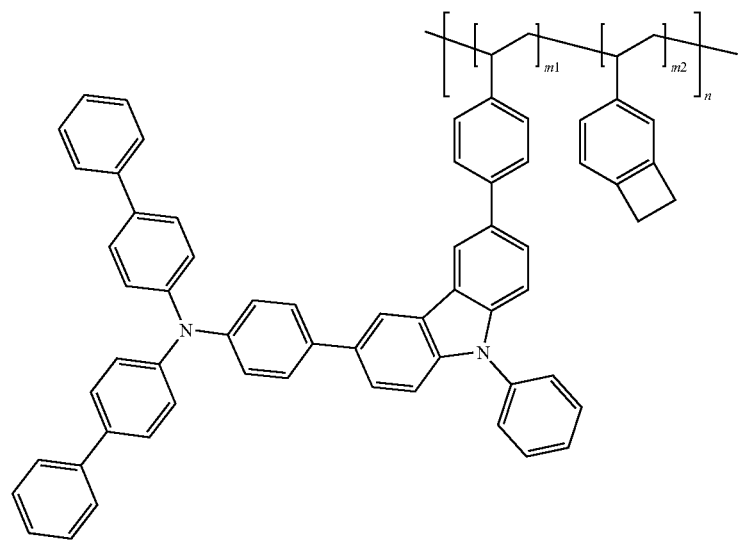

-continued
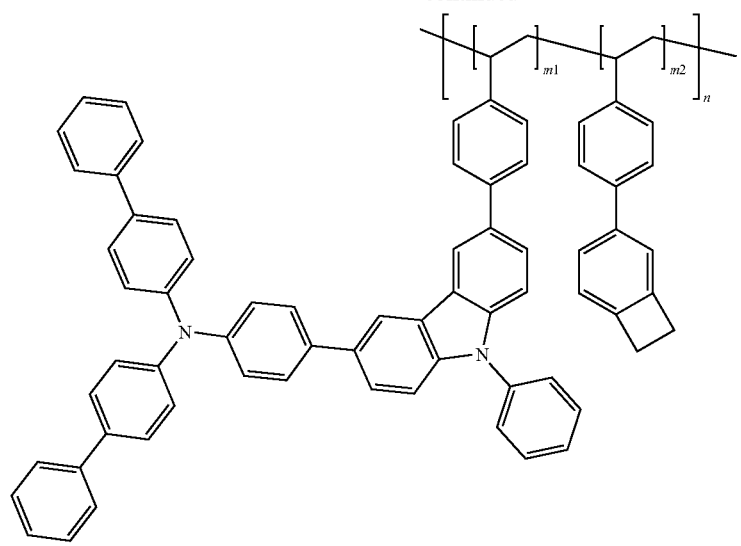
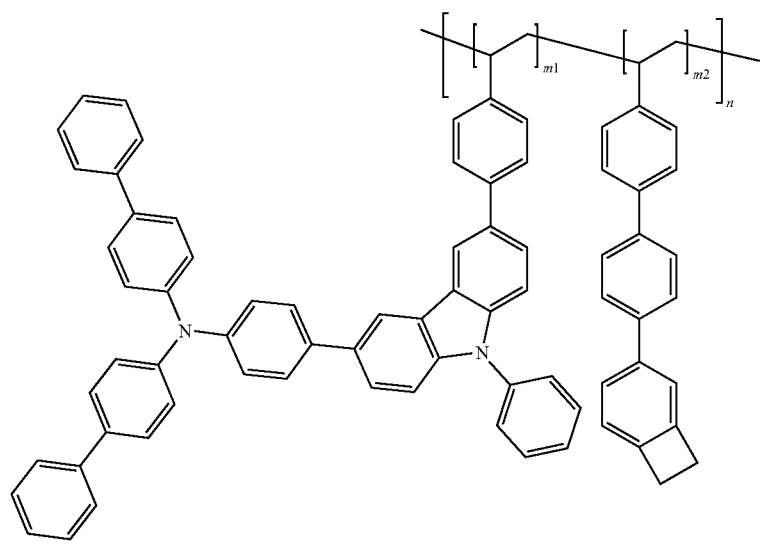
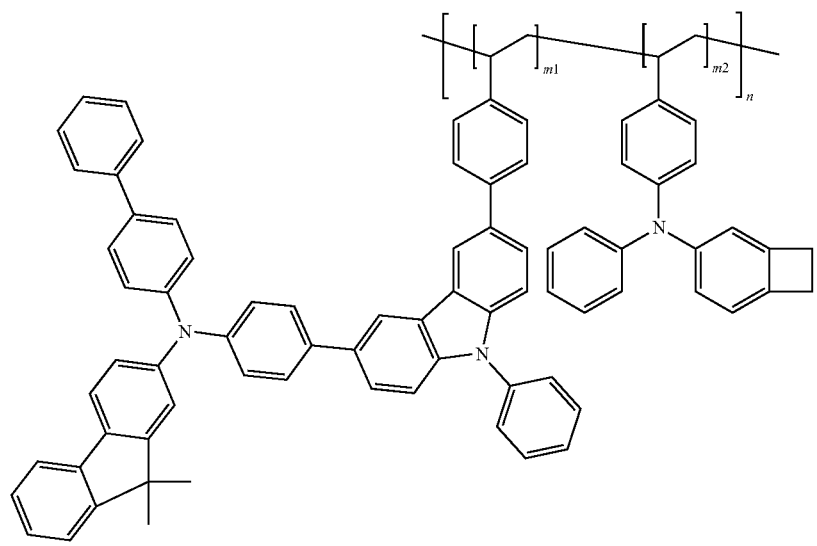

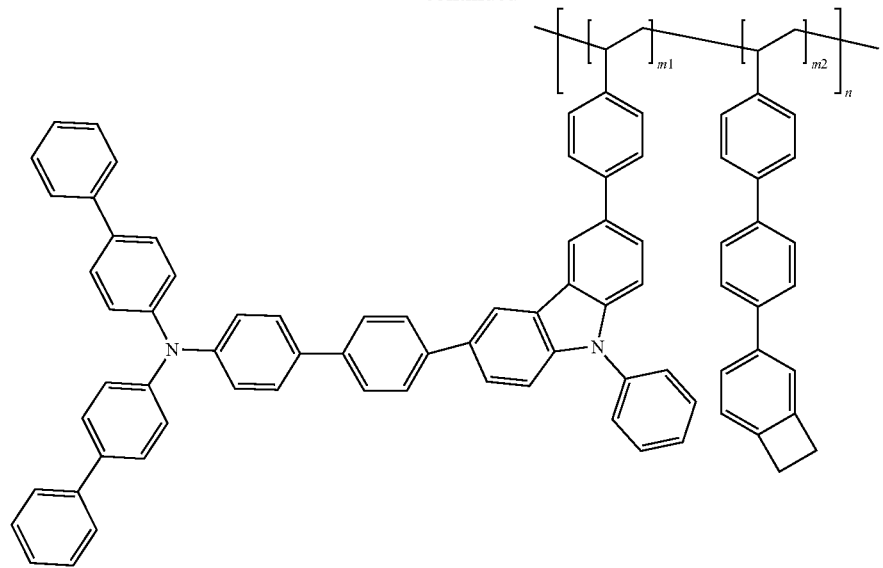
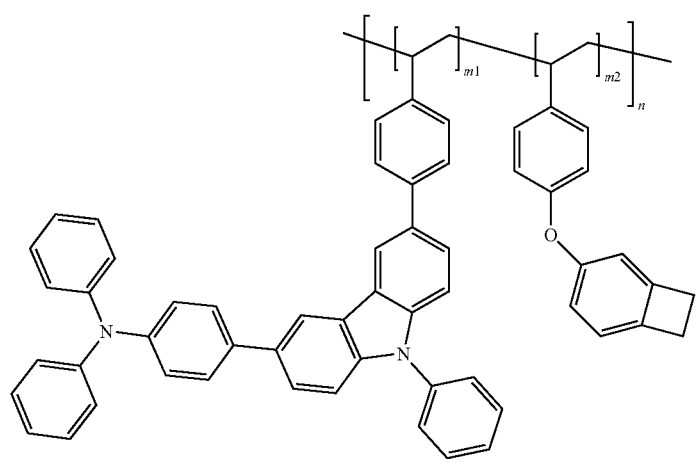
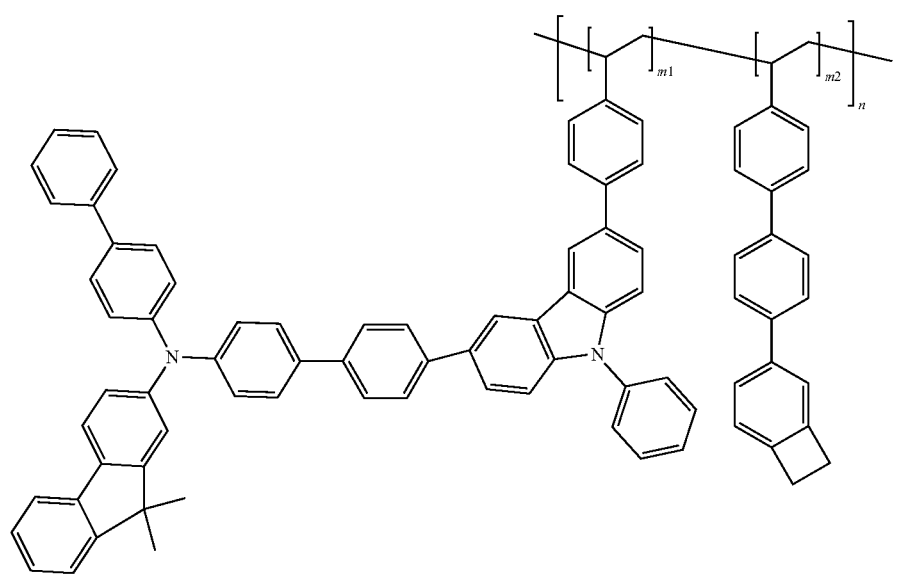

-continued
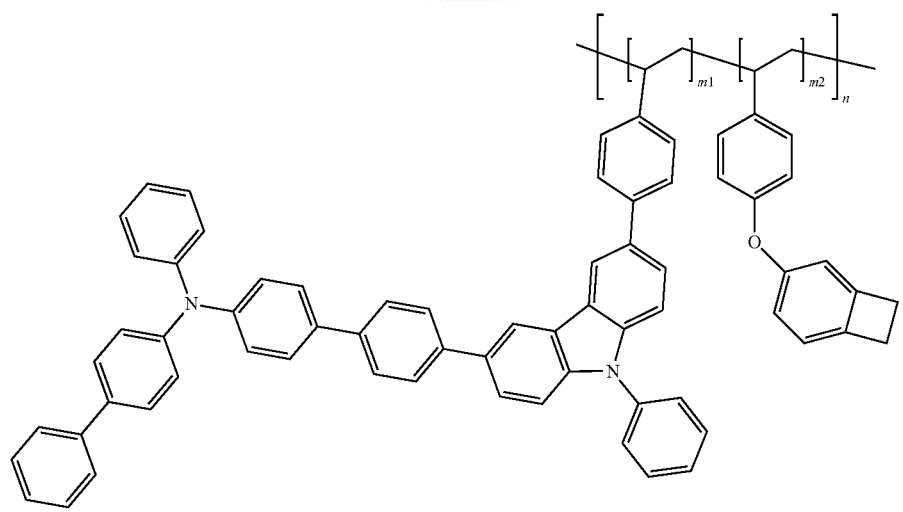
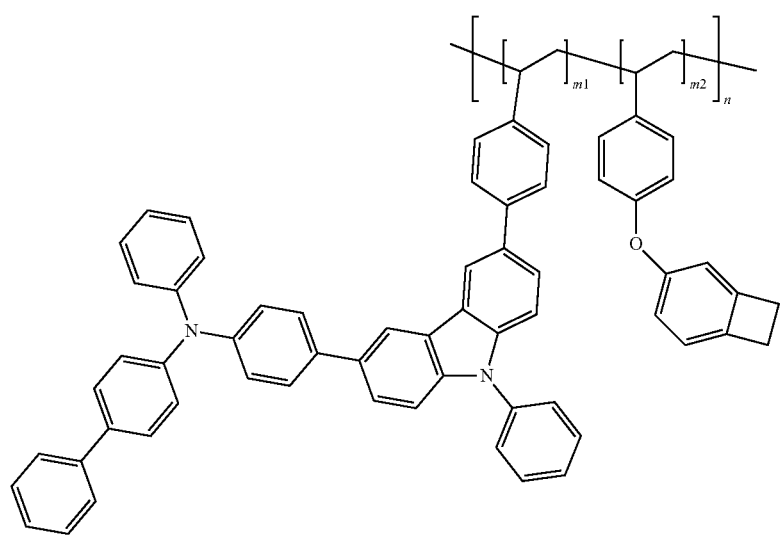
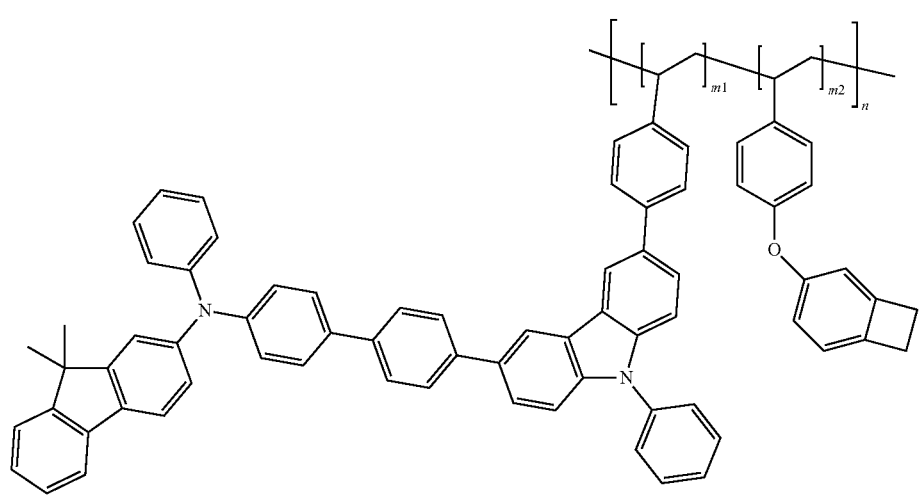

-continued
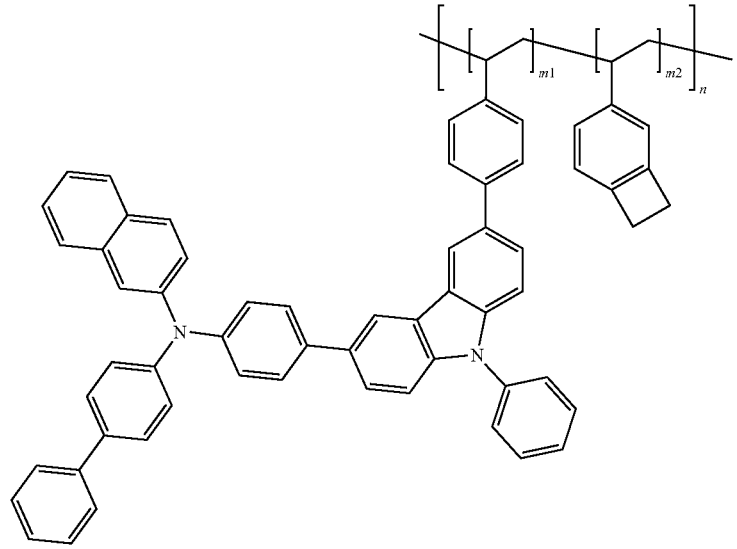
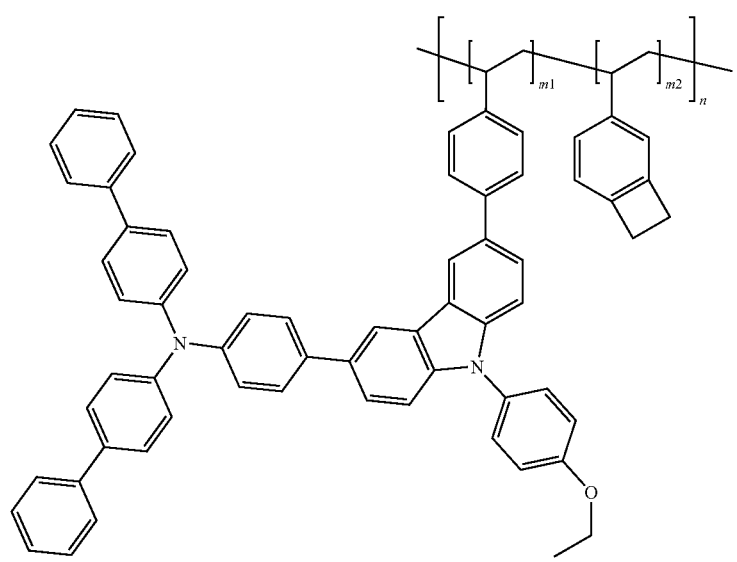
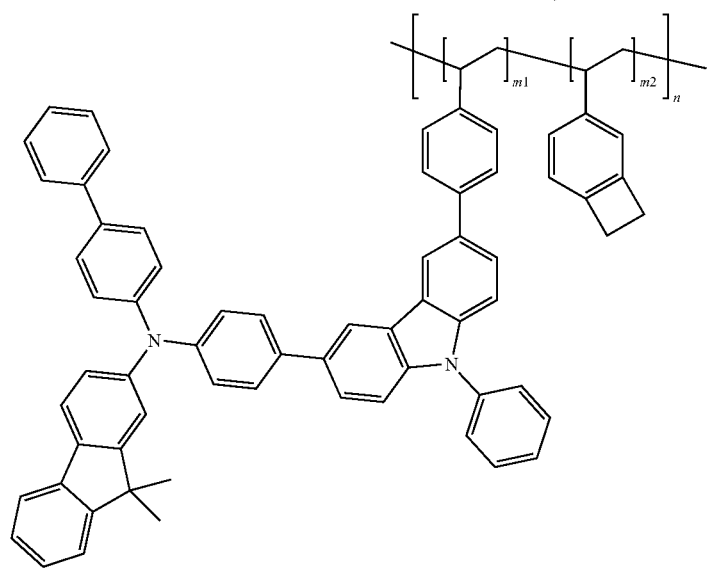

-continued

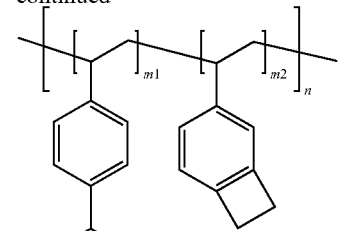
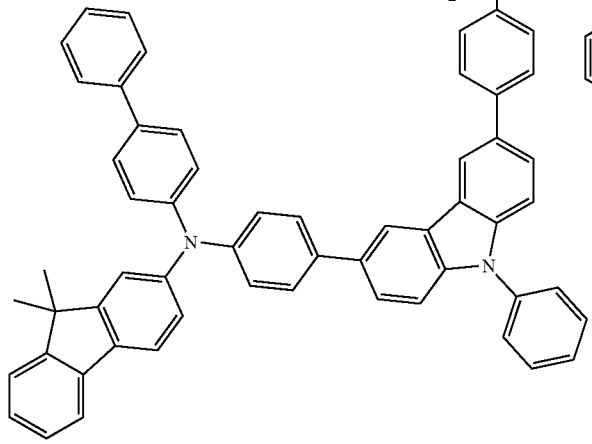

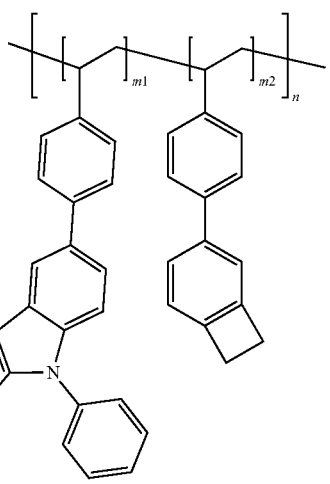
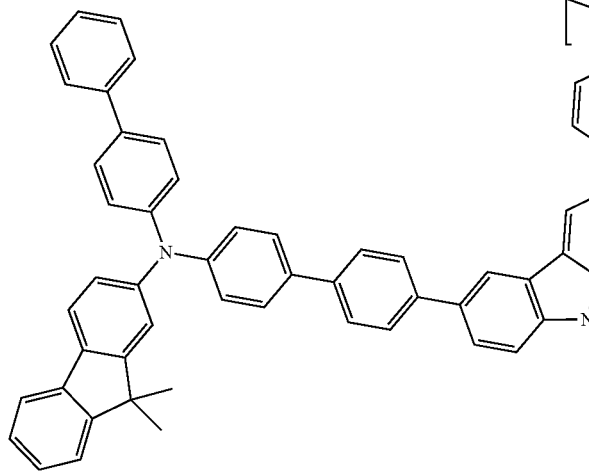

In the structures,
m1 is a mole fraction and 0<m1<1,
m2 is a mole fraction and 0<m2<1,
m1+m2≤1, and
n is a repeating number of the unit, and an integer from 1 to 10,000.

In an exemplary embodiment of the present specification, the polymer including the first unit represented by Formula 1 and the second unit represented by Formula 2 may be any one selected from the following structures.

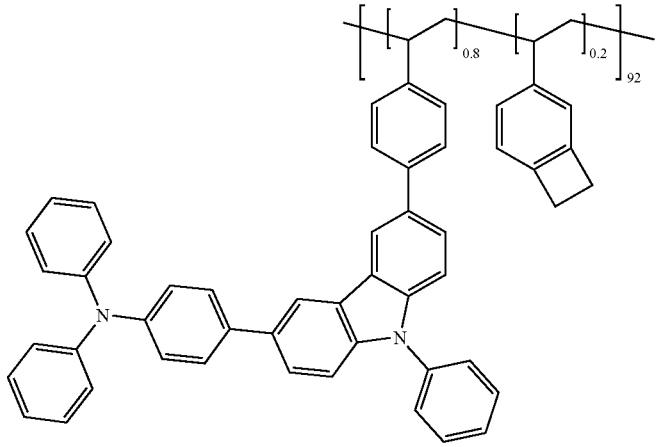

-continued
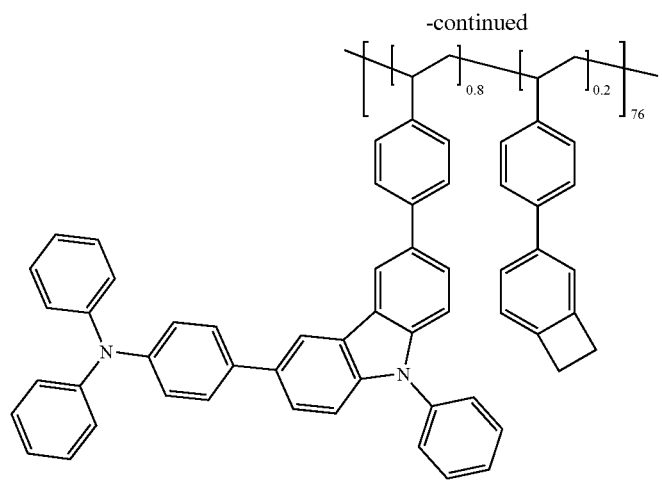
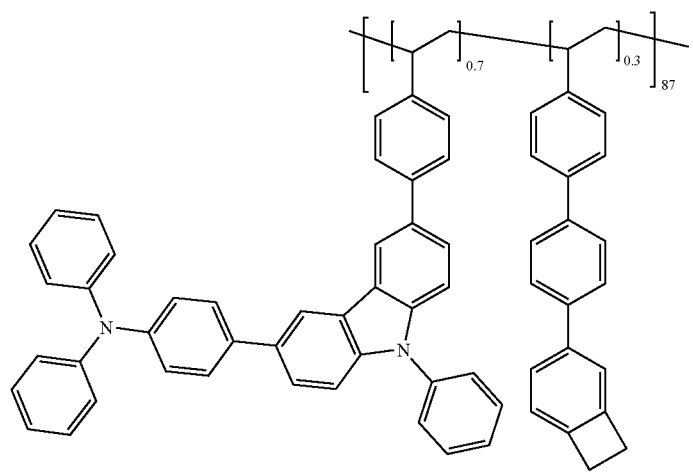
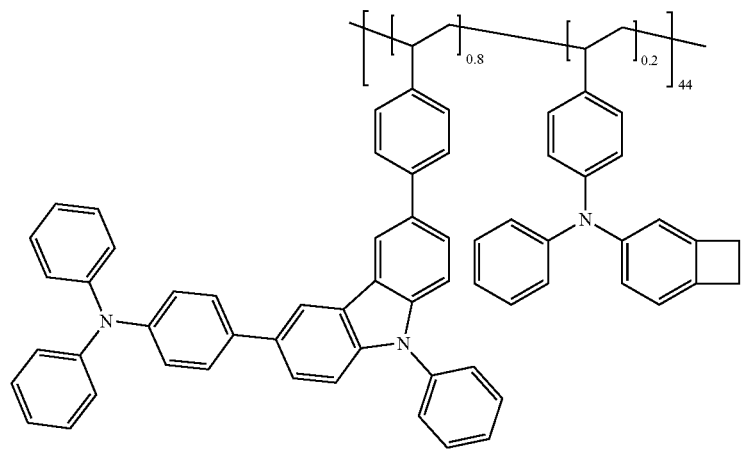

-continued
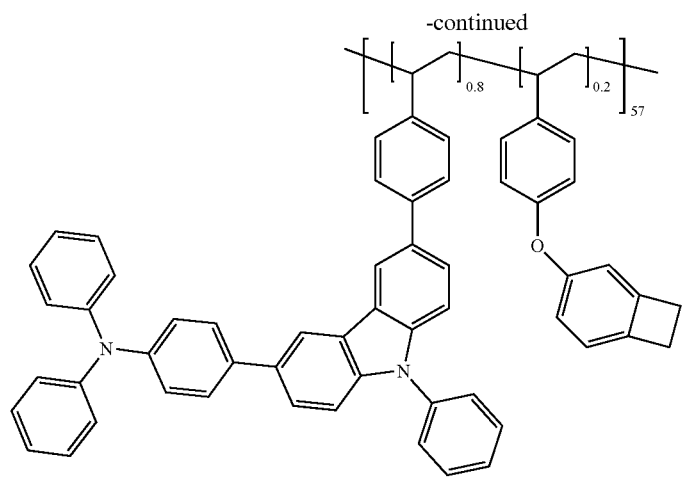
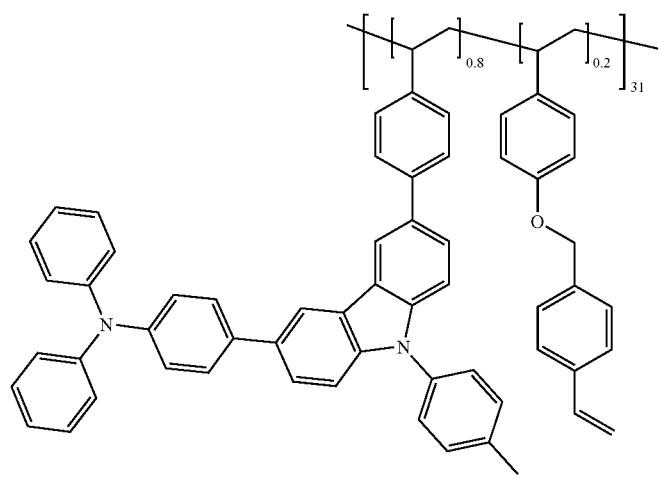
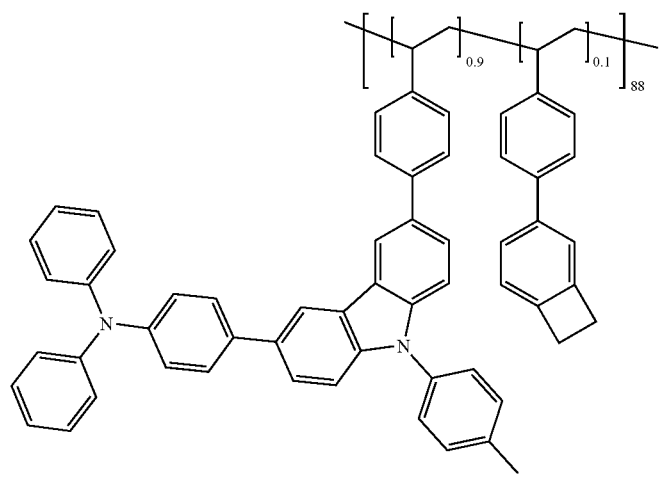

-continued
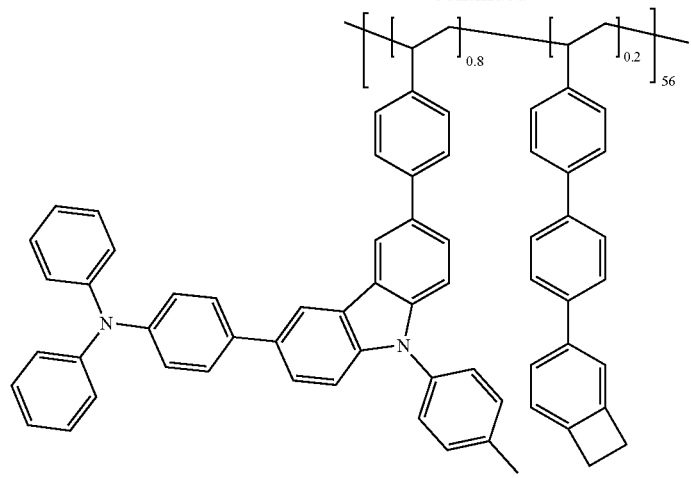
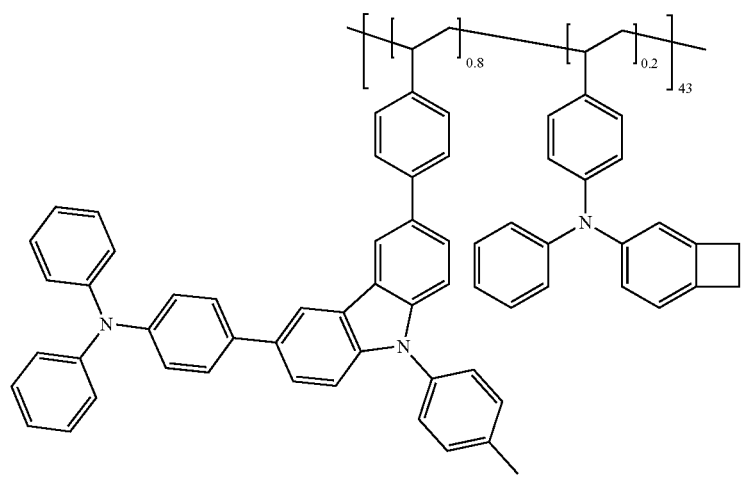
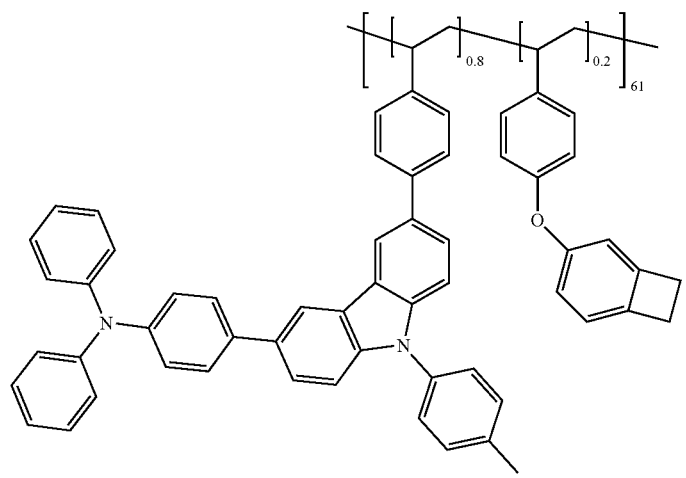

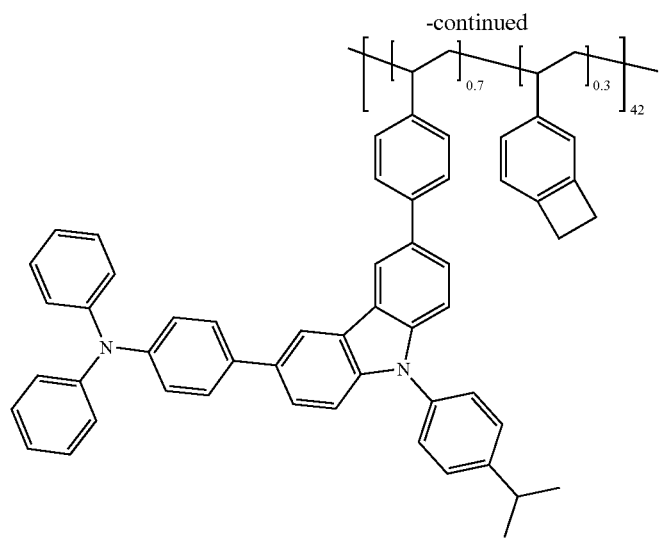
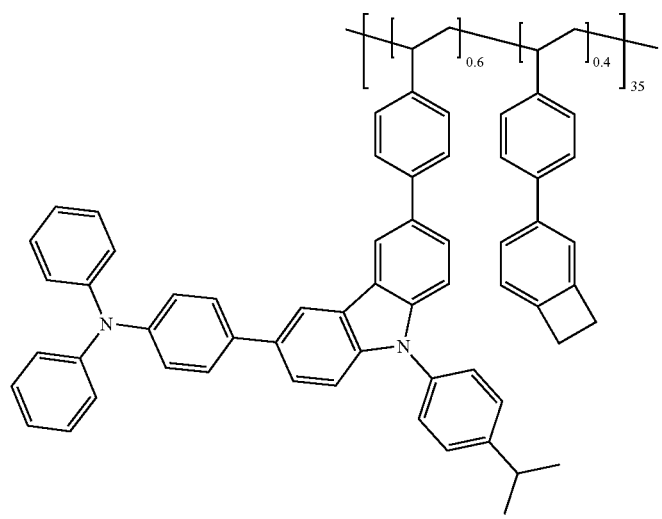
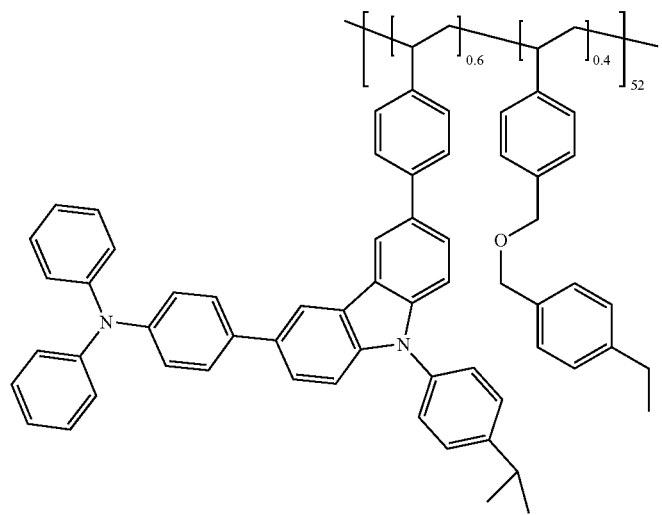

-continued
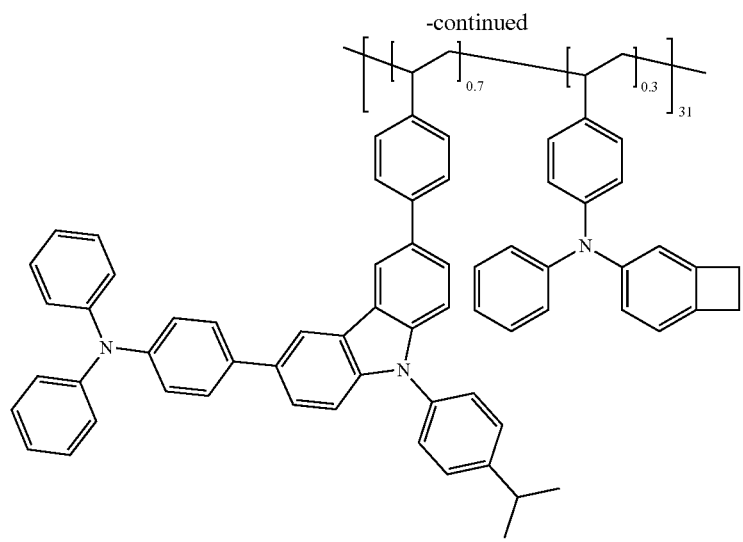
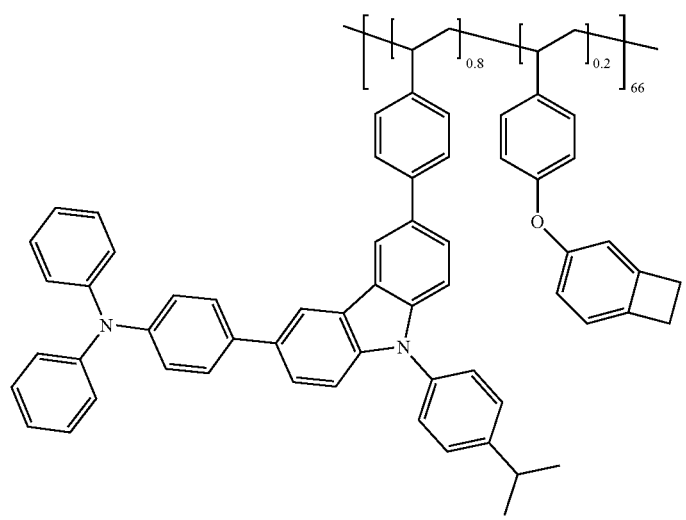
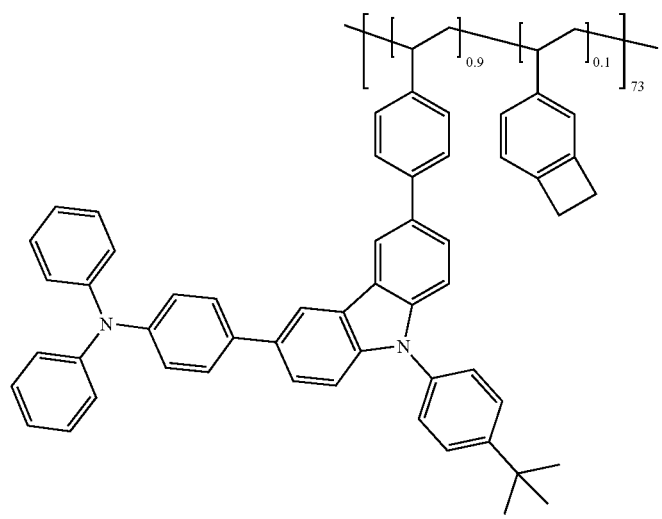

-continued
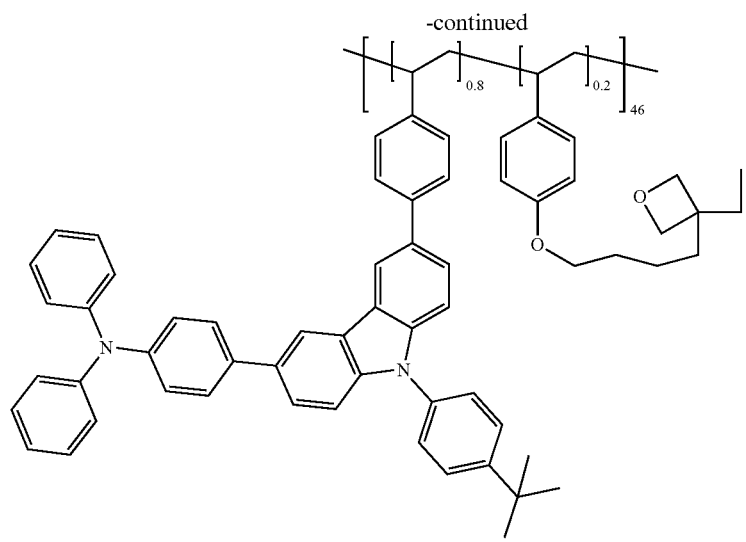
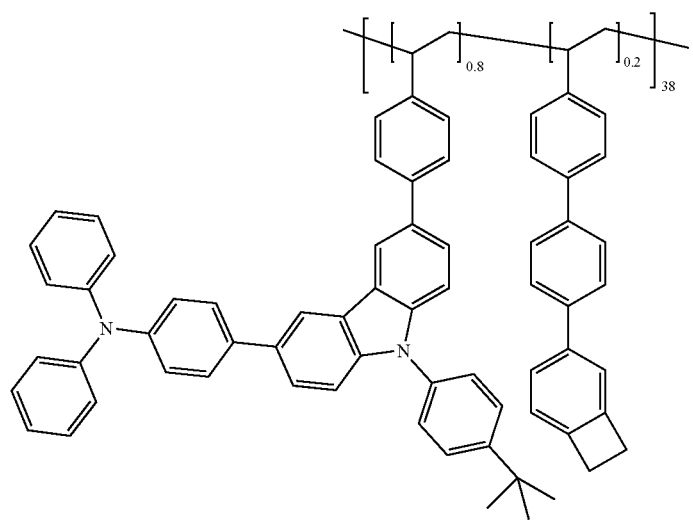
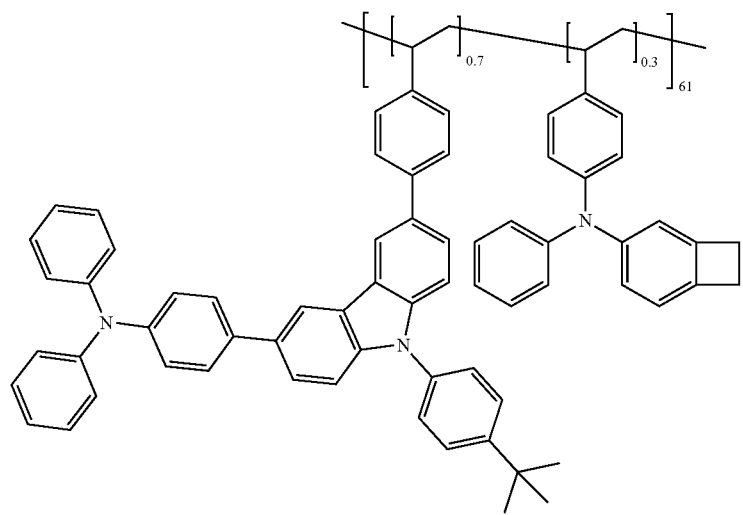

-continued
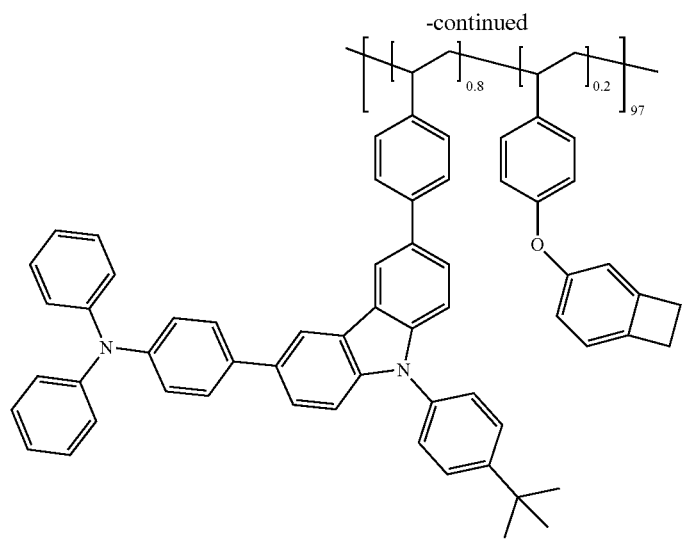
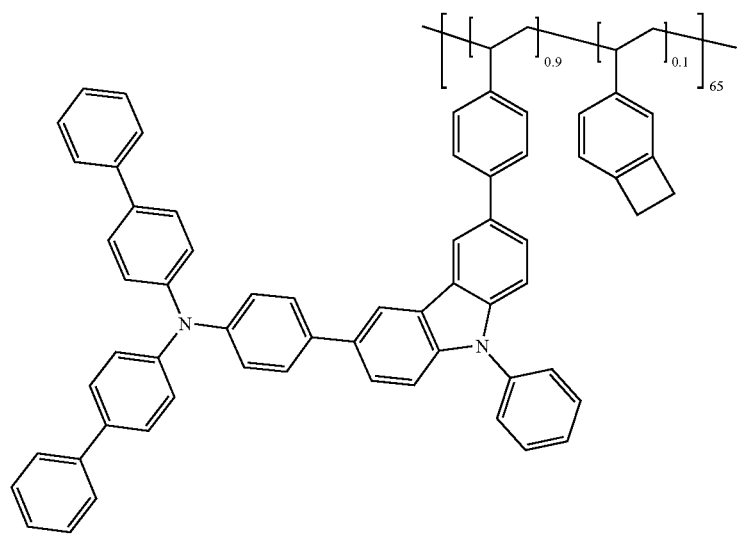
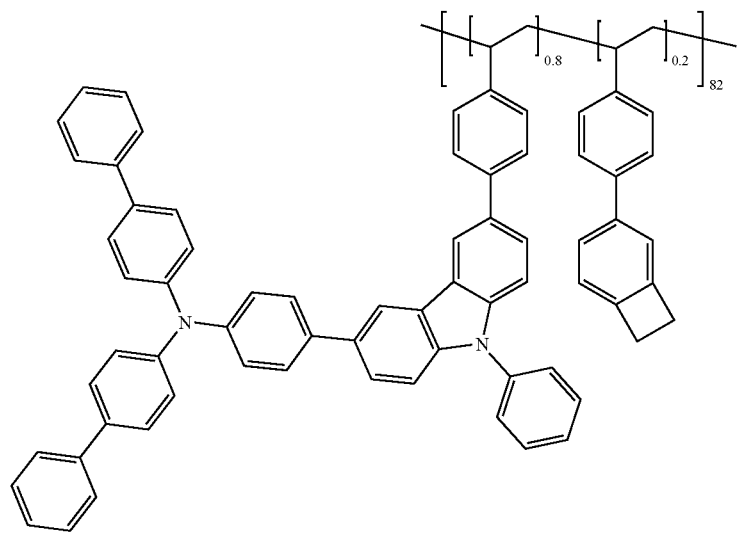

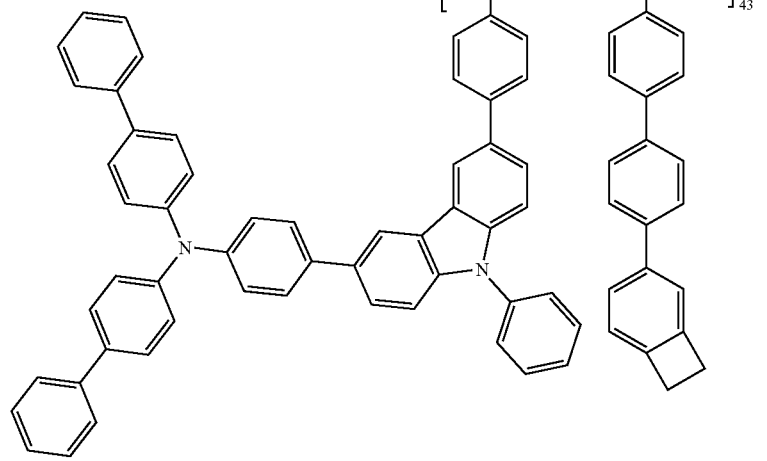
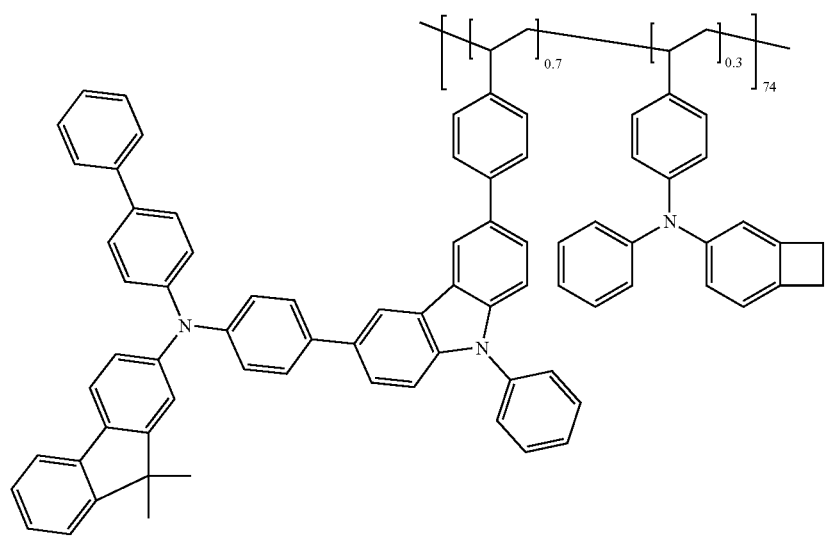
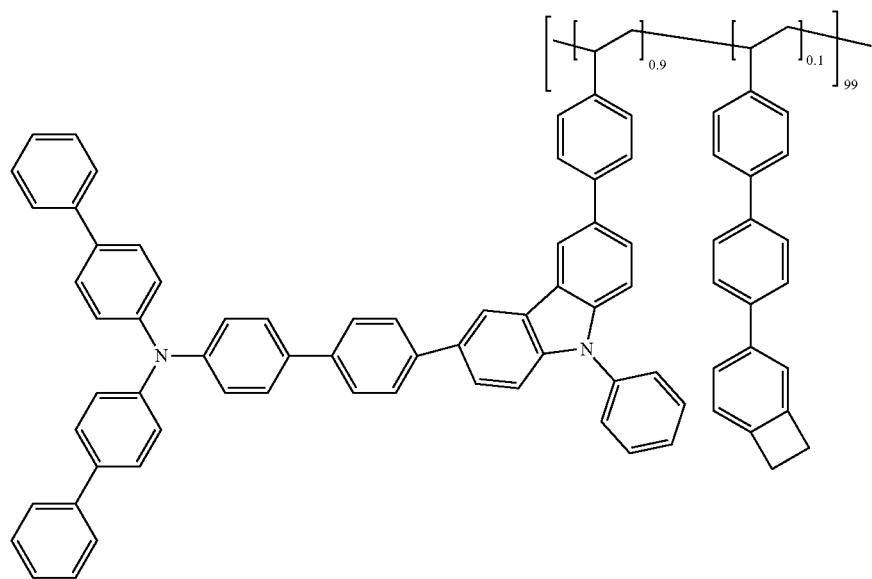

-continued
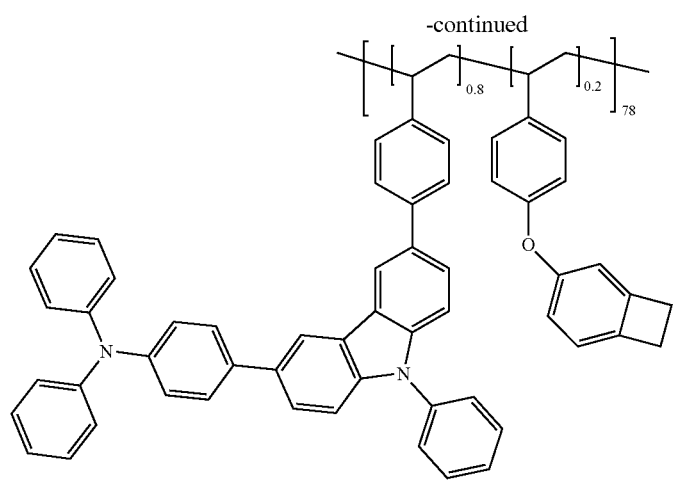
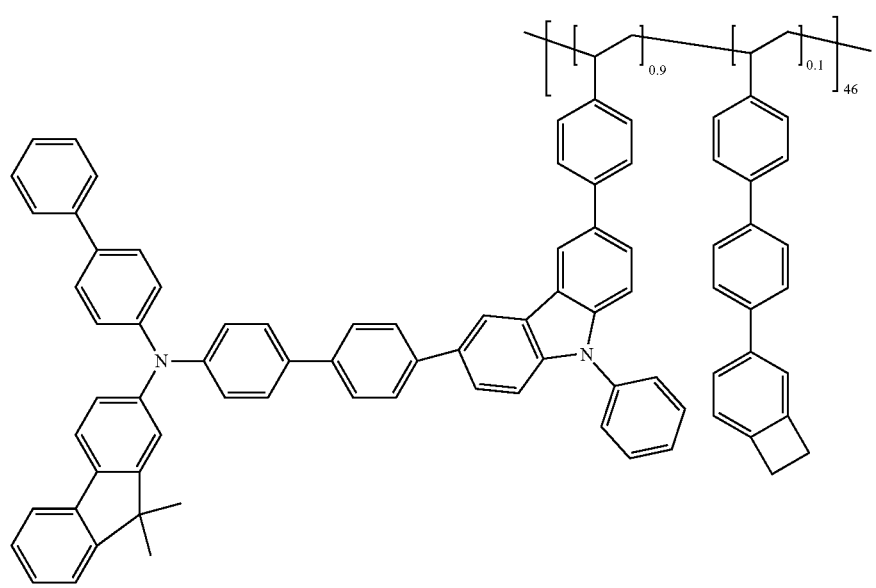
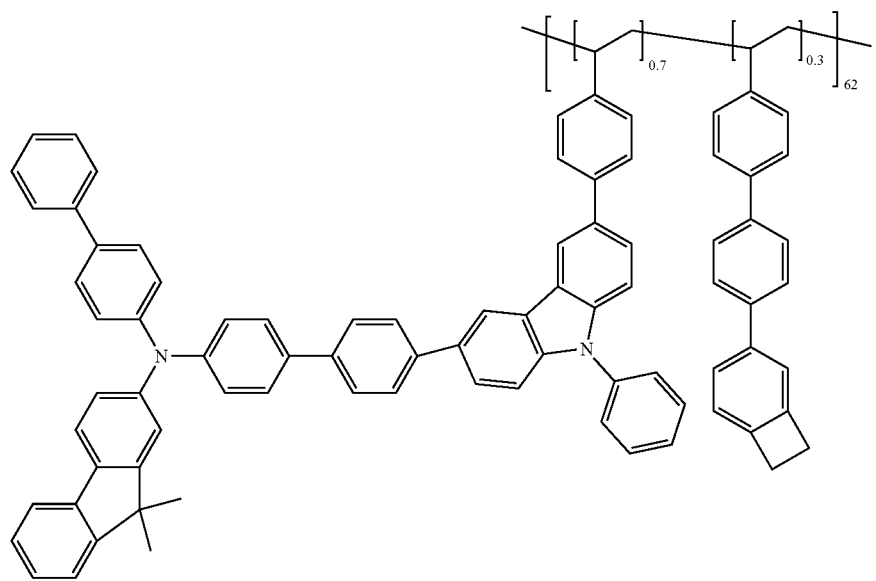

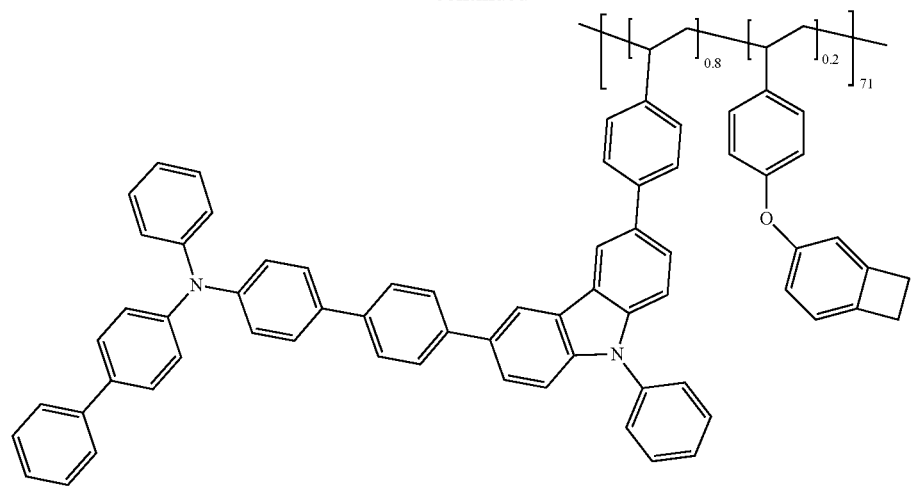
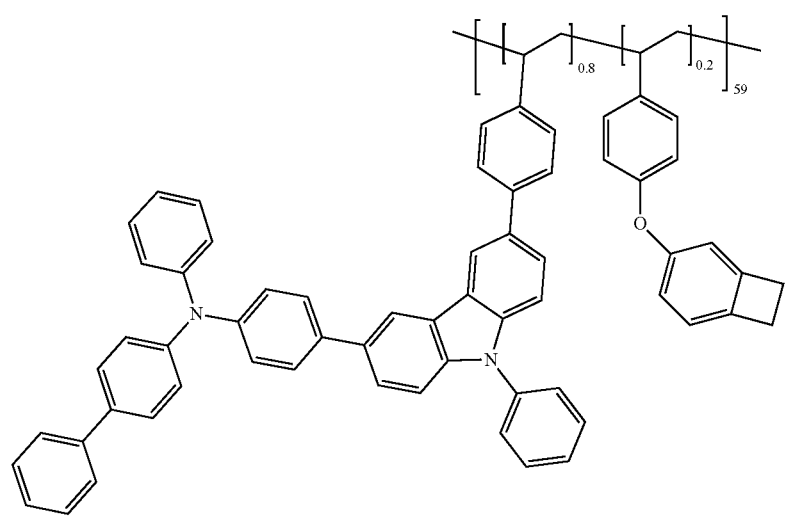
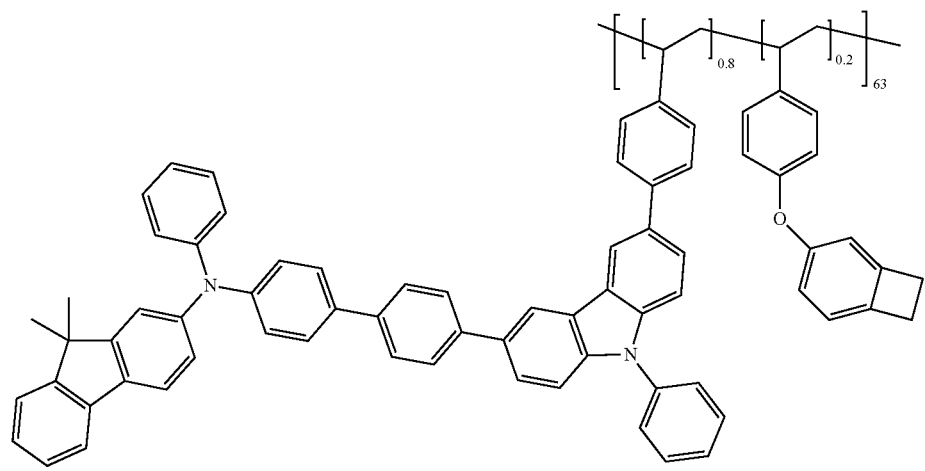

-continued

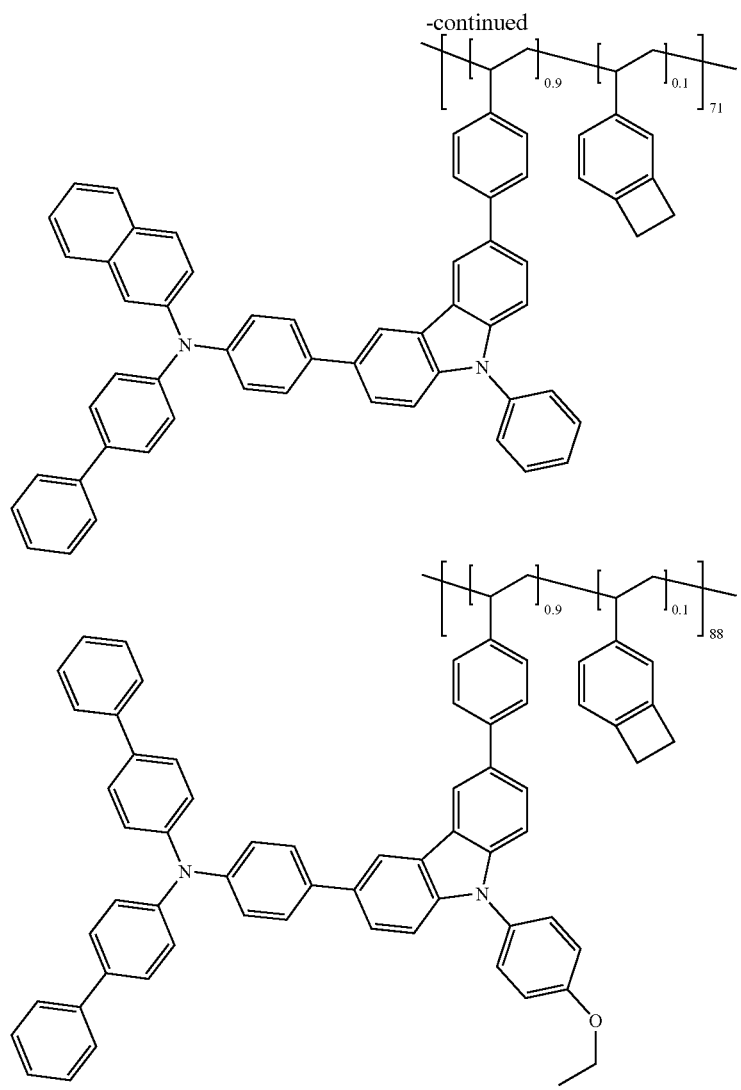

In an exemplary embodiment of the present specification, the polymer may have a number average molecular weight of 5,000 g/mol to 1,000,000 g/mol. Specifically, the polymer may have a number average molecular weight of 5,000 g/mol to 300,000 g/mol.

In the present specification, the molecular weight was analyzed by GPC equipment. PL mixed Bx2 was used as a column, and tetrahydrofuran (THF) (filtered with a 0.45 m filter and used) was used as a solvent. The molecular weight was measured at a flow rate of 1.0 mL/min and a sample concentration of 1 mg/mL. 100 L of the sample was injected, and the column temperature was set to 40° C. An Agilent RI detector was used as a detector, and a reference was set with polystyrene (PS). Data processing was performed by the ChemStation program.

The polymer according to an exemplary embodiment of the present specification may be prepared by a preparation method described below. Representative examples will be described in the Preparation Examples described below, but if necessary, a substituent may be added or excluded, and the position of the substituent may be changed. Further, a starting material, a reactant, reaction conditions, and the like may be changed based on the technology known in the art.

For example, the polymer including the first unit represented by Formula 1 and the second unit represented by Formula 2 may be prepared as in the following Reaction Formula 1.

[Reaction Formula 1]

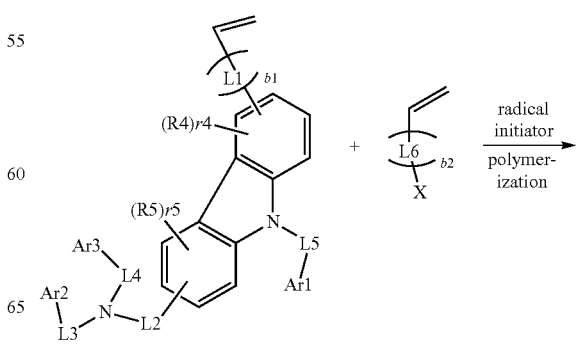

-continued

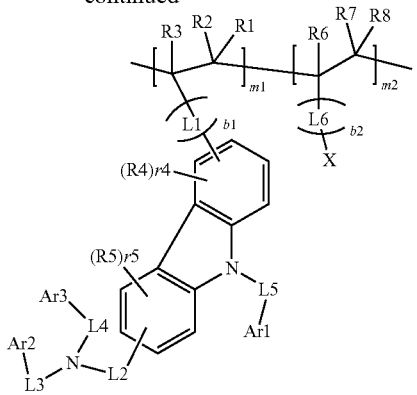

definitions of X, L1 to L6, b1, b2, Ar1 to Ar3, R1 to R8, r4, r5, m1, and m2 are the same as those defined in Formulae 1 and 2.

The present specification provides a coating composition including the polymer.

According to an exemplary embodiment of the present specification, azobisisobutyronitrile (AIBN) is used during the preparation of the coating composition.

According to an exemplary embodiment of the present specification, the coating composition may further include a solvent.

In an exemplary embodiment of the present specification, the coating composition may be in a liquid phase. The "liquid phase" means that the composition is in a liquid state at room temperature under atmospheric pressure.

In an exemplary embodiment of the present specification, examples of the solvent include: a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; an aliphatic hydrocarbon-based solvent such as cyclohexane, methylcyclohexane, n-pentane, n-hexane, n-heptane, n-octane, n-nonane, and n-decane; a ketone-based solvent such as acetone, methyl ethyl ketone, and cyclohexanone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol and a derivative thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; a benzoate-based solvent such as methyl benzoate, butyl benzoate, and 3-phenoxybenzoate; and a solvent such as tetralin, but the solvent is can be used as long as the solvent may dissolve or disperse the compound according to an exemplary embodiment of the present specification, and is not limited thereto.

In an exemplary embodiment of the present specification, the coating composition includes a toluene solvent.

In another exemplary embodiment, the solvents may be used either alone or in a mixture of two or more solvents.

In still another exemplary embodiment, a boiling point of the solvent is preferably 40° C. to 250° C., and more preferably 60° C. to 230° C., but is not limited thereto.

In yet another exemplary embodiment, a viscosity of the single solvent or the mixed solvent is preferably 1 CP to 10 CP, and more preferably 3 CP to 8 CP, but is not limited thereto.

In still yet another exemplary embodiment, a concentration of the coating composition is preferably 0.1 wt/v % to 20 wt/v %, and more preferably 0.5 wt/v % to 5 wt/v %, but is not limited thereto.

In an exemplary embodiment of the present specification, the coating composition may further include one or two or more additives selected from the group consisting of a thermal polymerization initiator and a photopolymerization initiator.

Examples of the thermal polymerization initiator include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5,5-trimethylhexanoyl peroxide, lauryl peroxide, benzoyl peroxide, p-kroll benzoyl peroxide, dicumyl peroxide, 2,5-dimethyl-2,5-(t-butyl oxy)-hexane, 1,3-bis(t-butyl peroxyisopropyl) benzene, t-butyl cumyl peroxide, di-t-butyl peroxide, 2,5-dimethyl-2,5-(di-t-butyl peroxy) hexane-3, tris-(t-butyl peroxy) triazine, 1,1-di-t-butyl peroxy-3,3,5-trimethyl cyclohexane, 1,1-di-t-butylperoxy cyclohexane, 2,2-di(t-butyl peroxy) butane, 4,4-di-t-butylperoxyvaleric acid n-butyl ester, 2,2-bis(4,4-t-butyl peroxy cyclohexyl) propane, t-butyl peroxy isobutyrate, di-t-butyl peroxy hexahydro terephthalate, t-butyl peroxy-3,5,5-trimethylhexate, t-butyl peroxybenzoate, and di-t-butyl peroxy trimethyl adipate, or an azo-based thermal polymerization initiator such as azobisisobutyronitrile, azobisdimethylvaleronitrile, and azobiscyclohexyl nitrile, but the examples are not limited thereto.

Examples of the photopolymerization initiator include acetophenone-based or ketal-based photopolymerization initiators such as diethoxyacetophenone, 2,2-dimethoxy-1, 2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl) butanon-1,2-hydroxy-2-methyl-1-phenylpropan-1-one, 2-methyl-2-morpholino(4-methylthiophenyl)propan-1-one, and 1-phenyl-1,2-propanedion-2-(o-ethoxycarbonyl)oxime, benzoin ether-based photopolymerization initiators such as benzoin, benzoin methyl ether, benzoin ethyl ether, benzoin isobutyl ether, and benzoin isopropyl ether, benzophenone-based photopolymerization initiators such as benzophenone, 4-hydroxybenzophenone, 2-benzoylnaphthalene, 4-benzoyl-biphenyl, 4-benzoyl phenyl ether, acrylated benzophenone, and 1,4-benzoylbenzene, thioxanthone-based photopolymerization initiators such as 2-isopropylthioxanthone, 2-chlorothioxanthone, 2,4-dimethylthioxanthone, 2,4-diethylthioxanthone, and 2,4-dichlorothioxanthone, and examples of other photopolymerization initiators include ethylanthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxybenzoyl)-2,4,4-trimethylpentylphosphine oxide, methyl phenyl glyoxy ester, 9,10-phenanthrene, acridine-based compounds, triazine-based compounds, and imidazole-based compounds, but are limited thereto.

Further, compounds having photopolymerization promoting effects may be used either alone or in combination with the photopolymerization initiators. Examples thereof include triethanolamine, methyldiethanolamine, ethyl 4-dimethylaminobenzoate, isoamyl 4-dimethylaminobenzoate, (2-dimethylamino)ethyl benzoate, 4,4'-dimethylamino benzophenone, and the like, but are not limited thereto.

According to an exemplary embodiment of the present specification, the coating composition is cured by a free-radical polymerization reaction such as nitroxide-mediated polymerization (NMP), atom transfer radical polymerization (ATRP), and reversible addition fragmentation chain transfer (RAFT) polymerization.

The present specification also provides an organic light emitting device formed by using the coating composition.

In an exemplary embodiment of the present specification, the organic light emitting device includes: a first electrode; a second electrode provided to face the first electrode; and an organic material layer having one or more layers provided between the first electrode and the second electrode, in which one or more layers of the organic material layer include a cured product of the coating composition.

In an exemplary embodiment of the present specification, the first electrode is a cathode, and the second electrode is an anode.

In another exemplary embodiment, the first electrode is an anode, and the second electrode is a cathode. In an exemplary embodiment of the present specification, the cured product of the coating composition is in a state in which the coating composition is cured by a heat treatment or a light treatment.

In an exemplary embodiment of the present specification, the organic material layer including the cured product of the coating composition is a hole transport layer, a hole injection layer, or a layer which simultaneously transports and injects holes.

In an exemplary embodiment of the present specification, the organic material layer including the cured product of the coating composition includes a light emitting layer, and the light emitting layer includes the cured product of the coating composition.

In an exemplary embodiment of the present specification, the coating composition may further include a p-doping material (p-dopant).

In an exemplary embodiment of the present specification, the p-doping material includes $F_4TCNQ$; or a boron anion.

In an exemplary embodiment of the present specification, the p-doping material includes $F_4TCNQ$; or a boron anion, and the boron anion includes a halogen group. In an exemplary embodiment of the present specification, the p-doping material includes $F_4TCNQ$; or a boron anion, and the boron anion includes F.

In an exemplary embodiment of the present specification, the p-doping material is selected from the following structural formulae.

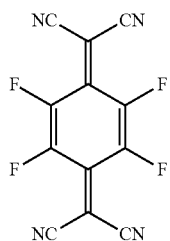

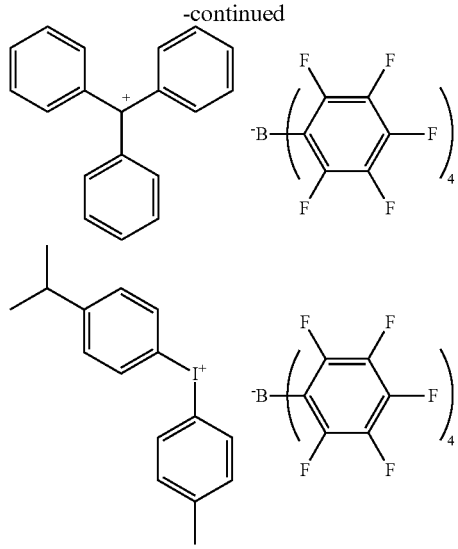

In an exemplary embodiment of the present specification, a content of the p-doping material is 0.001 wt % to 50 wt %; 0.01 wt % to 30 wt %; or 1 wt % to 25 wt %, based on the total weight 100% of the coating composition.

In an exemplary embodiment of the present specification, the organic light emitting device may further include one or two or more layers selected from the group consisting of a hole injection layer, a hole transport layer, an electron transport layer, an electron injection layer, an electron blocking layer, and a hole blocking layer.

In another exemplary embodiment, the organic light emitting device may be an organic light emitting device having a normal type structure in which an anode, an organic material layer having one or more layers, and a cathode are sequentially stacked on a substrate.

In still another exemplary embodiment, the organic light emitting device may be an organic light emitting device having an inverted type structure in which a cathode, an organic material layer having one or more layer, and an anode are sequentially stacked on a substrate.

The organic material layer of the organic light emitting device of the present specification may also be composed of a single-layered structure, but may be composed of a multi-layered structure in which an organic material layer having two or more layers is stacked. For example, the organic light emitting device of the present specification may have a structure including a hole injection layer, a hole transport layer, a light emitting layer, an electron transport layer, an electron injection layer, and the like as organic material layers. However, the structure of the organic light emitting device is not limited thereto, and may include a fewer number of organic layers.

For example, the structure of the organic light emitting device according to an exemplary embodiment of the present specification is exemplified in the FIGURE.

The FIGURE exemplifies a structure of an organic light emitting device in which an anode 201, a hole injection layer 301, a hole transport layer 401, a light emitting layer 501, a layer 601 which simultaneously injects and transports electrons, and a cathode 701 are sequentially stacked on a substrate 101.

In an exemplary embodiment of the present specification, the hole injection layer 301, the hole transport layer 401, or the light emitting layer 501 in the FIGURE may be formed by using a coating composition including a polymer including: the first unit represented by Formula 1; and a second unit represented by the following Formula 2.

In an exemplary embodiment of the present specification, the hole injection layer 301 in the FIGURE may be formed by using a coating composition including a polymer including: the first unit represented by Formula 1; and a second unit represented by the following Formula 2.

In an exemplary embodiment of the present specification, the hole injection layer 401 in the FIGURE may be formed by using a coating composition including a polymer including: the first unit represented by Formula 1; and a second unit represented by the following Formula 2.

The FIGURE exemplifies an organic light emitting device, and the organic light emitting device is not limited thereto.

When the organic light emitting device includes a plurality of organic material layers, the organic material layers may be formed of the same material or different materials.

The organic light emitting device of the present specification may be manufactured by the materials and methods known in the art, except that one or more layers of the organic material layer are formed by using a coating composition.

For example, the organic light emitting device of the present specification may be manufactured by sequentially stacking an anode, an organic material layer, and a cathode on a substrate. In this case, the organic light emitting device may be manufactured by depositing a metal or a metal oxide having conductivity, or an alloy thereof on a substrate to form an anode, forming an organic material layer including a hole injection layer, a hole transport layer, a light emitting layer, and an electron transport layer thereon, and then depositing a material, which may be used as a cathode, thereon, by using a physical vapor deposition (PVD) method such as sputtering or e-beam evaporation. In addition to the method described above, an organic light emitting device may be manufactured by sequentially depositing a cathode material, an organic material layer, and an anode material on a substrate.

The present specification also provides a method for manufacturing an organic light emitting device formed by using the coating composition.

Specifically, an exemplary embodiment of the present specification provides a method for manufacturing an organic light emitting device, the method including: preparing a substrate; forming a cathode or an anode on the substrate; forming an organic material layer having one or more layers on the cathode or the anode; and forming an anode or a cathode on the organic material layer, in which the forming of the organic material layer includes forming an organic material layer having one or more layers by using the coating composition.

In an exemplary embodiment of the present specification, the organic material layer formed by using the coating composition is formed by using spin coating or ink-jetting.

In another exemplary embodiment, the organic material layer formed by using the coating composition is formed by a printing method.

In still another exemplary embodiment of the present specification, examples of the printing method include inkjet printing, nozzle printing, offset printing, transfer printing or screen printing, and the like, but are not limited thereto.

The coating composition according to an exemplary embodiment of the present specification is suitable for a solution process due to the structural characteristics thereof, so that the organic material layer may be formed by a printing method, and as a result, there is an economic effect in terms of time and costs when a device is manufactured.

In an exemplary embodiment of the present specification, the forming of the organic material layer formed by using the coating composition includes: coating the cathode or the anode with the coating composition; and subjecting the coating composition to a heat treatment or a light treatment.

In an exemplary embodiment of the present specification, the time for subjecting the organic material layer formed by using the coating composition to a heat treatment is preferably within 1 hour, and more preferably within 30 minutes.

In an exemplary embodiment of the present specification, an atmosphere under which the organic material layer formed by using the coating composition is subjected to a heat treatment is preferably an inert gas such as argon and nitrogen.

When the forming of the organic material layer formed by using the coating composition includes the subjecting of the coating composition to the heat treatment or the light treatment, a plurality of fluorene groups included in the coating composition may form a cross-linkage, thereby providing an organic material layer including a thin-filmed structure. In this case, it is possible to prevent the organic material layer from being dissolved or morphologically affected or decomposed by a solvent deposited on the surface of the organic material layer formed by using the coating composition.

Therefore, when the organic material layer formed by using the coating composition is formed by a method including the subjecting of the coating composition to the heat treatment or the light treatment, resistance to a solvent is increased, so that a plurality of layers may be formed by repeatedly carrying out solution deposition and cross-linking methods, and stability is increased, so that service life characteristics of the device may be increased.

In an exemplary embodiment of the present specification, the coating composition including the polymer may use a coating composition dispersed by being mixed with a polymer binding agent.

In an exemplary embodiment of the present specification, as the polymer binding agent, those which do not extremely suppress charge transport are preferred, and those which are not strong in absorption to visible light are preferably used. As the polymeric binding agent, poly(N-vinylcarbazole), polyaniline, and derivatives thereof, polythiophene and derivatives thereof, poly(p-phenylene vinylene) and derivatives thereof, poly(2,5-thienylene vinylene) and derivatives thereof, polycarbonate, polyacrylate, polymethyl acrylate, polymethyl methacrylate, polystyrene, polyvinyl chloride, polysiloxane, and the like are exemplified.

Further, the polymer according to an exemplary embodiment of the present specification may also be included as a compound alone, and may be included as a copolymer by using a coating composition mixed with another monomer, in an organic material layer. In addition, the polymer may be included as a copolymer or a mixture by using a coating composition mixed with another polymer.

As the anode material, materials having a high work function are usually preferred so as to facilitate the injection of holes into an organic material layer. Specific examples of the anode material which may be used in the present specification include: a metal, such as vanadium, chromium, copper, zinc, and gold, or an alloy thereof; a metal oxide, such as zinc oxide, indium oxide, indium tin oxide (ITO), and indium zinc oxide (IZO); a combination of metal and oxide, such as ZnO:Al or SnO2:Sb; a conductive polymer, such as poly(3-methylthiophene), poly[3,4-(ethylene-1,2- dioxy)thiophene] (PEDOT), polypyrrole, and polyaniline; and the like, but are not limited thereto.

As the cathode material, materials having a low work function are usually preferred so as to facilitate the injection of electrons into an organic material layer. Specific examples of the cathode material include: a metal, such as magnesium, calcium, sodium, potassium, titanium, indium, yttrium, lithium, gadolinium, aluminum, silver, tin, and lead, or an alloy thereof; a multi-layered structural material, such as LiF/Al or $LiO_2$/Al; and the like, but are not limited thereto.

The hole injection layer is a layer which injects holes from an electrode, and a hole injection material is preferably a compound which has a capability of transporting holes and thus has an effect of injecting holes at an anode and an excellent effect of injecting holes into a light emitting layer or a light emitting material, prevents excitons produced from the light emitting layer from moving to an electron injection layer or an electron injection material, and is also excellent in the ability to form a thin film. The highest occupied molecular orbital (HOMO) of the hole injection material is preferably a value between the work function of the anode material and the HOMO of the neighboring organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, polyaniline-based and polythiophene-based conductive polymers, and the like, but are not limited thereto.

The hole transport layer is a layer which accepts holes from a hole injection layer and transports the holes to a light emitting layer, and the hole transport material is suitably a material having high hole mobility which may accept holes from an anode or a hole injection layer to transfer the holes to a light emitting layer. Specific examples thereof include an arylamine-based organic material, a conductive polymer, a block copolymer having both conjugated portions and non-conjugated portions, and the like, but are not limited thereto.

The light emitting material is a material which may emit light in a visible light region by accepting and combining holes and electrons from a hole transport layer and an electron transport layer, respectively, and preferably a material having high quantum efficiency for fluorescence or phosphorescence. Specific examples thereof include: an 8-hydroxy-quinoline aluminum complex ($Alq_3$); a carbazole-based compound; a dimerized styryl compound; BAlq; a 10-hydroxybenzoquinoline-metal compound; benzoxazole-based, benzothiazole-based and benzimidazole-based compounds; a poly(p-phenylenevinylene) (PPV)-based polymer; a spiro compound; polyfluorene; lubrene; and the like, but are not limited thereto.

The light emitting layer may include a host material and a dopant material. Examples of the host material include fused aromatic ring derivatives, or hetero ring-containing compounds, and the like. Specifically, examples of the fused aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamine group, and examples thereof include a pyrene, an anthracene, a chrysene, a periflanthene, and the like, which have an arylamine group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamine group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The electron transport layer is a layer which accepts electrons from an electron injection layer and transports the electrons to a light emitting layer, and an electron transport material is suitably a material having high electron mobility which may proficiently accept electrons from a cathode and transfer the electrons to a light emitting layer. Specific examples thereof include: an Al complex of 8-hydroxyquinoline; a complex including $Alq_3$; an organic radical compound; a hydroxyflavone-metal complex; and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and may be generally formed under the same conditions as those of the hole injection layer. Specific examples thereof include an oxadiazole derivative or a triazole derivative, a phenanthroline derivative, an aluminum complex, and the like, but are not limited thereto.

The organic light emitting device according to the present specification may be a top emission type, a bottom emission type, or a dual emission type according to the materials to be used.

In an exemplary embodiment of the present application, the compound may be included in an organic solar cell or an organic transistor in addition to the organic light emitting device.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below. The Examples of the present specification are provided to more completely explain the present specification to a person with ordinary skill in the art.

Preparation Example 1. Preparation of Intermediate (1) Preparation of Intermediate 5

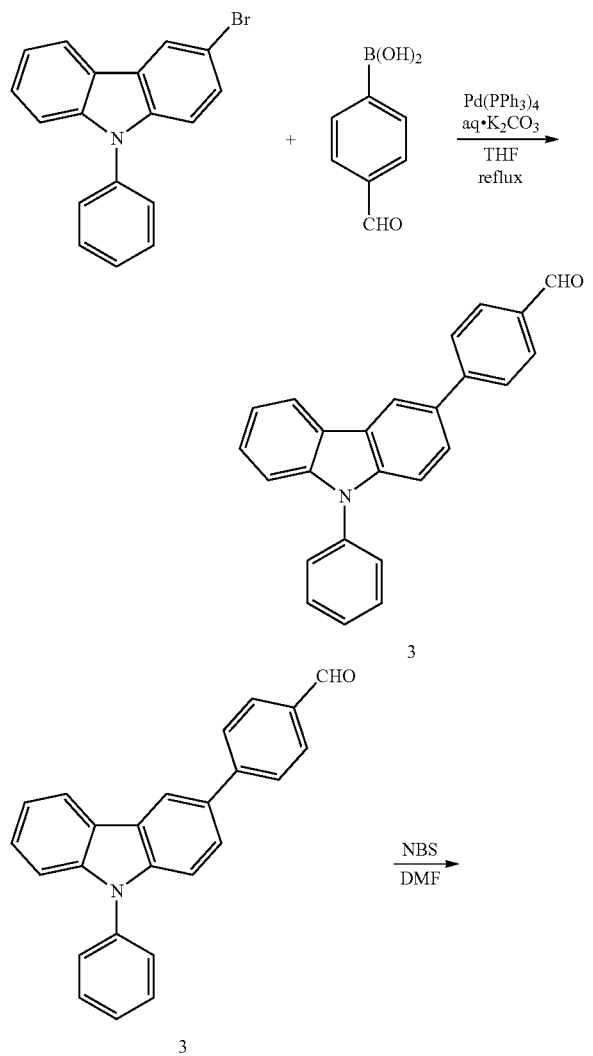

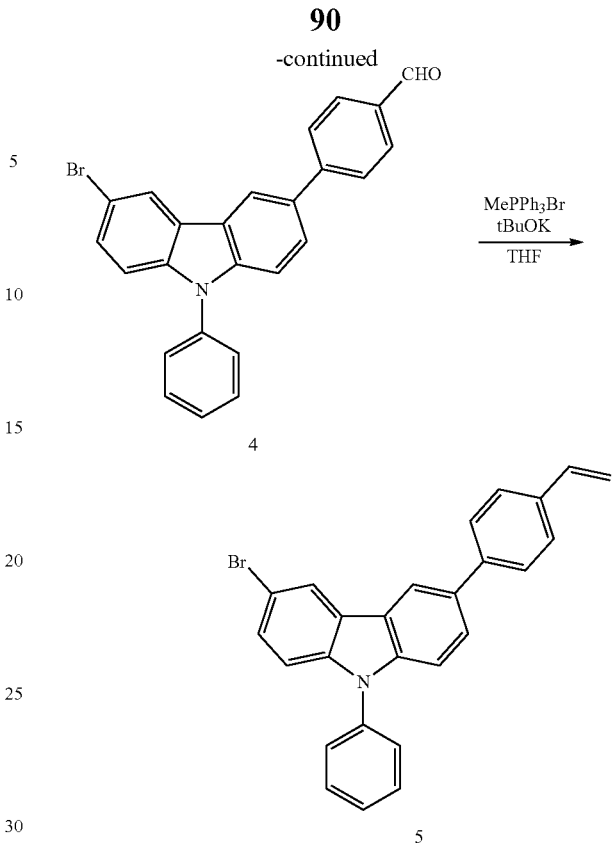

After 3-bromo-9-phenyl-9H-carbazole (9 g, 27.9 mmol) and 4-formylbenzene boronic acid (4.18 g, 27.9 mmol) were dissolved in anhydrous tetrahydrofuran (THF, 100 mL), Pd(PPh$_3$)$_4$ (0.32 g, 0.28 mmol) and 70 ml of an aqueous 2M potassium carbonate (K$_2$CO$_3$/H$_2$O) solution were put thereinto, and the resulting mixture was refluxed for 6 hours. After the reaction solution was cooled to room temperature, the organic layer was extracted. The reaction solution was concentrated and recrystallized with ethyl alcohol (EtOH) to obtain Intermediate 3 (8.9 g, yield 92%). MS: [M+H]$^+$=348

Intermediate 3 (8.2 g, 23.6 mmol) was dissolved in dimethylformaldehyde (200 mL), N-bromosuccinimide (4.15 g, 23.6 mmol) was added thereto, and then the resulting mixture was stirred at room temperature for 5 hours. After distilled water was put into the reaction solution to terminate the reaction, the organic layer was extracted. The reaction solution was concentrated and recrystallized with ethyl alcohol (EtOH) to obtain Intermediate 4 (8.25 g, yield 82%). MS: [M+H]$^+$=427

Methyltriphenylphosphonium bromide salt (13.41 g, 37.532 mmol) and potassium t-butoxide (4.21 g, 37.532 mmol) were put into anhydrous tetrahydrofuran (300 ml), and the resulting solution was first stirred. Thereafter, Intermediate 4 (8 g, 18.766 mmol) dissolved in anhydrous tetrahydrofuran (60 ml) was slowly added dropwise thereto, and then the resulting solution was allowed to react for 5 hours. After the reaction was terminated with an aqueous sodium carbonate solution, the organic layer was extracted by using methylene chloride and water, and the residual moisture was removed by using MgSO$_4$. After the reaction solution was concentrated, Intermediate 5 (7.8 g, 98%) was obtained by column chromatography using methylene chloride and hexane. MS: [M+H]$^+$=425

(2) Preparation of Intermediate 6

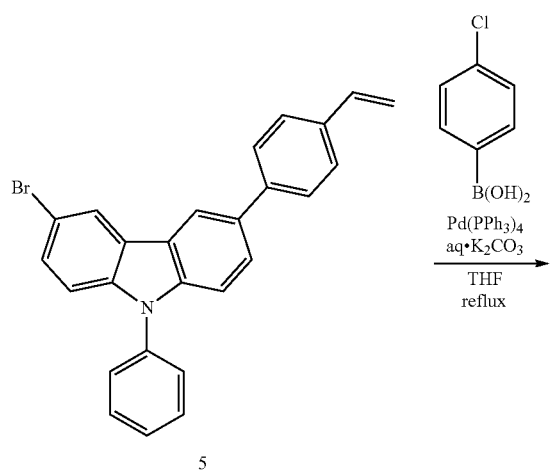

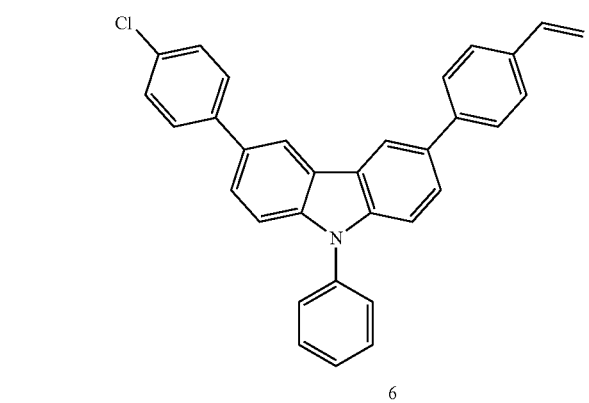

After Intermediate 5 (2 g, 4.713 mmol) and (4-chlorophenyl)boronic acid (1.1 g, 7.069 mmol) were dissolved in anhydrous tetrahydrofuran (THF, 20 mL), Pd(PPh$_3$)$_4$ (0.32 g, 0.28 mmol) and 15 ml of an aqueous 2M potassium carbonate (K$_2$CO$_3$/H$_2$O) solution were put thereinto, and the resulting solution was refluxed for 6 hours. After the reaction solution was cooled to room temperature, the organic layer was extracted. The reaction solution was concentrated and recrystallized with ethyl alcohol (EtOH) to obtain Intermediate 6 (2 g, yield 93%). MS: [M+H]$^+$=457

Preparation Example 2. Preparation of Compound A1 to A9

(1) Preparation of Compound A1

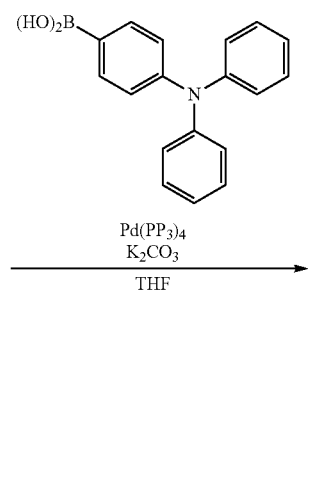

After Intermediate 5 (3.65 g, 8.615 mmol), 4-(diphenylamino)phenyl boronic acid (2.99 g, 10.338 mmol), Pd(PPh$_3$)$_4$ (498 mg, 0.431 mmol), and K$_2$CO$_3$ (3.57 g, 25.845 mmol) were dissolved in anhydrous tetrahydrofuran (200 ml) and distilled water (100 ml), the resulting solution was stirred at 70° C. for 15 hours. The organic layer was extracted by using ethyl acetate and water. After moisture was removed from the organic layer by using MgSO$_4$, the solvent was removed by reducing pressure. The obtained material was subjected to column chromatography using ethyl acetate and hexane to separate and purify Compound A1. MS: [M+H]$^+$=589

(2) Preparation of Compound A2

(3) Preparation of Compound A3

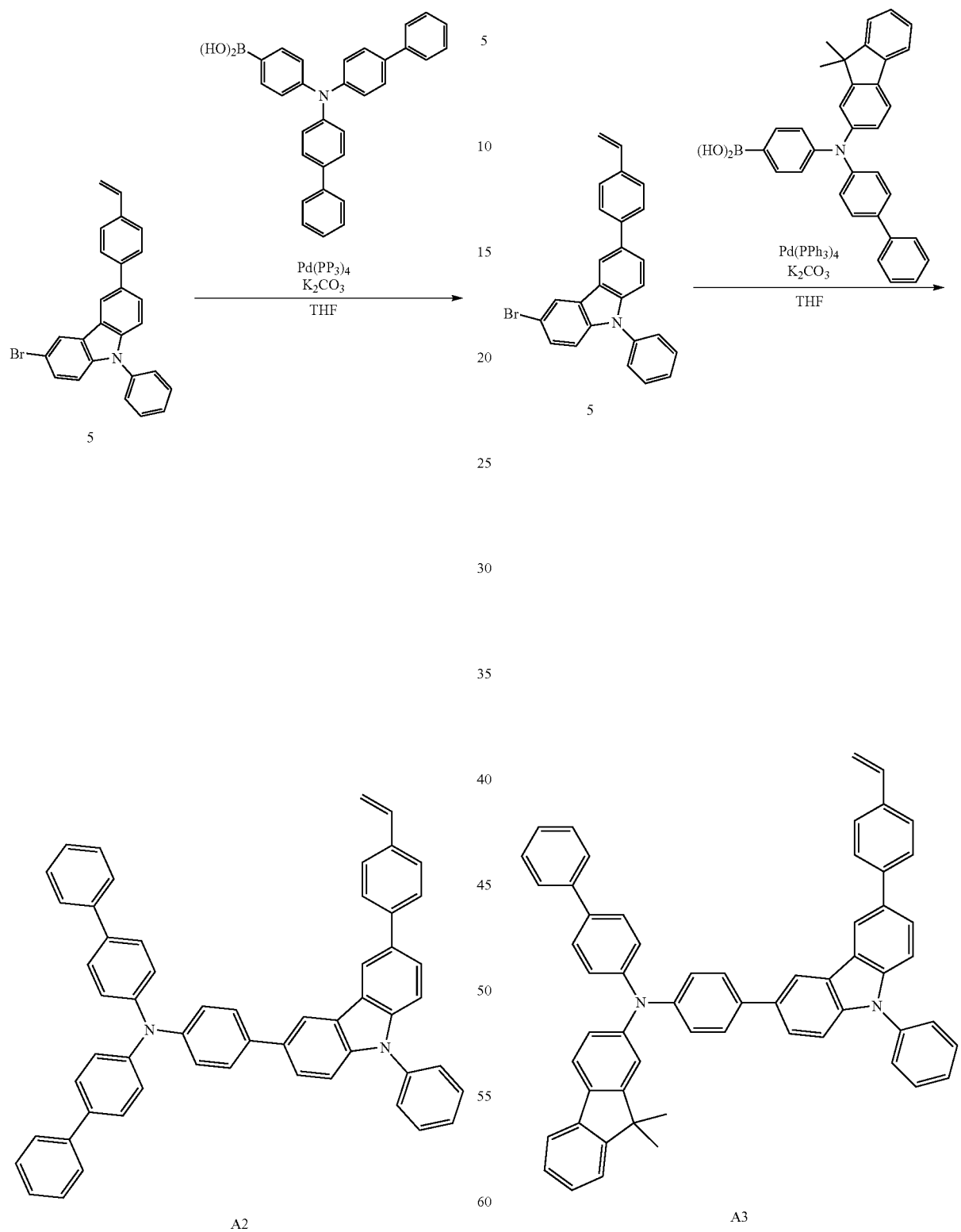

Compound A2 was prepared in the same manner as in the method of preparing Compound A1, except that 4-(dibiphenyl-4-yl amino)phenyl boronic acid was used instead of 4-(diphenylamino)phenyl boronic acid. MS: [M+H]$^+$=741

Compound A3 was prepared in the same manner as in the method of preparing Compound A1, except that 4-(biphenyl-4-yl (9,9-dimethyl-9H-fluoren-2-yl)amino)phenyl boronic acid was used instead of 4-(diphenylamino)phenyl boronic acid. MS: [M+H]$^+$=782

(4) Preparation of Compound A4

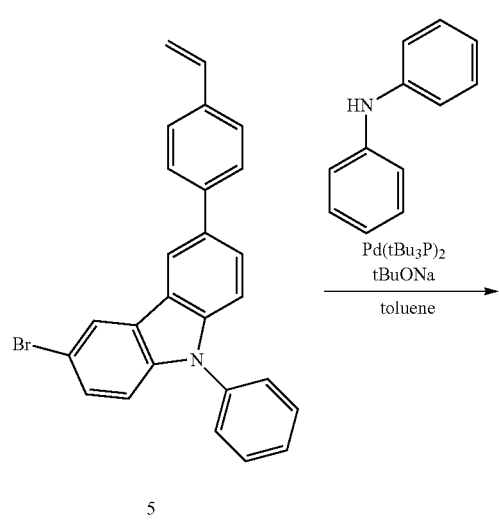

(5) Preparation of Compound A5

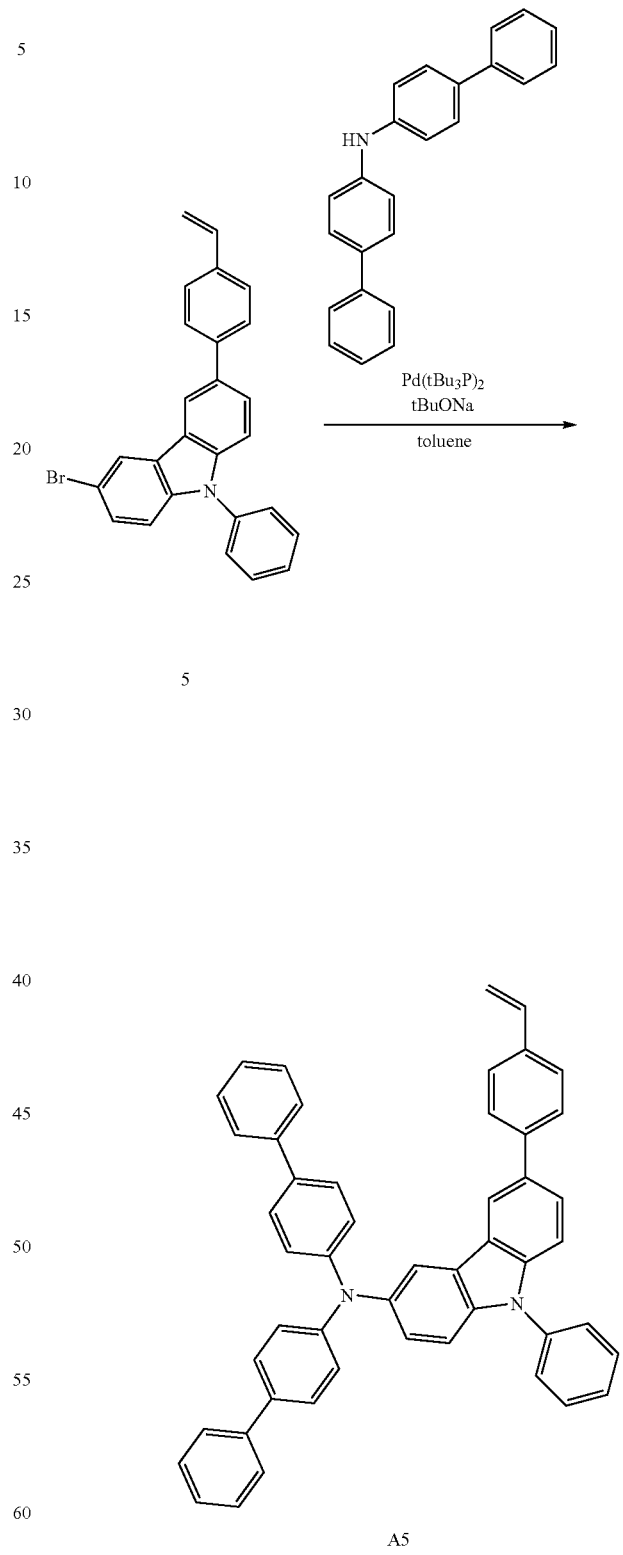

After Intermediate 5 (3.65 g, 8.615 mmol), diphenylamine (1.74 g, 10.338 mmol), Pd(tBu$_3$P)$_2$ (220 mg, 0.431 mmol), and sodium t-butoxide (2.48 g, 25.845 mmol) were dissolved in toluene (26 ml), the resulting solution was stirred at 100° C. for 15 hours. The organic layer was extracted by using ethyl acetate and water. After moisture was removed from the organic layer by using MgSO$_4$, the solvent was removed by reducing pressure. The obtained material was subjected to column chromatography using ethyl acetate and hexane to separate and purify Compound A4. [M+H]$^+$=513

Compound A5 was prepared in the same manner as in the method of preparing Compound A4, except that di(biphenyl-4-yl)amine was used instead of diphenylamine. MS: [M+H]$^+$=665

(6) Preparation of Compound A6
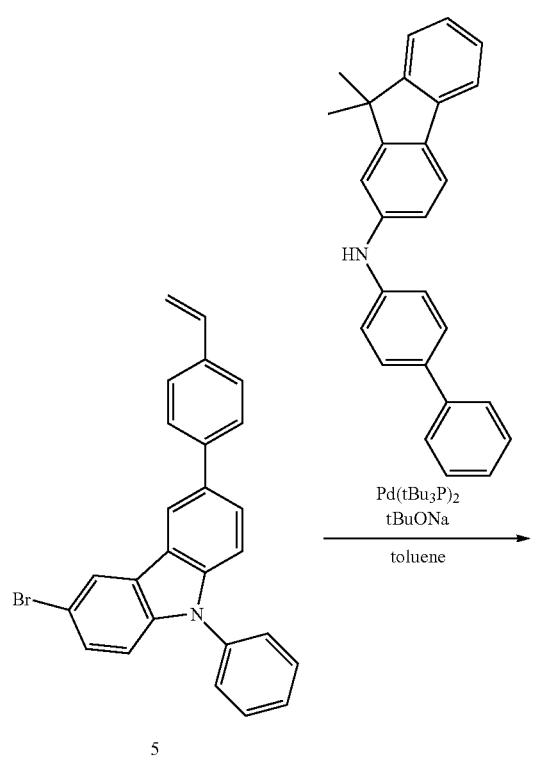
Compound A6 was prepared in the same manner as in the method of preparing Compound A4, except that N-(biphenyl-4-yl)-9,9-dimethyl-9H-fluoren-2-amine was used instead of diphenylamine. MS: $[M+H]^+=705$
(7) Preparation of Compound A7
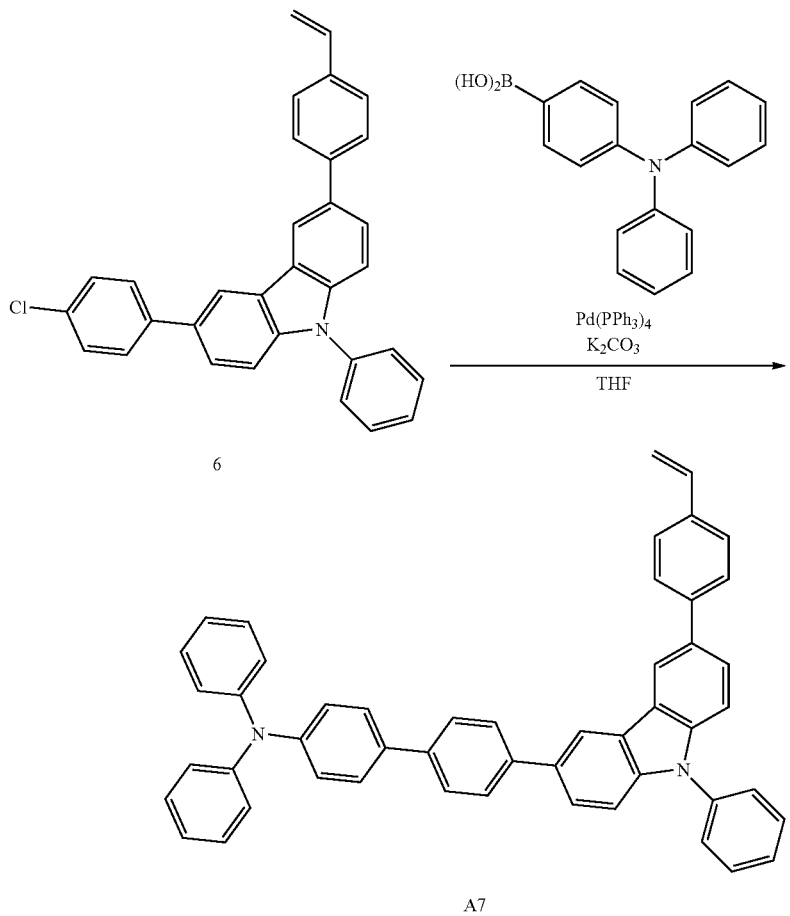

Compound A7 was prepared in the same manner as in the method of preparing Compound A1, except that Intermediate 6 was used instead of Intermediate 5. MS: [M+H]⁺=665
(8) Preparation of Compound A8
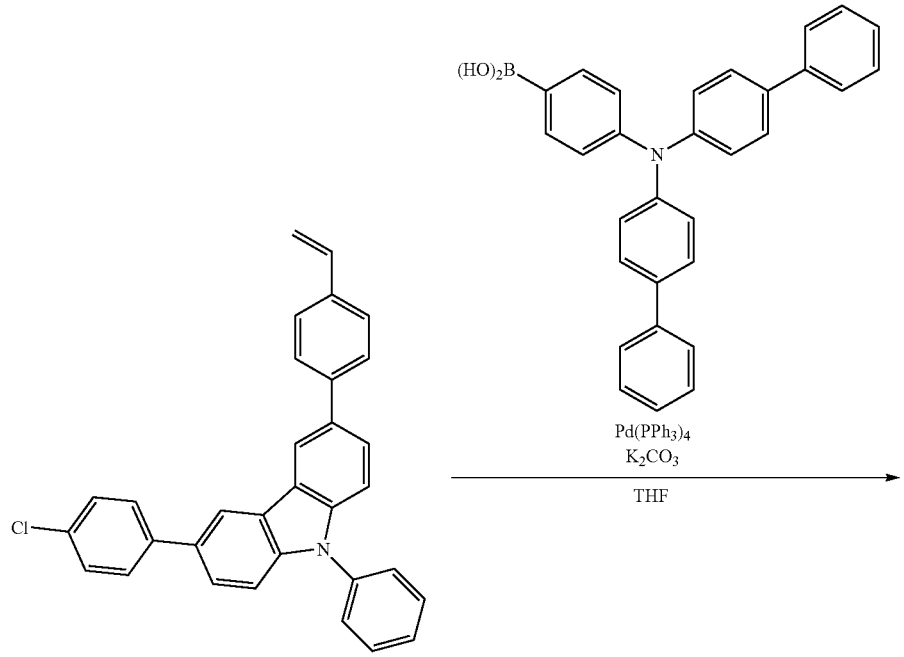
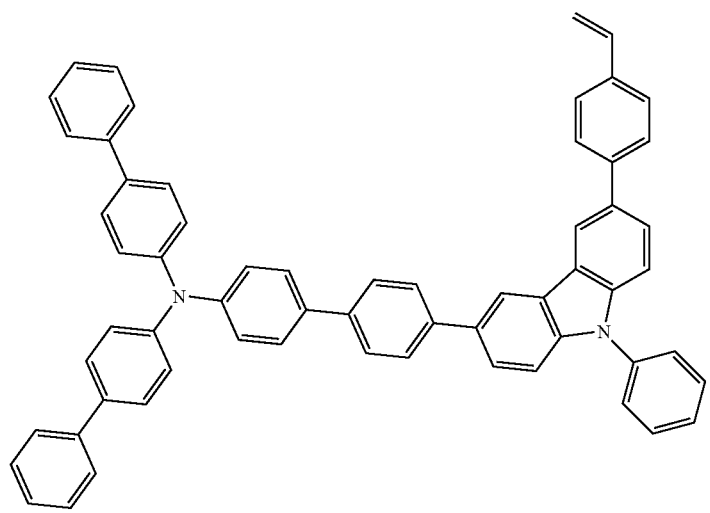
A8

Compound A8 was prepared in the same manner as in the method of preparing Compound A2, except that Intermediate 6 was used instead of Intermediate 5. MS: [M+H]$^+$=817
(9) Preparation of Compound A9
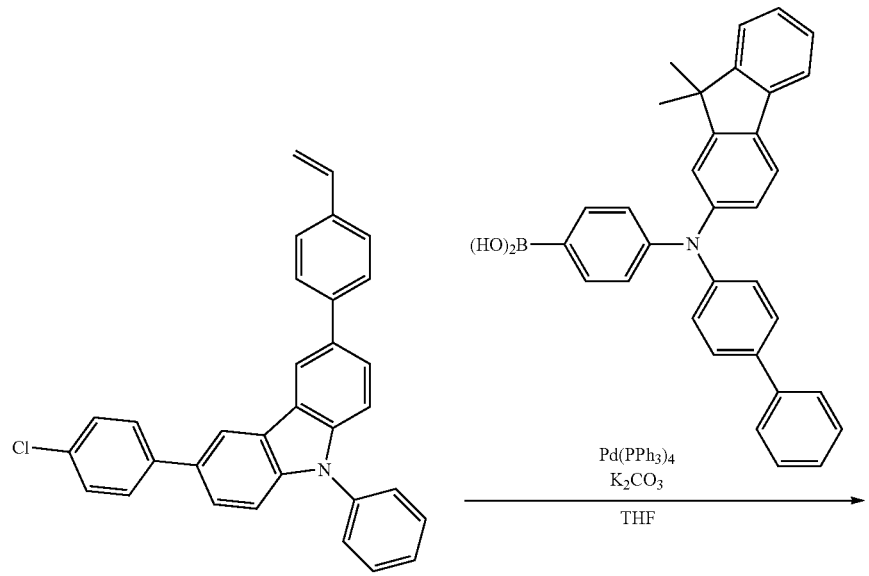
6
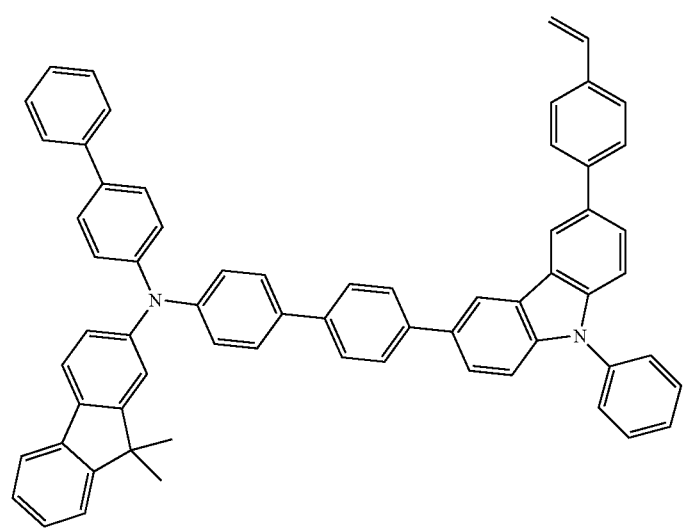
A9

Compound A9 was prepared in the same manner as in the method of preparing Compound A3, except that Intermediate 6 was used instead of Intermediate 5. MS: [M+H]⁺=857

Preparation of Compounds B2 to B4

(1) Preparation of Compound B2

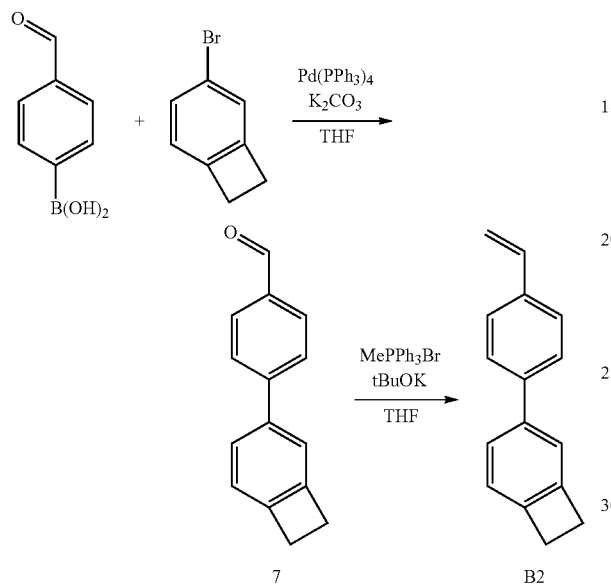

After (4-formylphenyl)boronic acid (4.91 g, 32.778 mmol), 3-bromo bicyclo[4.2.0]octa-1(6),2,4-triene (5 g, 27.315 mmol), Pd(PPh₃)₄ (1.58 g, 1.366 mmol), and K₂CO₃ (11.32 g, 81.945 mmol) were dissolved in anhydrous tetrahydrofuran (200 ml) and distilled water (100 ml), the resulting solution was stirred at 70° C. for 15 hours. The organic layer was extracted by using ethyl acetate and water. After moisture was removed from the organic layer by using MgSO₄, the solvent was removed by reducing pressure. The obtained material was subjected to column chromatography using ethyl acetate and hexane to separate and purify Intermediate 7. MS: [M+H]⁺=209

Methyltriphenylphosphonium bromide salt (13.41 g, 37.532 mmol) and potassium t-butoxide (4.21 g, 37.532 mmol) were put into anhydrous tetrahydrofuran (30 ml), and the resulting solution was stirred. Thereafter, Intermediate 7 (3.90 g, 18.766 mmol) dissolved in anhydrous tetrahydrofuran (10 ml) was slowly added dropwise thereto, and then the resulting solution was allowed to react for 4 hours. After the reaction was terminated with an aqueous sodium carbonate solution, the organic layer was extracted by using methylene chloride and water, and the residual moisture was removed by using MgSO₄. After the reaction solution was concentrated, Compound B2 (3.2 g, 84%) was prepared by column chromatography using methylene chloride and hexane. MS: [M+H]⁺=207

(2) Preparation of Compound B3

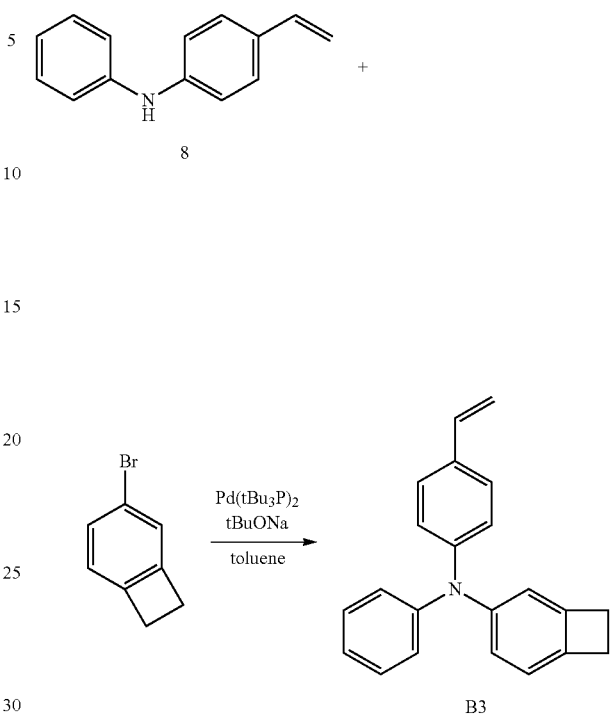

After N-phenyl-4-vinylaniline (8 g, 40.969 mmol), 3-bromo bicyclo[4.2.0]octa-1(6),2,4-triene (7.61 g, 45.588 mmol), Pd(PPh₃)₂ (635 mg, 1.243 mmol), and sodium t-butoxide (9.95 g, 103.61 mmol) were dissolved in toluene (26 ml), the resulting solution was stirred at 100° C. for 15 hours. The organic layer was extracted by using ethyl acetate and water. After moisture was removed from the organic layer by using MgSO₄, the solvent was removed by reducing pressure. The obtained material was subjected to column chromatography using ethyl acetate and hexane to separate and purify Compound B3. MS: [M+H]⁺=298

(3) Preparation of Compound B4

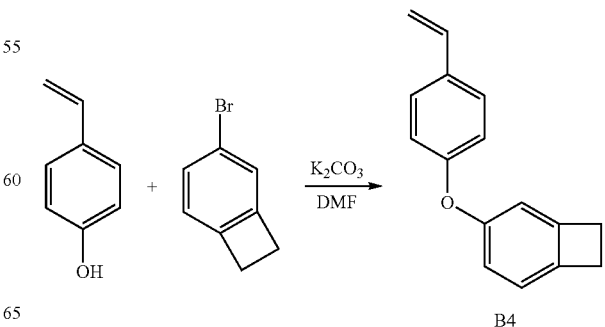

4-vinylphenol (3 g, 24.968 mmol), 3-bromo bicyclo[4.2.0]octa-1(6),2,4-triene (5.03 g, 27.464 mmol), and potassium carbonate (6.9 g, 49.936 mmol) were put into 28 ml of DMF, and the resulting solution was stirred at 140° C. for 20 hours. The organic layer was extracted by using ethyl acetate and water. After moisture was removed from the organic layer by using MgSO$_4$, the solvent was removed by reducing pressure. The obtained material was subjected to column chromatography using ethyl acetate and hexane to separate and purify Compound B4 (2.1 g). MS: [M+H]$^+$=222

Preparation Example 4. Preparation of Polymers C1 to C4

(1) Preparation of Polymer C1

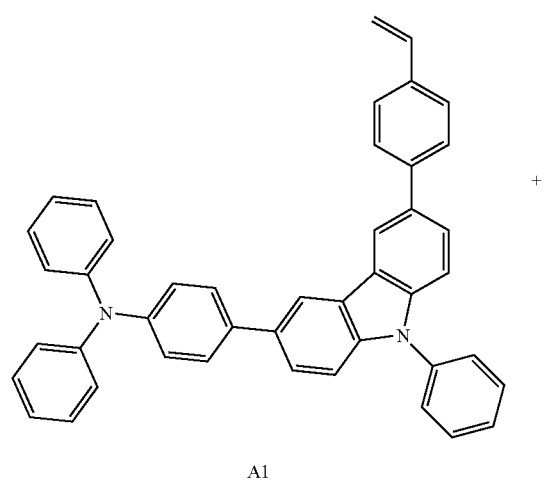

A1

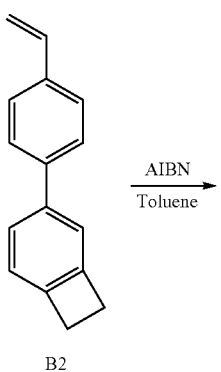

B2

-continued

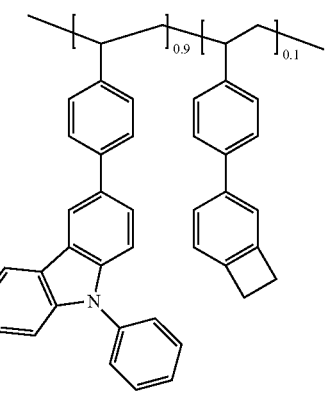

C1

Compound A1 (500 mg), Compound B2 (94 mg), and AIBN (1.2 mg) were put into toluene, and the resulting solution was allowed to react at 100° C. under nitrogen substitution for 14 hours. The product was precipitate in ethyl acetate to prepare Polymer C1. Mn=18,900 Mw=30,600

(2) Preparation of Polymer C2

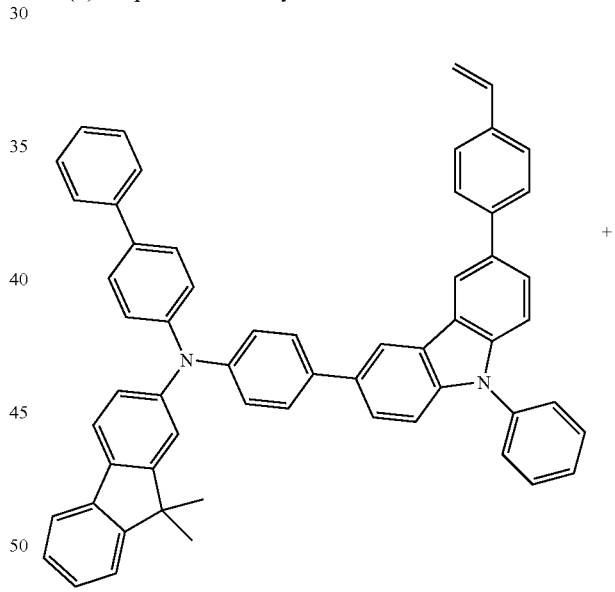

A3

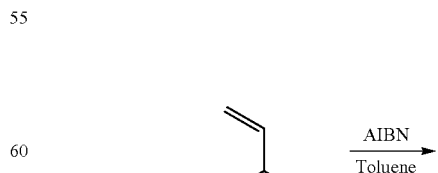

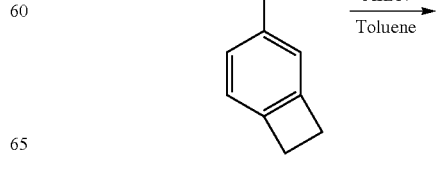

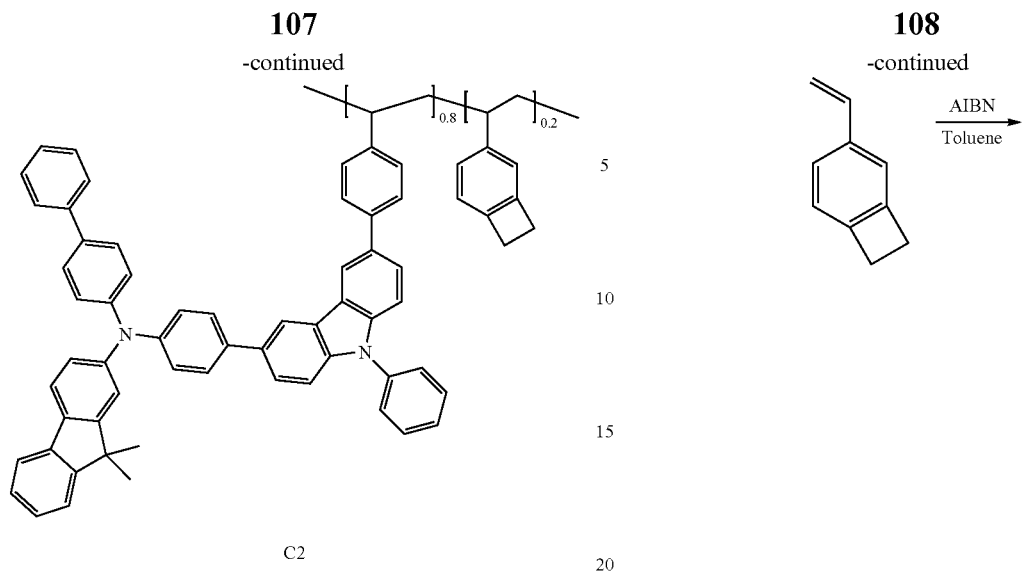

C2

Polymer C2 was prepared in the same manner as in the method of preparing Polymer C1, except that Compound A3 and 4-vinyl-1,2-dihydrobutabenzene were used instead of Compound A1 and Compound B2. Mn=25,700 Mw=47,900

(3) Preparation of Polymer C3

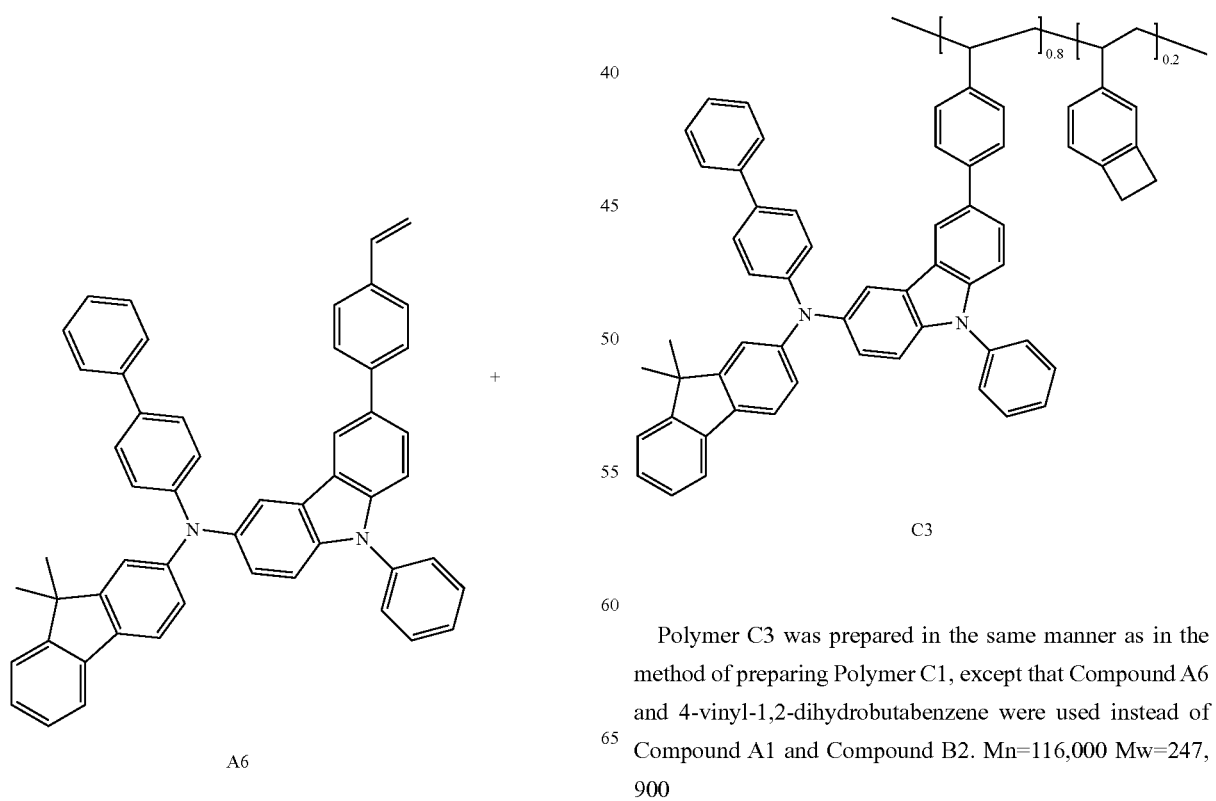

C3

Polymer C3 was prepared in the same manner as in the method of preparing Polymer C1, except that Compound A6 and 4-vinyl-1,2-dihydrobutabenzene were used instead of Compound A1 and Compound B2. Mn=116,000 Mw=247,900

(4) Preparation of Polymer C4

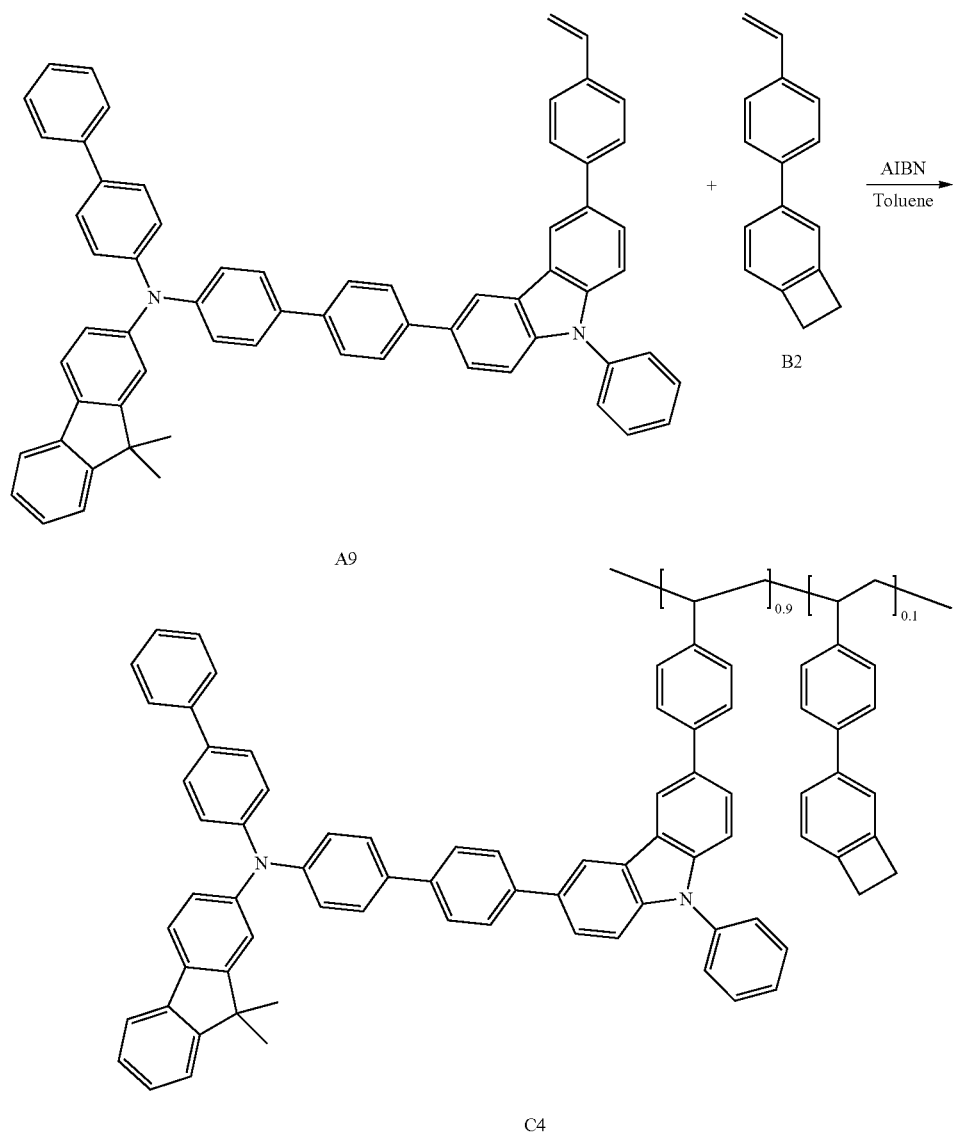

Polymer C4 was prepared in the same manner as in the method of preparing Polymer C1, except that Compound A9 was used instead of Compound A1. Mn=15,900 Mw=25,900

Examples

[Preparation of ITO Substrate]

A glass substrate thinly coated with indium tin oxide (ITO) to have a thickness of 1,500 Å was put into distilled water in which a detergent was dissolved, and ultrasonically washed. In this case, a product manufactured by Fischer Co. was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes.

After the washing with distilled water was completed, ultrasonic washing was conducted using isopropyl alcohol and acetone solvents, the substrate was dried, and then the substrate was cleaned for 5 minutes, and then transported to a glove box.

Device Example 1

The ITO surface of a transparent ITO electrode was spin-coated (4,000 rpm) with 2 wt % of a toluene ink of Polymer C1:the following p-dopant (the following Formula M) (weight ratio of 8:2) and the transparent ITO electrode was heat-treated (cured) at 200° C. for 30 minutes, thereby forming a hole injection layer having a thickness of 40 nm. Thereafter, the transparent ITO electrode was transported to a vacuum deposition machine, and then a hole transport layer was formed to have a thickness of 20 nm by vacuum-depositing the following Compound G onto the hole injection layer.

Subsequently, the following Compound H and Compound I (weight ratio of 9:1) were vacuum-deposited to have a thickness of 20 nm on the hole transport layer, thereby forming a light emitting layer. Compound J was vacuum-deposited to have a thickness of 35 nm on the light emitting layer, thereby forming a layer which simultaneously injects and transports electrons. LiF and aluminum were sequentially deposited on the layer, which simultaneously injects and transports electrons, to have a thickness of 1 nm and 100 nm, respectively, thereby forming a cathode.

In the aforementioned procedure, the deposition rate of the organic material was maintained at 0.4 to 0.7 Å/sec, the deposition rates of lithium fluoride and aluminum of the cathode were maintained at 0.3 Å/sec and at 2 Å/sec, respectively, and the degree of vacuum during the deposition was maintained at $2 \times 10^{-7}$ to $5 \times 10^{-6}$ torr, thereby manufacturing an organic light emitting device.

[Compound G]

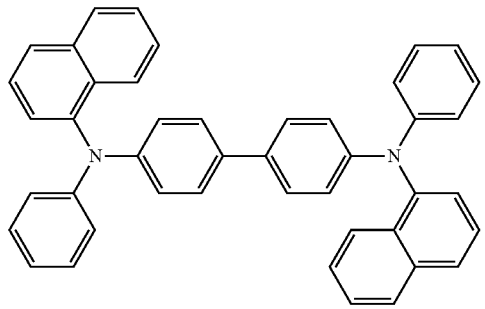

[Compound H]

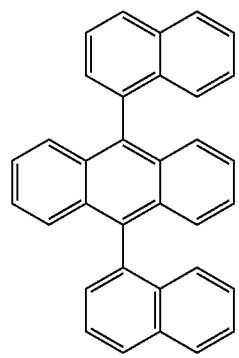

[Compound I]

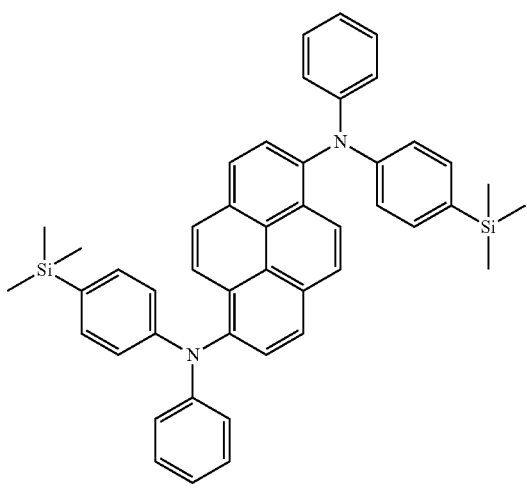

[Compound J]

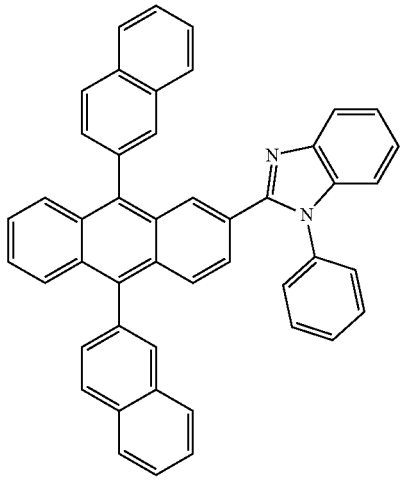

[Formula M]

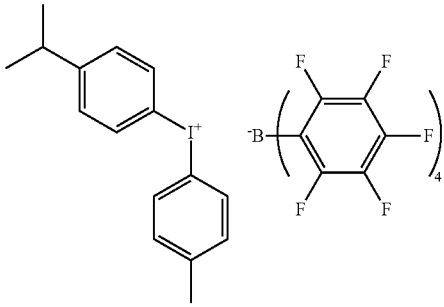

Device Example 2

An organic light emitting device was manufactured in the same manner as in the procedure in Device Example 1, except that 2 wt % of a toluene ink of Polymer C2:the p-dopant (weight ratio of 8:2) was used instead of 2 wt % of the toluene ink of Polymer C1:the p-dopant (weight ratio of 8:2) during the film-formation of the hole injection layer in the manufacturing procedure in Device Example 1.

Device Example 3

An organic light emitting device was manufactured in the same manner as in the procedure in Device Example 1, except that 2 wt % of a toluene ink of Polymer C3:the p-dopant (weight ratio of 8:2) was used instead of 2 wt % of the toluene ink of Polymer C1:the p-dopant (weight ratio of 8:2) during the film-formation of the hole injection layer in the manufacturing procedure in Device Example 1.

Device Example 4

An organic light emitting device was manufactured in the same manner as in the procedure in Device Example 1, except that 2 wt % of a toluene ink of Polymer C4:the p-dopant (weight ratio of 8:2) was used instead of 2 wt % of the toluene ink of Polymer C1:the p-dopant (weight ratio of 8:2) during the film-formation of the hole injection layer in the manufacturing procedure in Device Example 1.

Comparative Device Example 1

An organic light emitting device was manufactured in the same manner as in the procedure in Device Example 1, except that 2 wt % of a toluene ink of the following Polymer F:the p-dopant (weight ratio of 8:2) was used instead of 2 wt % of the toluene ink of Polymer C1:the p-dopant (weight ratio of 8:2) during the film-formation of the hole injection layer in the manufacturing procedure in Device Example 1.

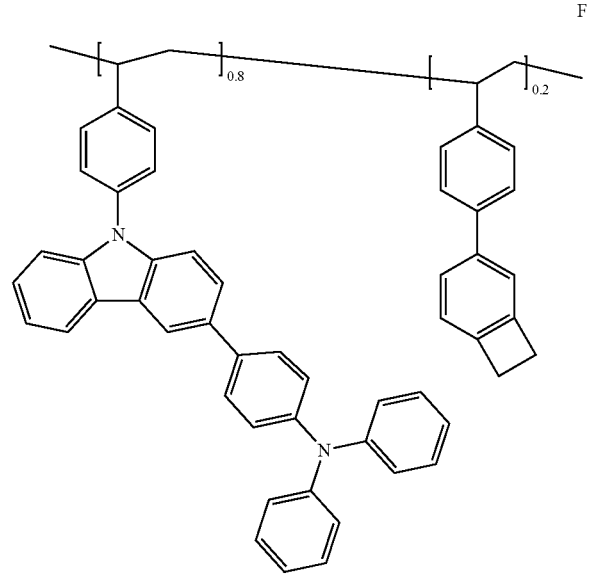

Comparative Device Example 2

An organic light emitting device was manufactured in the same manner as in the procedure in Device Example 1, except that 2 wt % of a toluene ink of the following Polymer Z:the p-dopant (weight ratio of 8:2) was used instead of 2 wt % of the toluene ink of Polymer C1:the p-dopant (weight ratio of 8:2) during the film-formation of the hole injection layer in the manufacturing procedure in Device Example 1.

are shown in the following [Table 1]. T95 means time taken for the luminance to decrease to 95% when the initial luminance at the light density of 20 mA/cm² is set to 100%. Further, EQE is a value obtained by measuring a spectral radiation luminance spectrum when a voltage is applied to the devices such that the current density becomes 10 mA/cm², by using spectroradiometer CS-1000 (manufactured by Konica Minolta Optics, Inc.), and the external quantum efficiency was calculated from the obtained spectral radiation luminance spectrum.

TABLE 1

|  | Voltage (V) (@10 mA/cm²) | Current density (mA/cm²) | EQE (%) (@10 mA/cm²) | Service life (T95, h) (@20mA/cm²) |
| --- | --- | --- | --- | --- |
| Device Example 1 | 5.81 | 10 | 4.1 | 29 |
| Device Example 2 | 5.27 | 10 | 5.0 | 50 |
| Device Example 3 | 5.31 | 10 | 4.0 | 46 |
| Device Example 4 | 5.01 | 10 | 4.4 | 45 |
| Comparative Device Example 1 | 7.23 | 10 | 2.1 | 20 |
| Comparative Device Example 2 | 6.75 | 10 | 3.5 | 22 |

As shown in Table 1, it can be seen that the case where the coating composition using the polymer including the first unit represented by Formula 1 and the second unit represented by Formula 2 according to the present specification was used as a material for a hole injection layer exhibits an excellent effect in terms of both efficiency and service life, as compared to Comparative Device Examples 1 and 2.

Accordingly, it can be seen that since the coating composition using the polymer including the first unit represented by Formula 1 and the second unit represented by

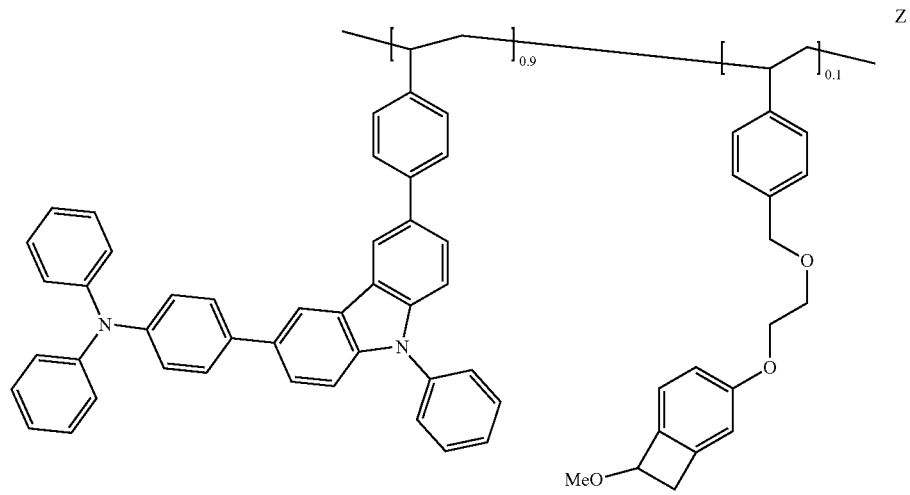

When an electric current was applied to the organic light emitting devices manufactured in Device Examples 1 to 4 and Comparative Device Examples 1 and 2, the voltages, efficiencies, and service lives were measured, and the results Formula 2 according to the present specification is excellent in uniformity of the coating layer and stability of the film, it is possible to improve the performance of the organic light emitting device by using the coating composition.

Although the preferred exemplary embodiments of the present invention have been described above, the present invention is not limited thereto, and various modifications can be made and carried out within the scopes of the claims and the detailed description of the invention, and also fall within the scope of the invention.

The invention claimed is:
1. A polymer comprising:
a first unit represented by the following Formula 1; and
a second unit represented by the following Formula 2:

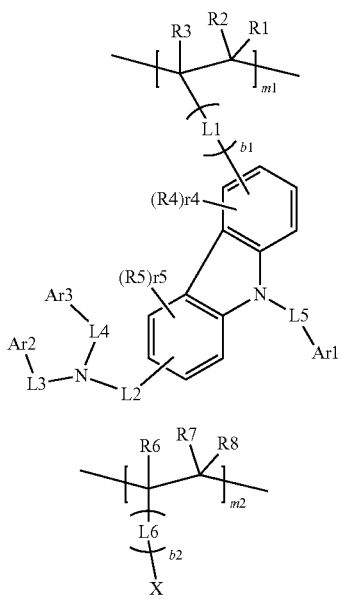

[Formula 1]

[Formula 2]

in Formulae 1 and 2,
L1 to L6 are the same as or different from each other, and are each independently a direct bond; —O—; a substituted or unsubstituted alkylene group; a substituted or unsubstituted arylene group; a substituted or unsubstituted divalent amine group; or a substituted or unsubstituted heteroarylene group,
b1 and b2 are the same as or different from each other, and each independently an integer from 1 to 10,
when b1 and b2 are each 2 or more, two or more L1's and L6's are each the same as or different from each other,
Ar1 to Ar3 are the same as or different from each other, and are each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group,
R1 to R8 are the same as or different from each other, and are each independently hydrogen; deuterium; a halogen group; a hydroxyl group; a nitrile group; a substituted or unsubstituted alkyl group; a substituted or unsubstituted cycloalkyl group; a substituted or unsubstituted aryl group; or a substituted or unsubstituted heterocyclic group,
r4 and r5 are the same as or different from each other, and each independently an integer from 1 to 3,
when r4 and r5 are each 2 or more, two or more R4's and R5's are each the same as or different from each other, m1 is a mole fraction and $0<m1<1$,
m2 is a mole fraction and $0<m2<1$,
$m1+m2 \leq 1$,
X is any one selected from the following structures,

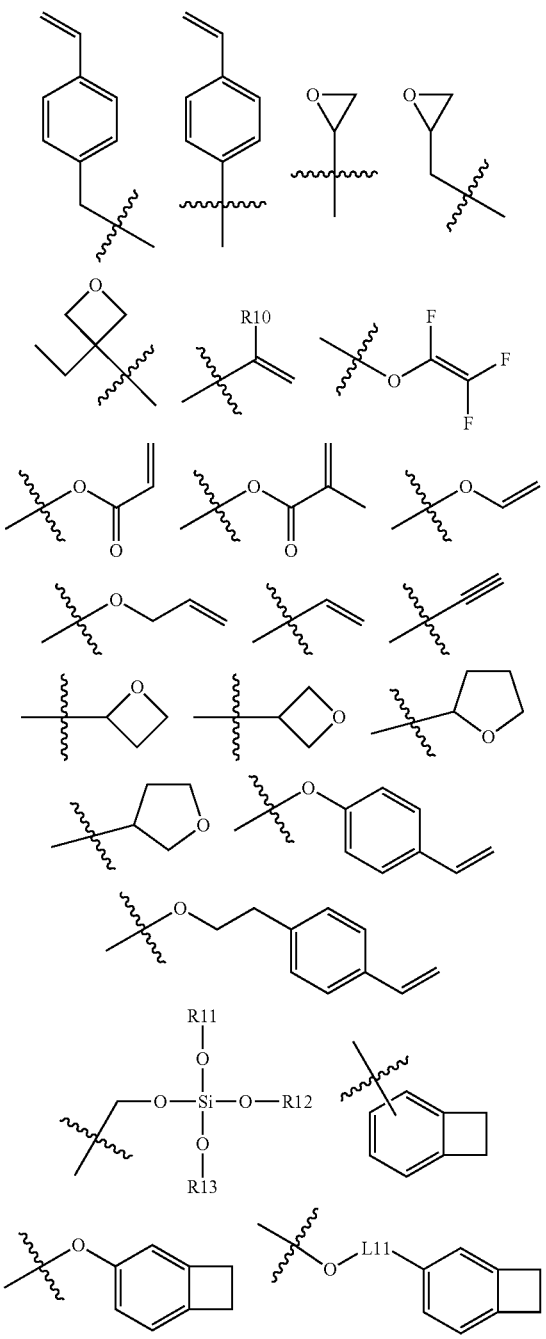

in the structures,
L11 is a substituted or unsubstituted alkylene group; or a substituted or unsubstituted arylene group,
R10 to R13 are the same as or different from each other, and are each independently hydrogen; or a substituted or unsubstituted alkyl group having 1 to 6 carbon atoms, and when X is

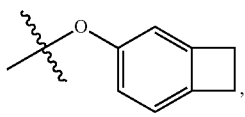 [SMILES: *Oc1ccc2c(c1)CC2]

b2 is an integer from 1 to 3.

2. The polymer of claim 1, wherein Formula 1 is represented by the following Formula 103:

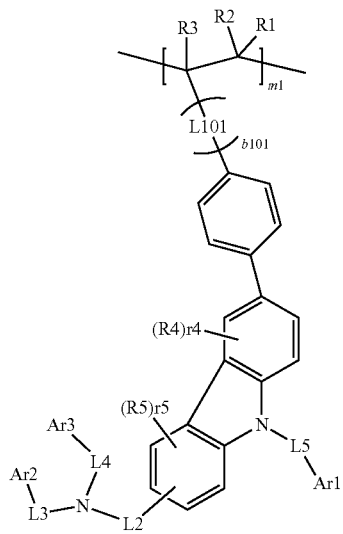

[Formula 103]

in Formula 103,
definitions of L2 to L5, Ar1 to Ar3, R1 to R5, r4, r5, and m1 are the same as those defined in Formula 1,
L101 is a direct bond; —O—; a substituted or unsubstituted alkylene group; a substituted or unsubstituted arylene group; a substituted or unsubstituted divalent amine group; or a substituted or unsubstituted heteroarylene group,
b101 is an integer from 1 to 9, and
when b101 is 2 or more, two or more L101's are each the same as or different from each other.

3. The polymer of claim 1, wherein Ar1 is an aryl group having 6 to 30 carbon atoms which is unsubstituted or substituted with one or more substituents selected from the group consisting of an alkyl group; an alkoxy group; an aryloxy group; an aryl group; and a heterocyclic group, or a substituent formed by linking two or more substituents selected from the above group.

4. The polymer of claim 1, wherein Ar2 and Ar3 are the same as or different from each other, and are each independently a substituted or unsubstituted phenyl group, a substituted or unsubstituted biphenyl group, a substituted or unsubstituted terphenyl group, a substituted or unsubstituted naphthyl group, a substituted or unsubstituted phenanthryl group, or a substituted or unsubstituted fluorenyl group.

5. The polymer of claim 1, wherein R1 to R8 are each hydrogen.

6. The polymer of claim 1, wherein the first unit represented by Formula 1 is represented by any one of the following structures:

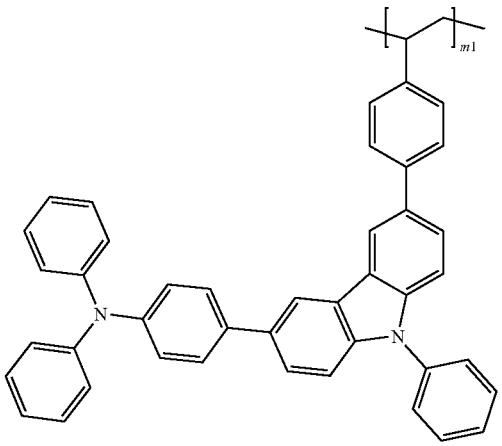

P1

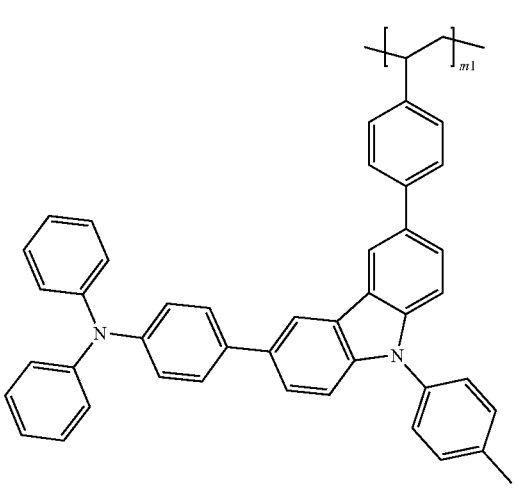

P2

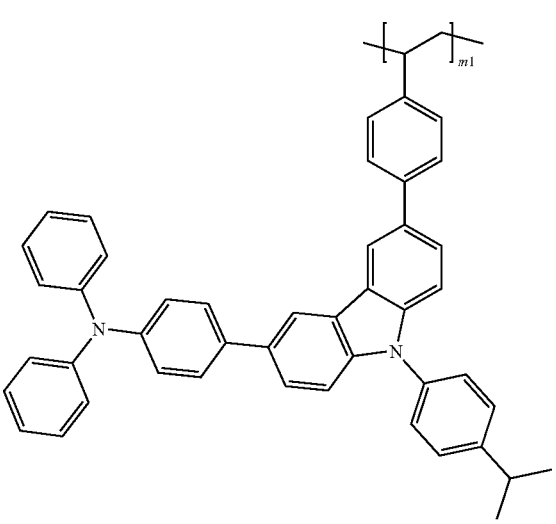

P3

P4
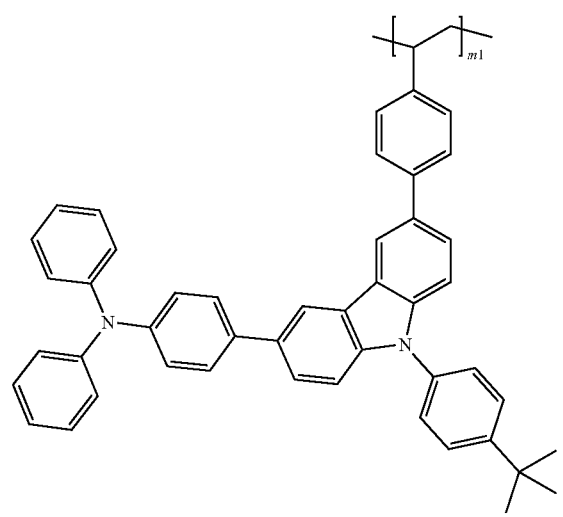
P5
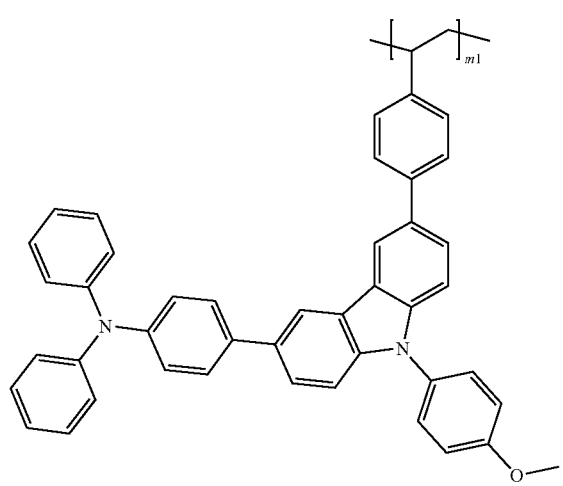
P6
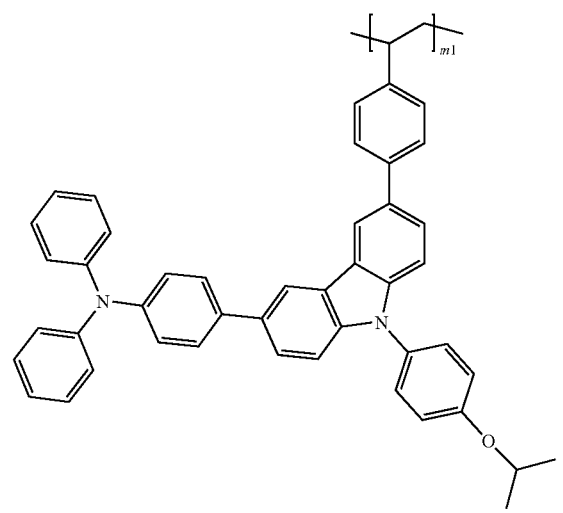
P7
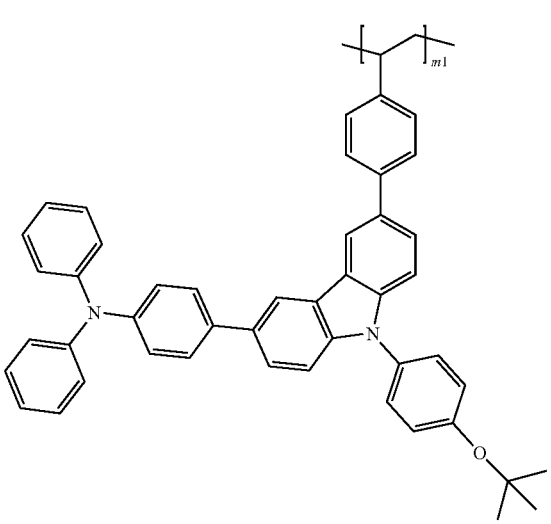
P8
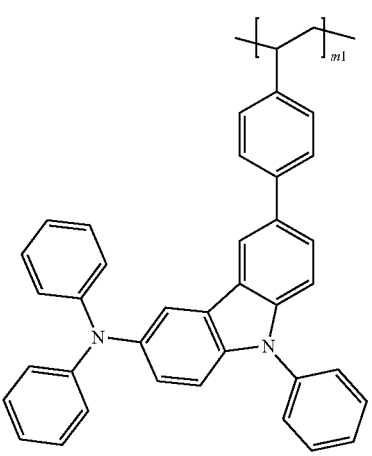
P9
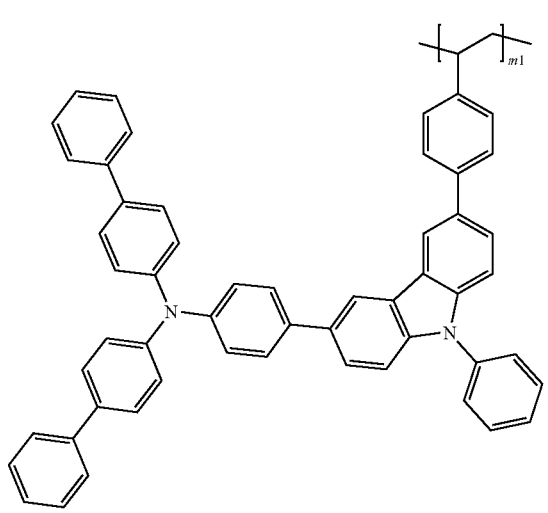

-continued
P10
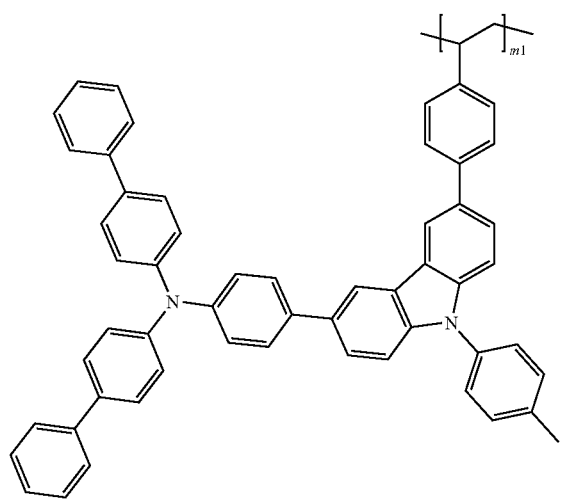
P11
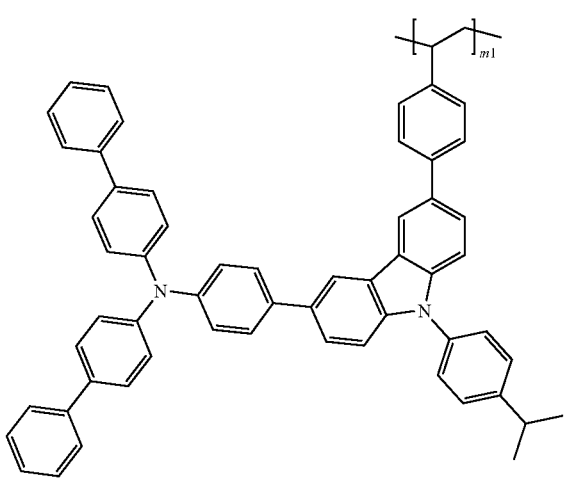
P12
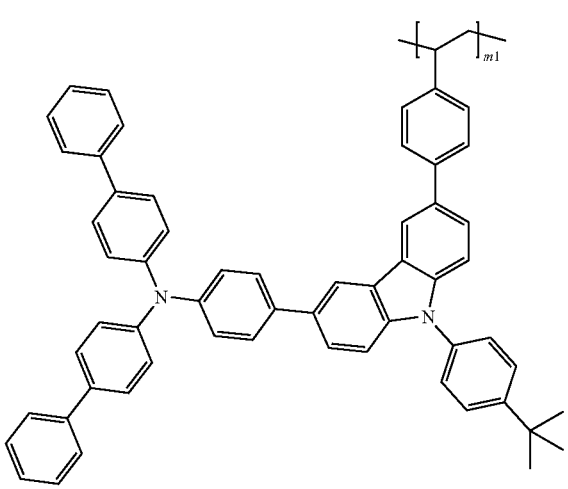
-continued
P13
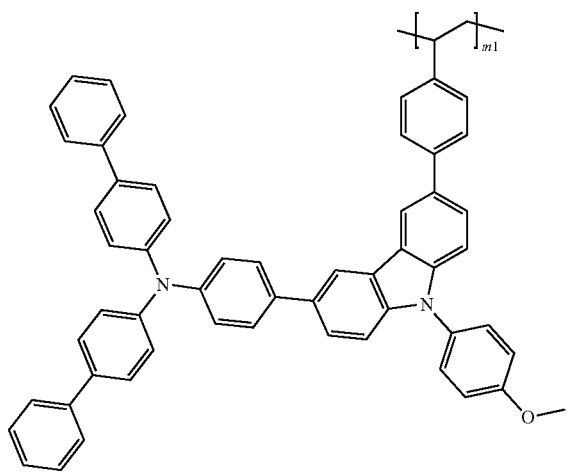
P14
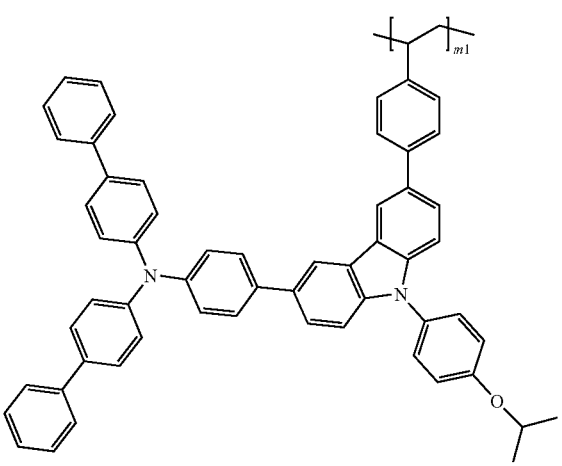
P15
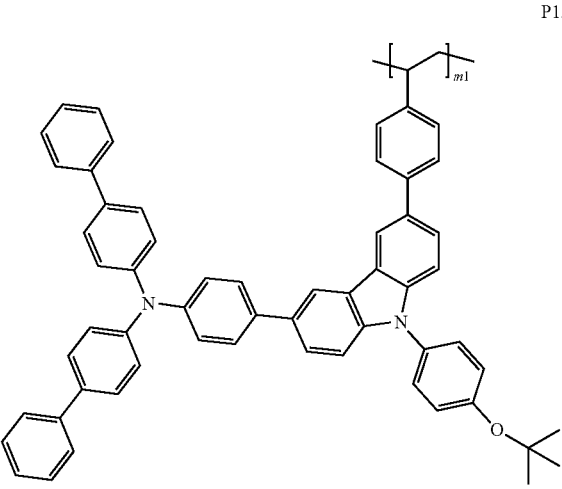

-continued
P16
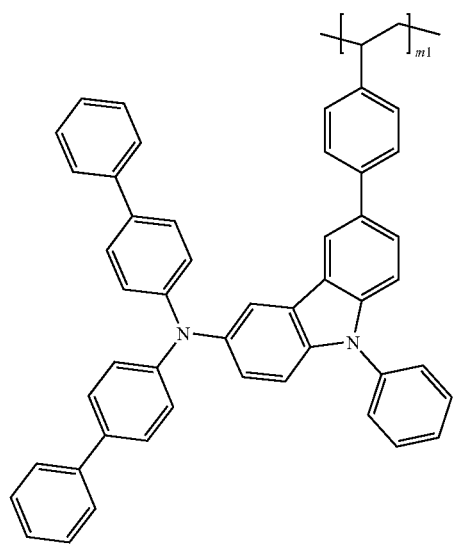
P17
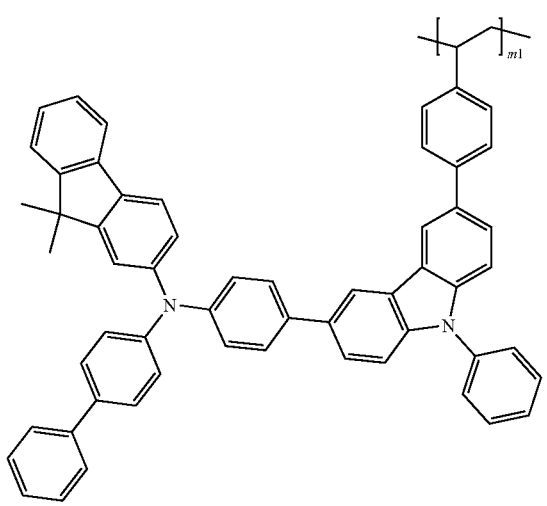
P18
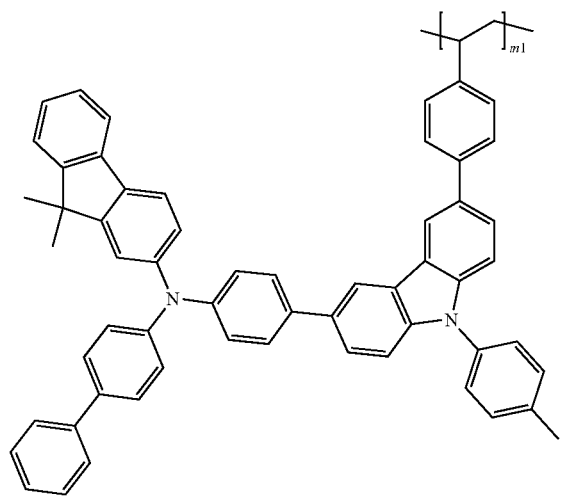
-continued
P19
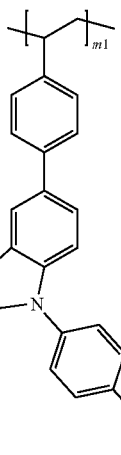
P20
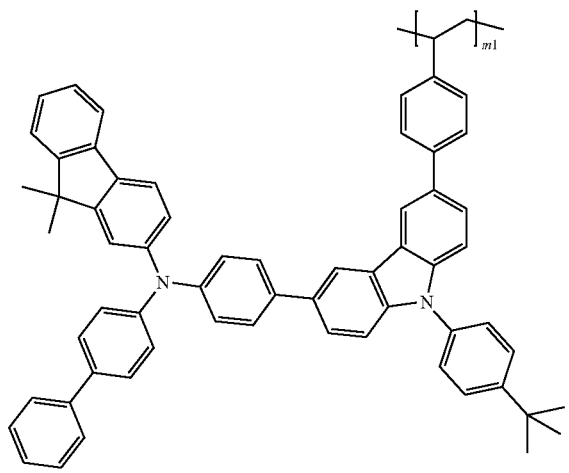
P21
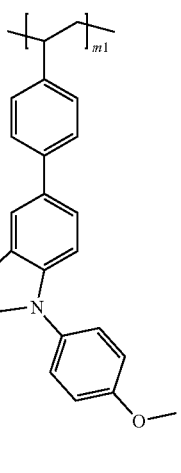

P22
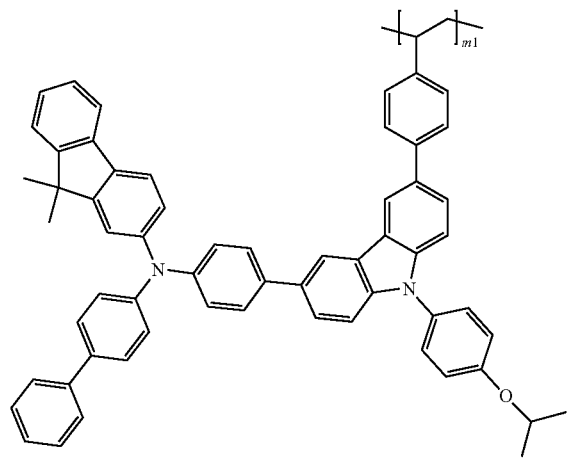
P26
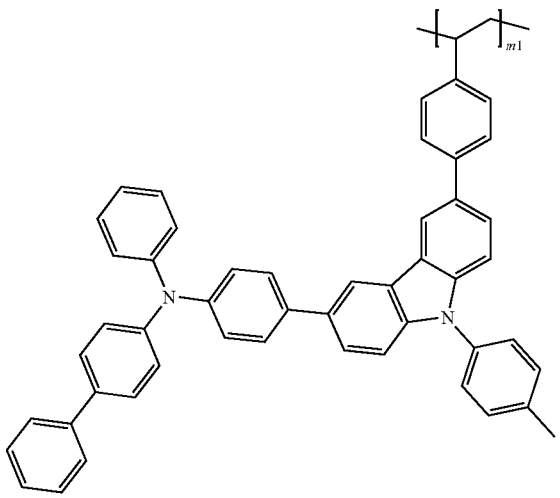
P23
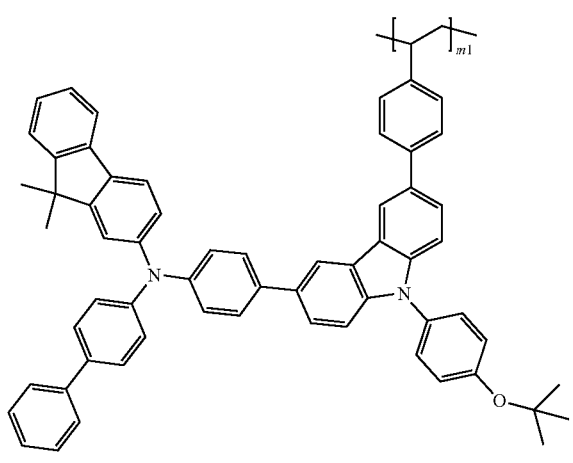
P27
P25
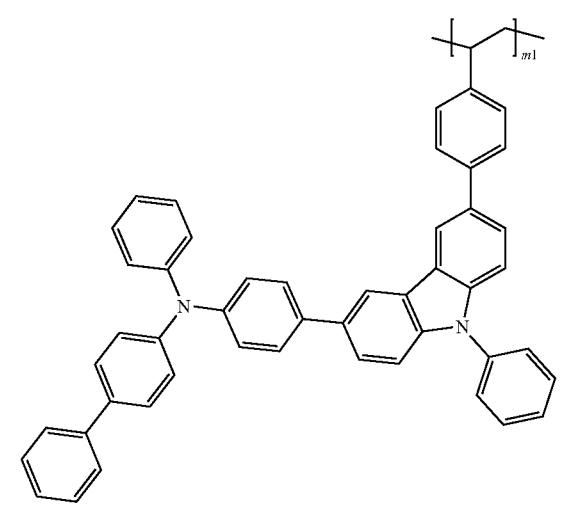
P28
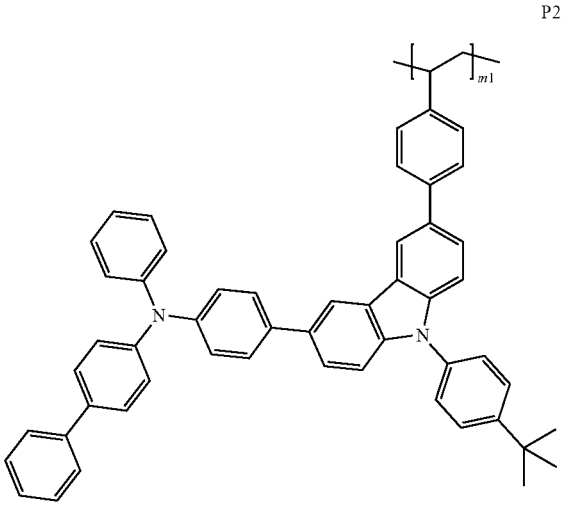

P29
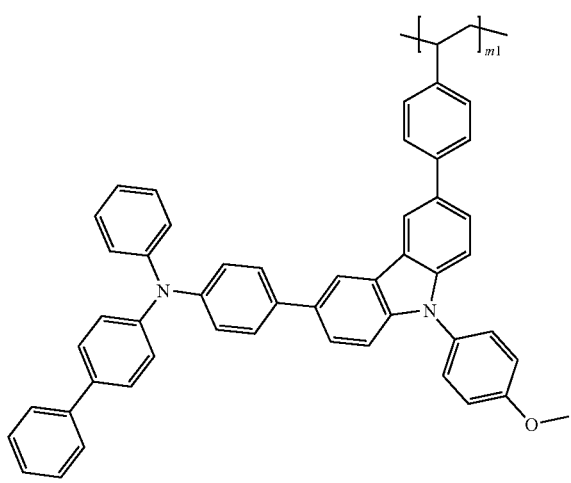
P30
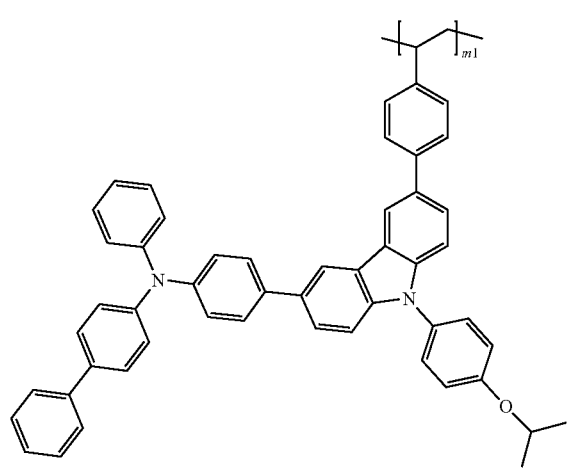
P31
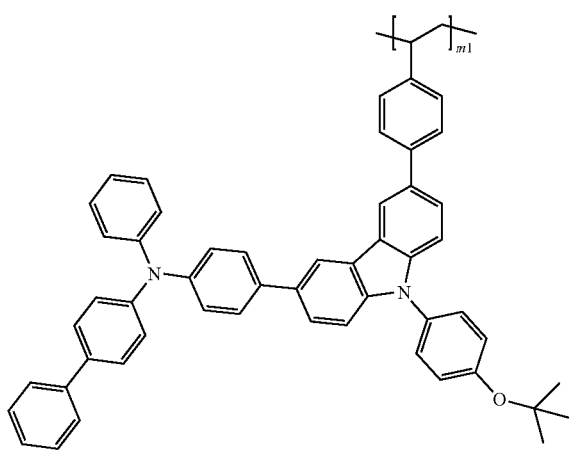
P33
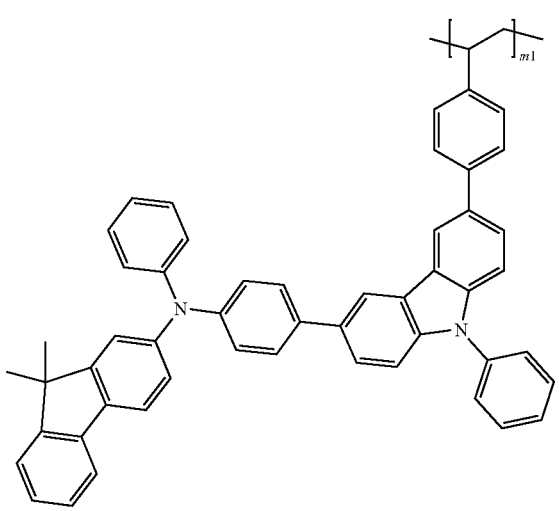
P34
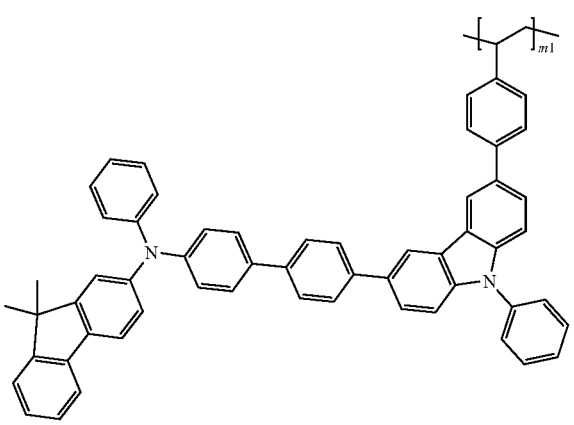
P35
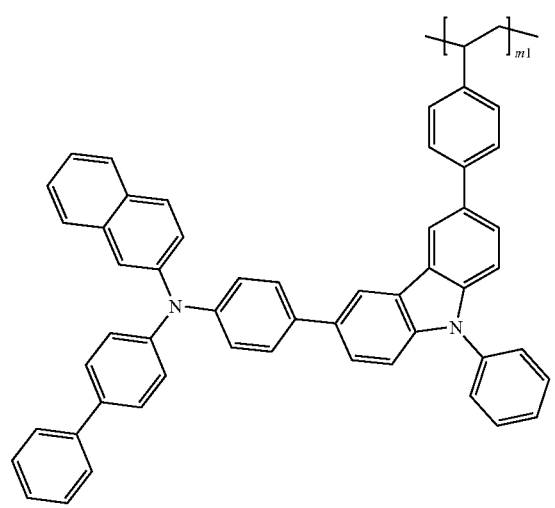

P36 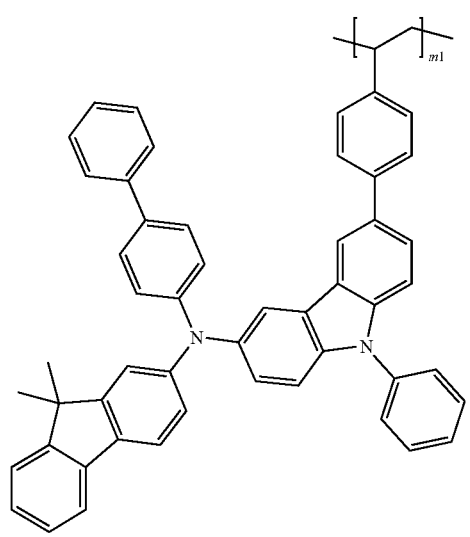
P37 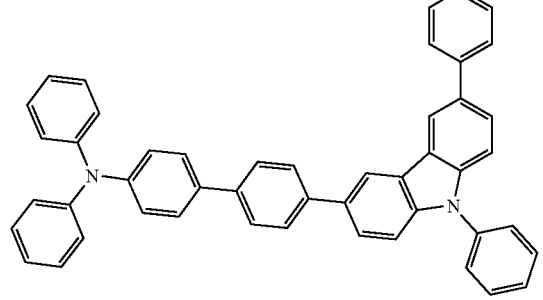
P38 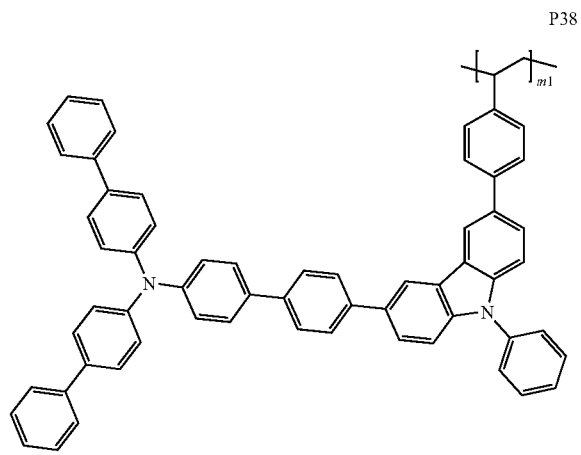
P39 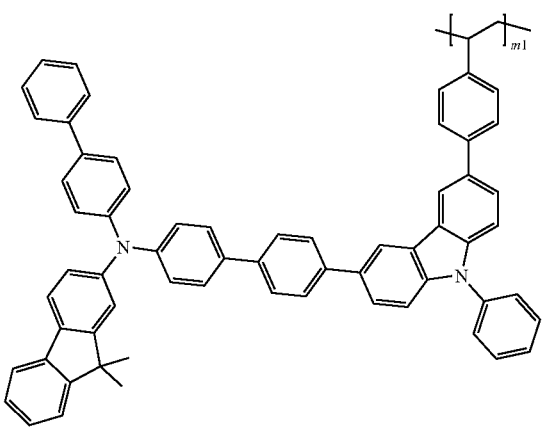
P40 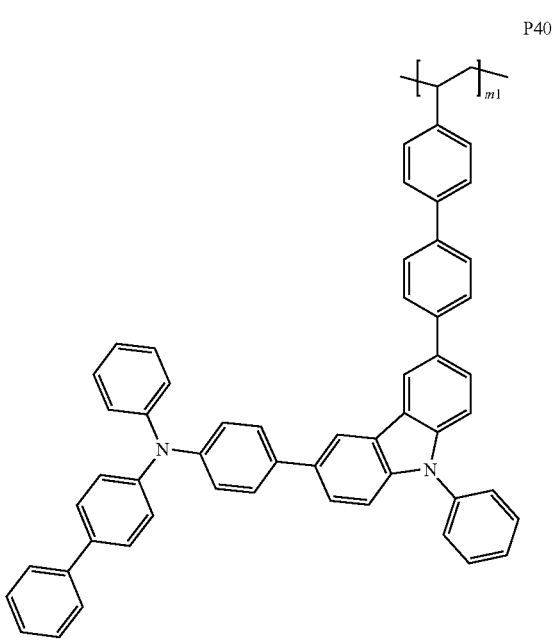
in the structures,
m1 is a mole fraction and 0<m1<1.
7. The polymer of claim 1, wherein the second unit represented by Formula 2 is represented by any one of the following structures:
Q1 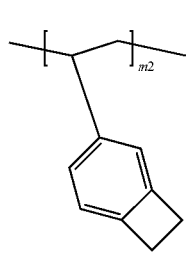

131
-continued
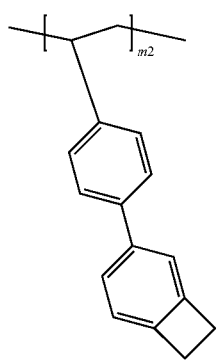
Q2
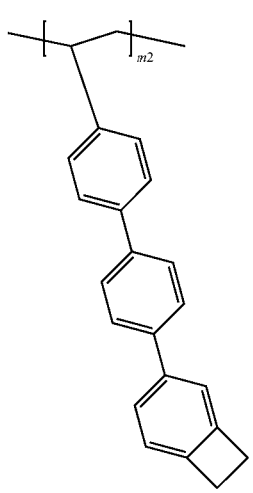
Q3
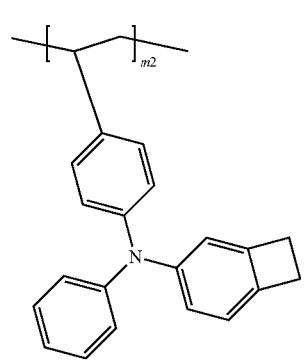
Q4
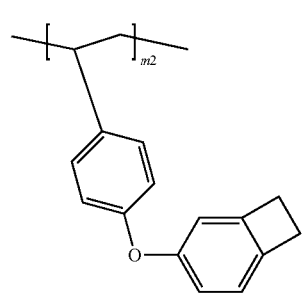
Q5
132
-continued
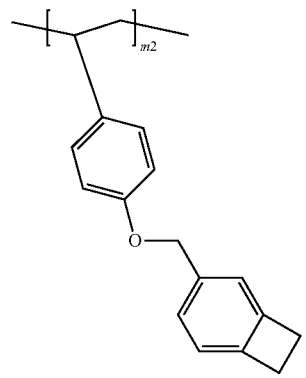
Q6
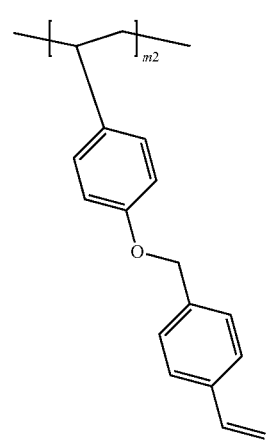
Q7
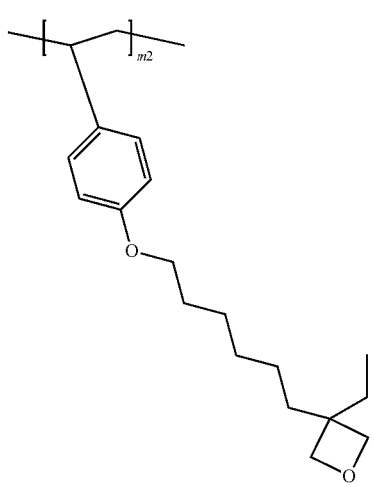
Q8
in the structures,
m2 is a mole fraction and 0<m2<1.
8. The polymer of claim 1, wherein the polymer comprising the first unit represented by Formula 1 and the second unit represented by Formula 2 is any one selected from the following structures:

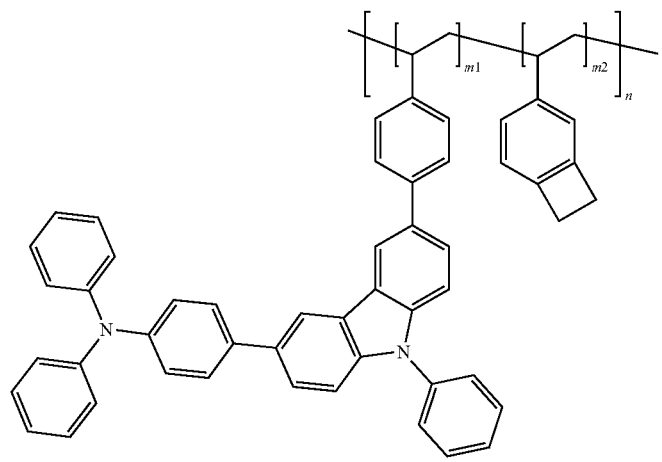
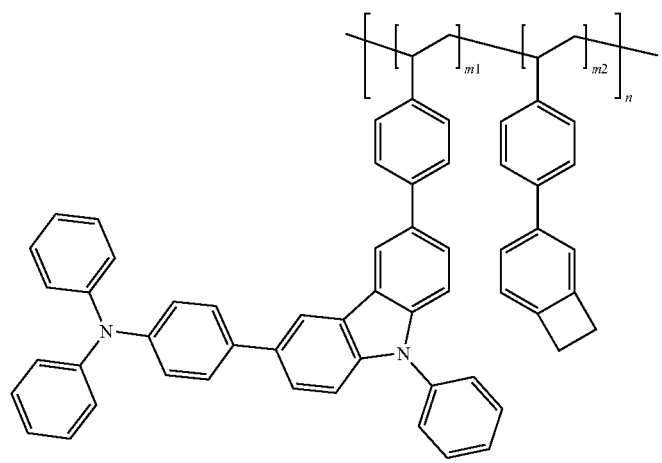
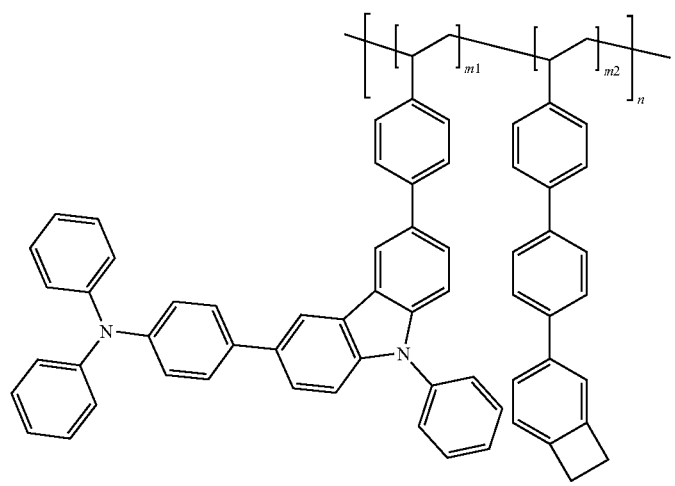

-continued
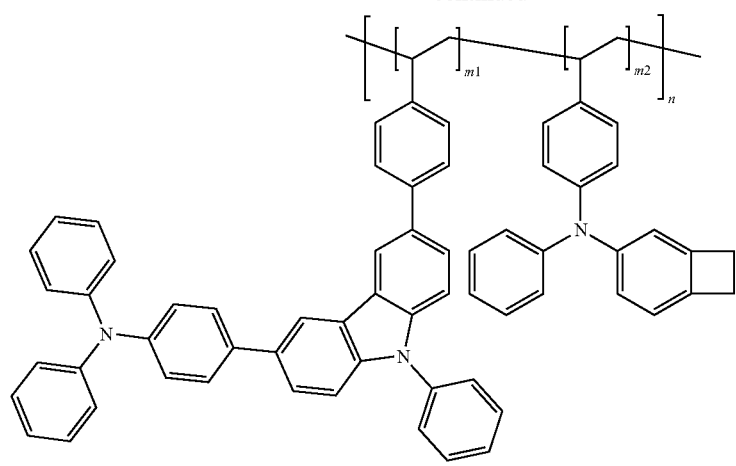
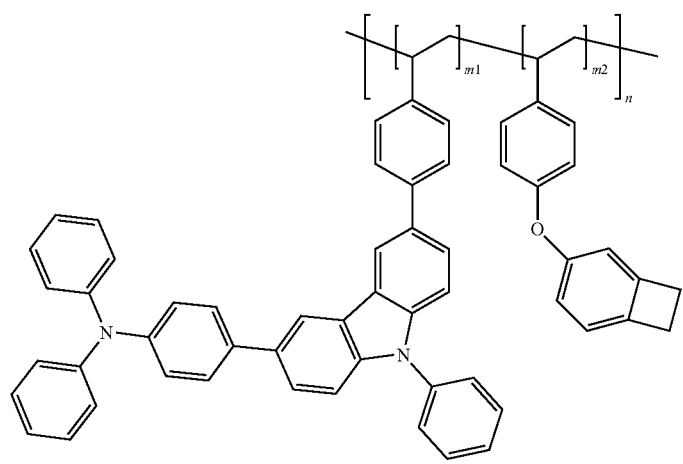
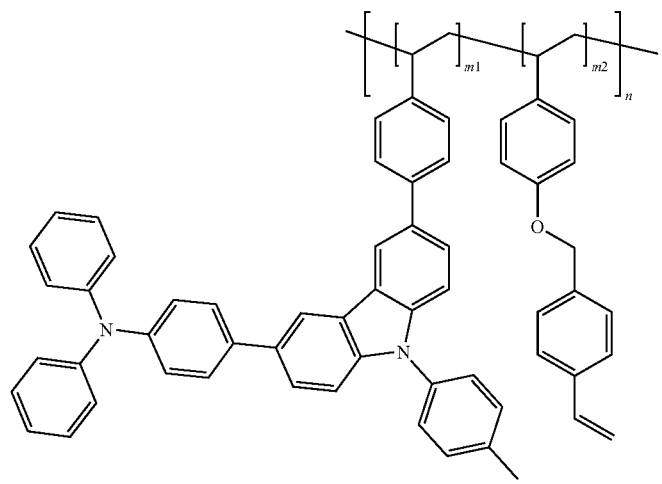

-continued
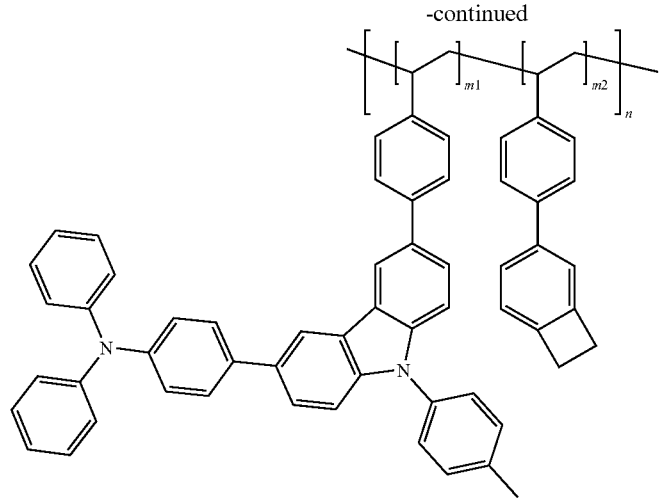
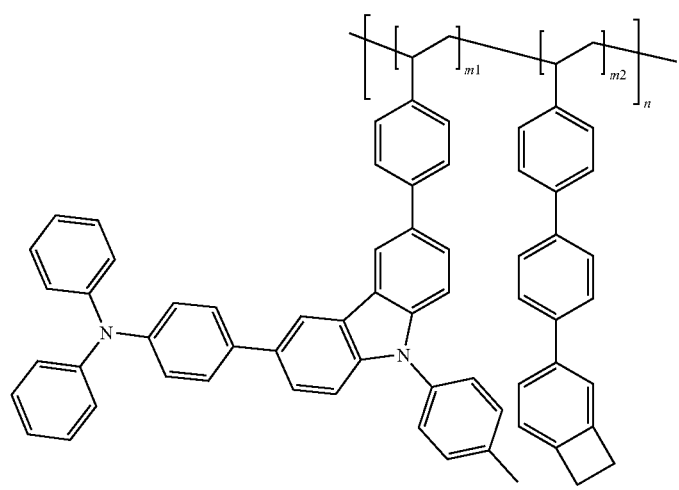
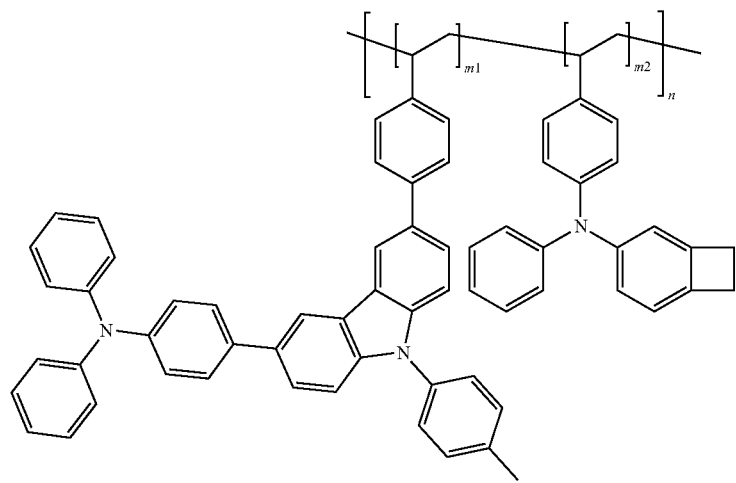

-continued
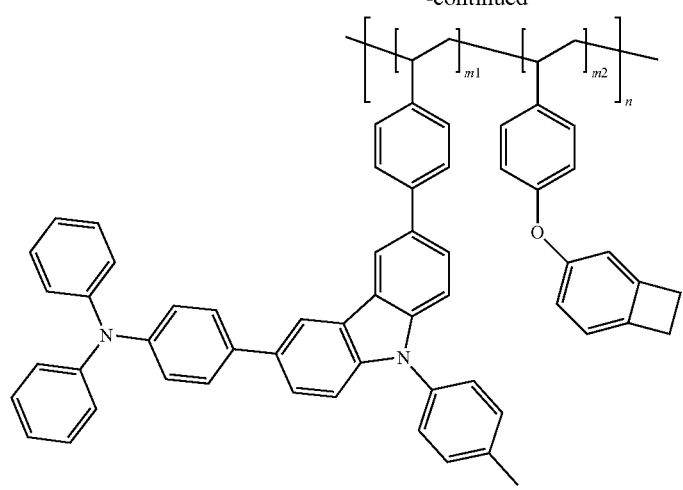
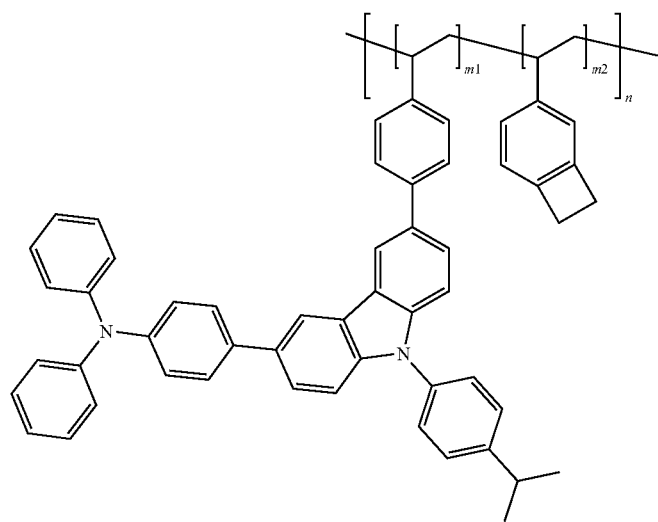
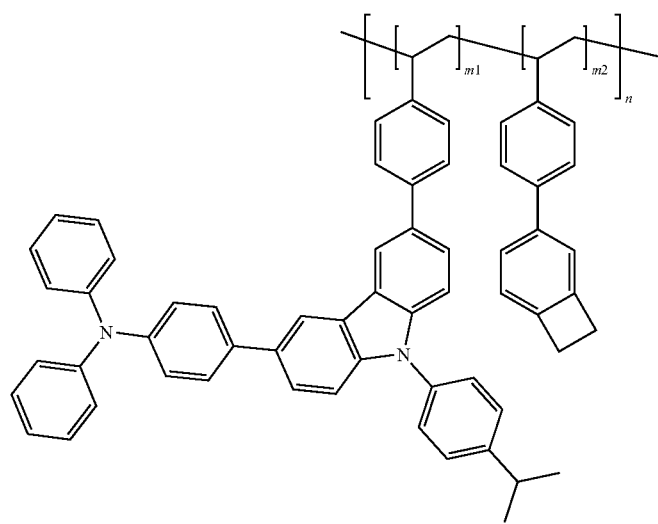

-continued
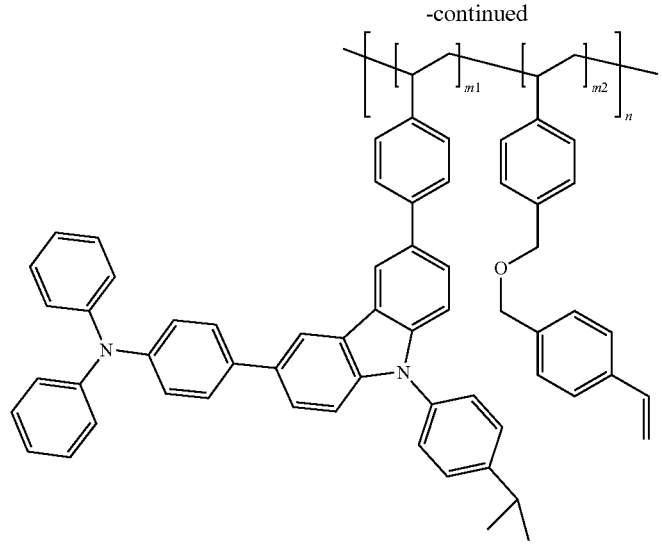
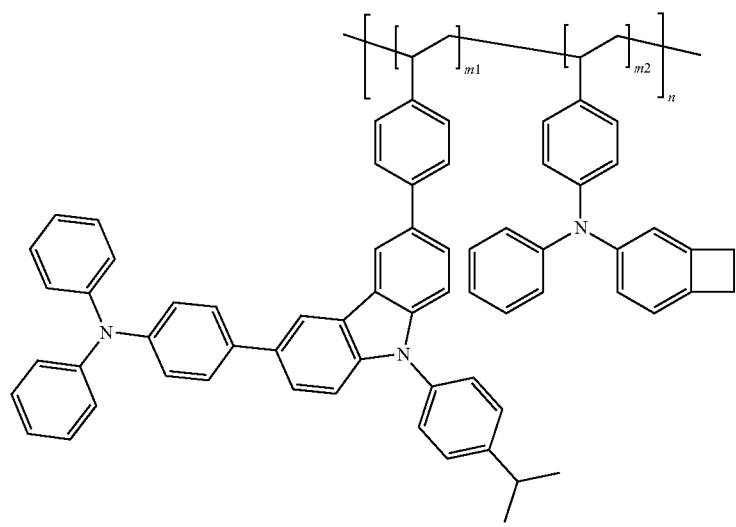
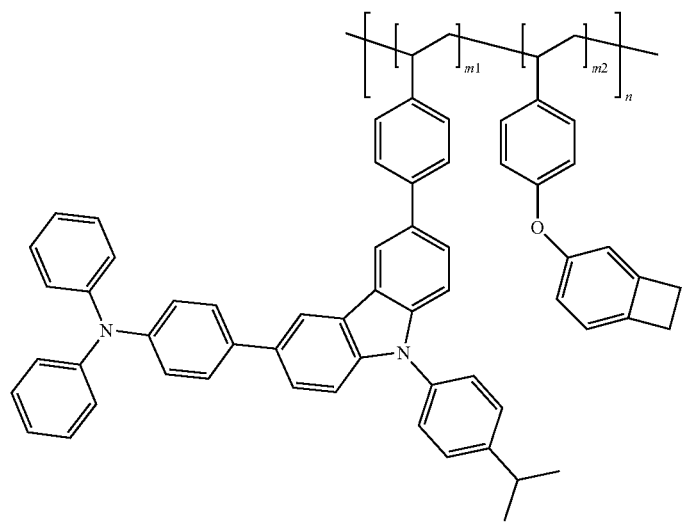

-continued
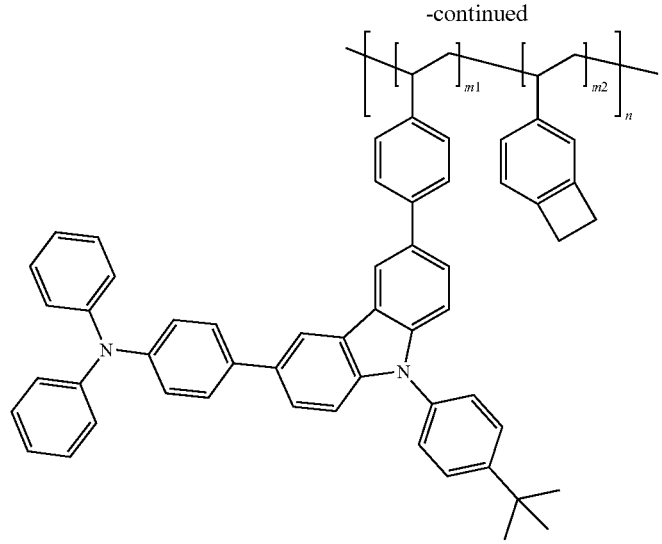
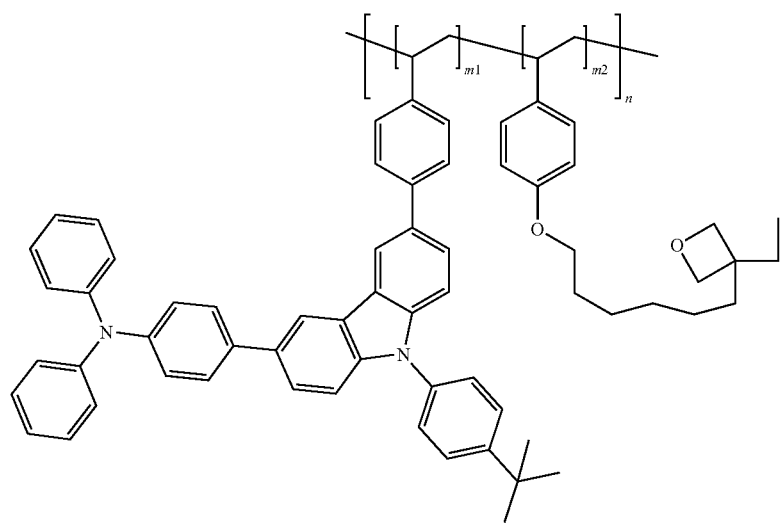
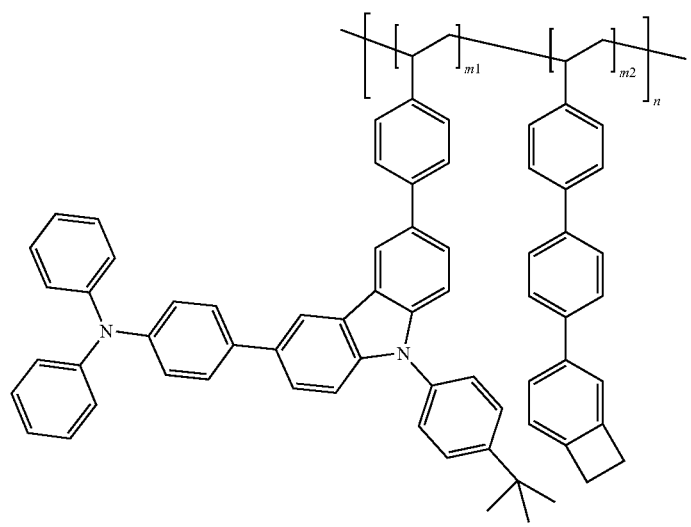

-continued
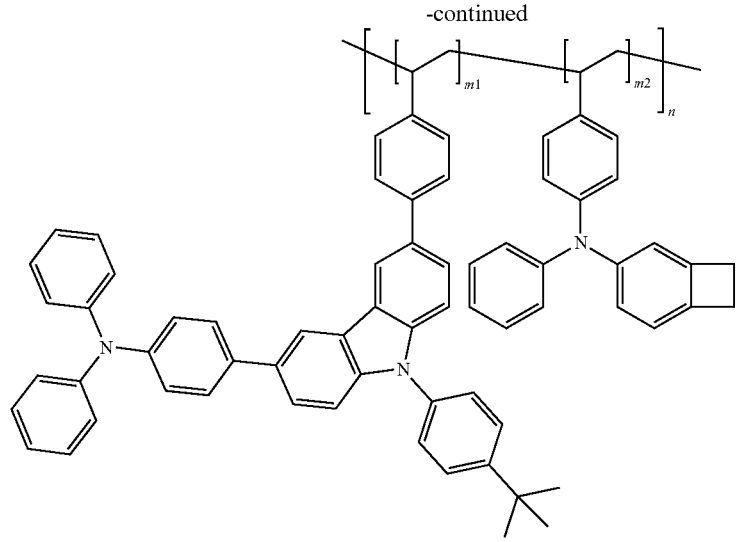
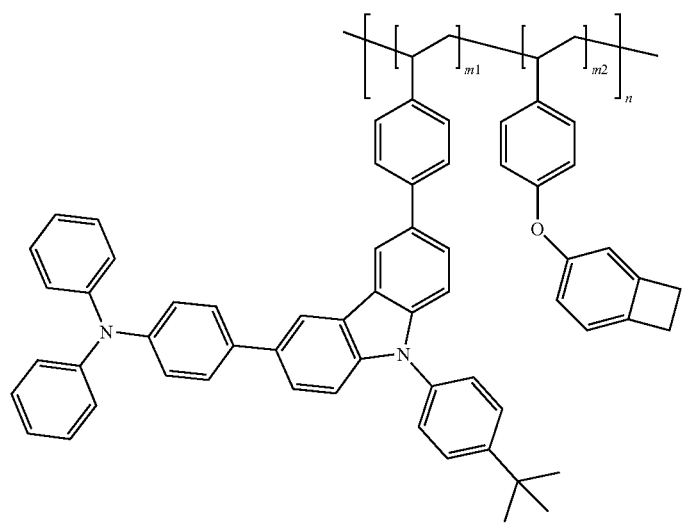
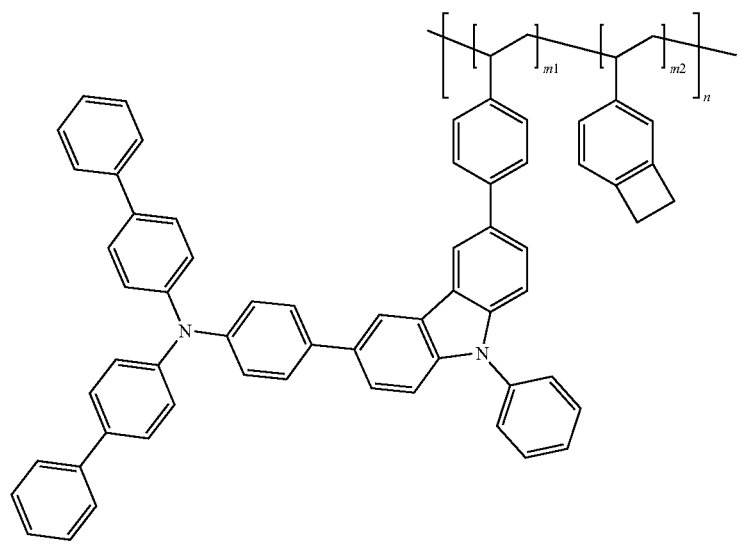

-continued
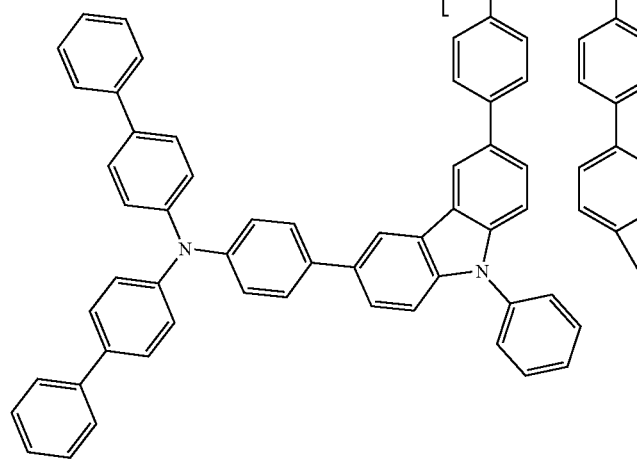
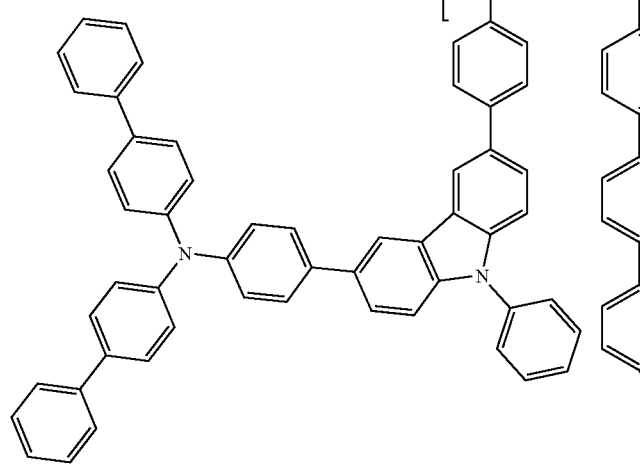
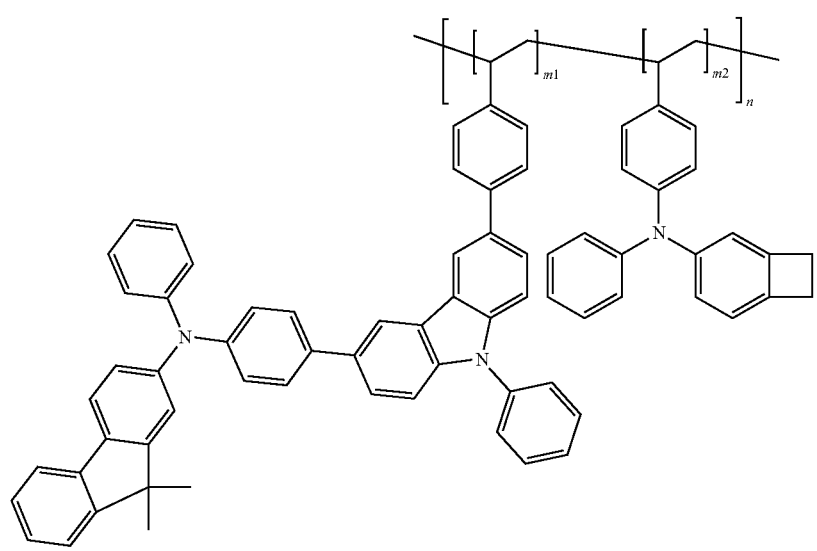

-continued
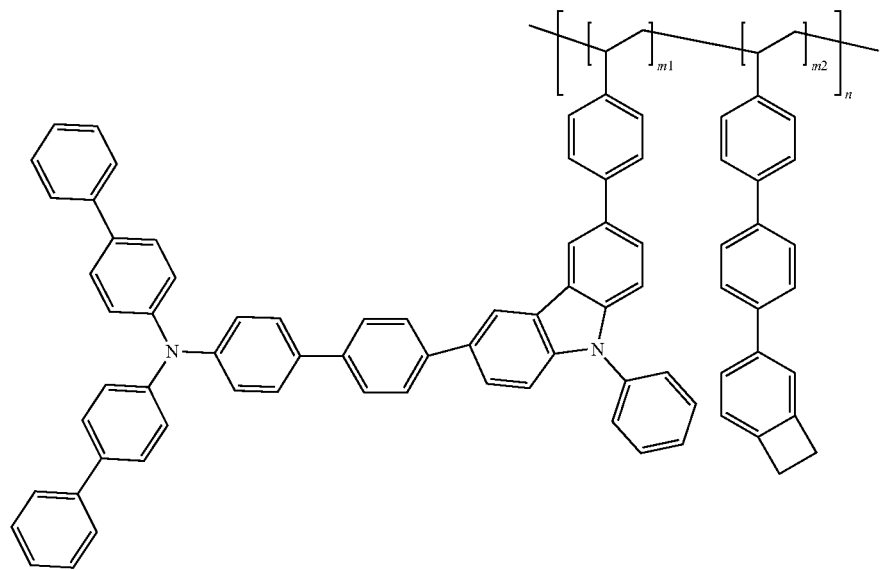
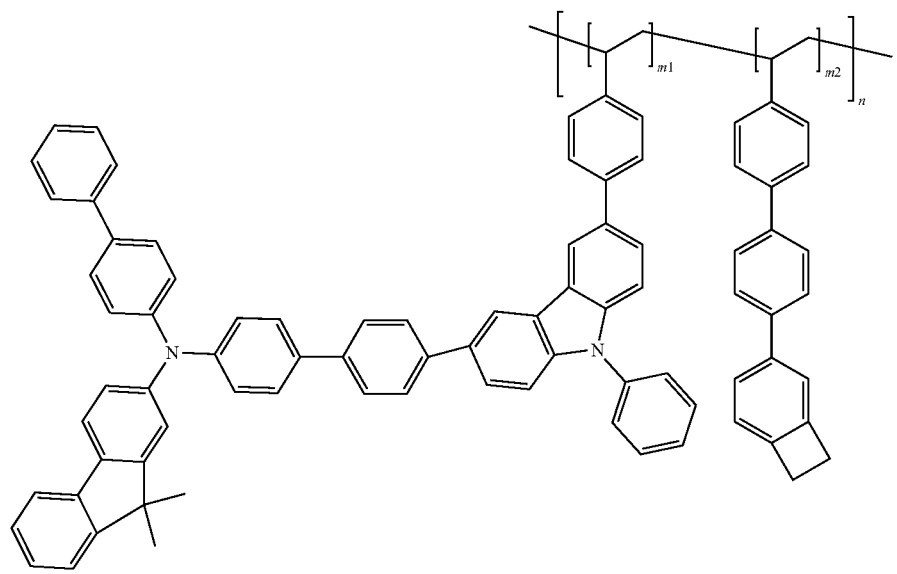
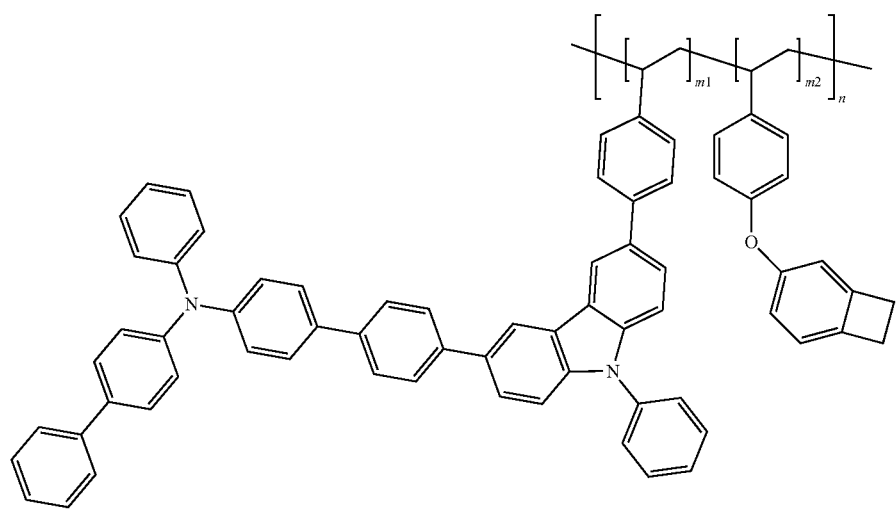

-continued
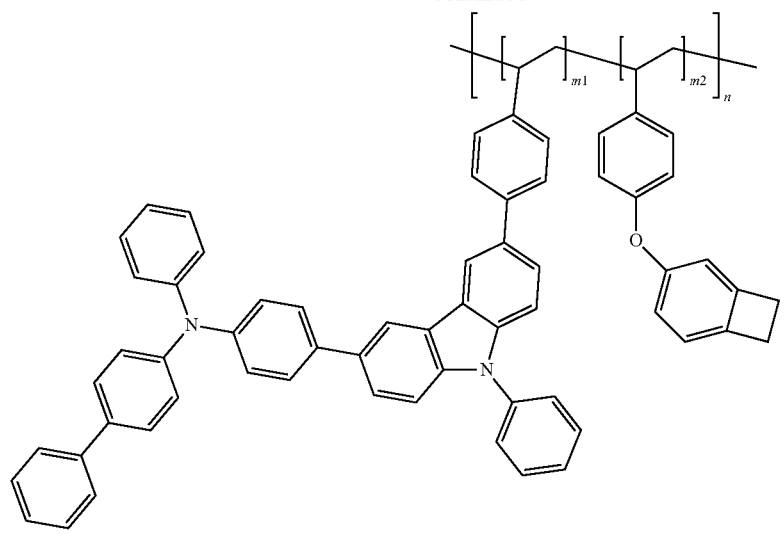
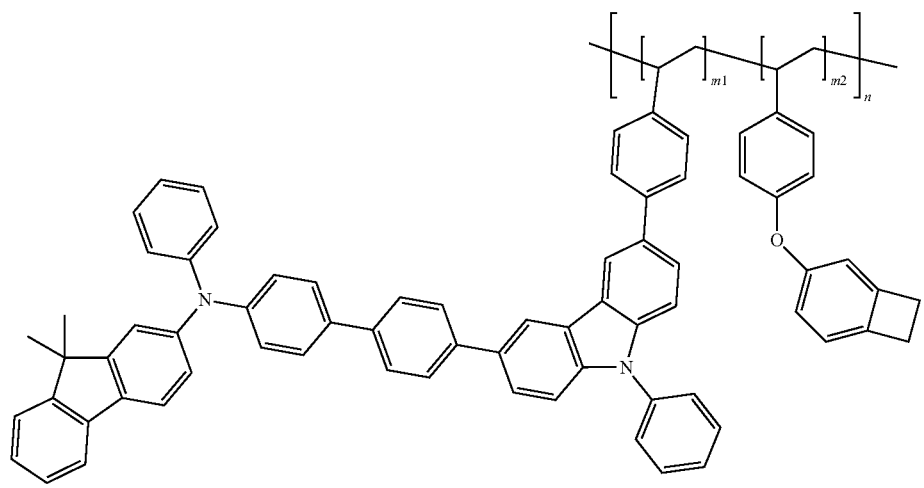
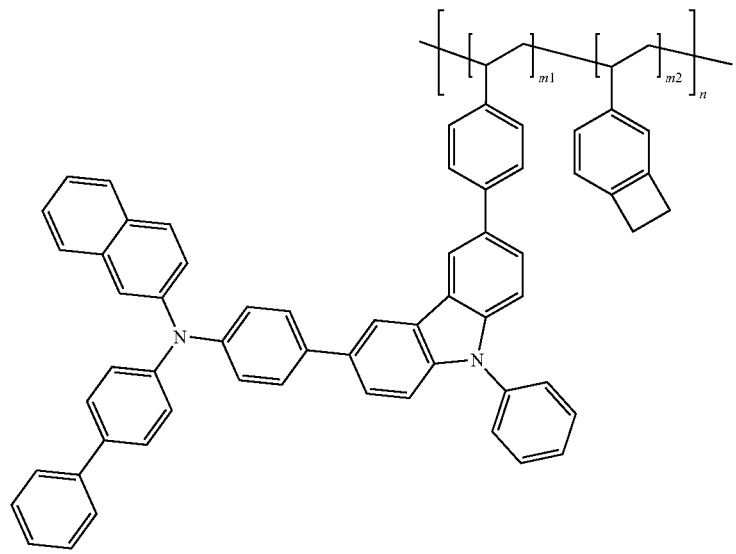

-continued
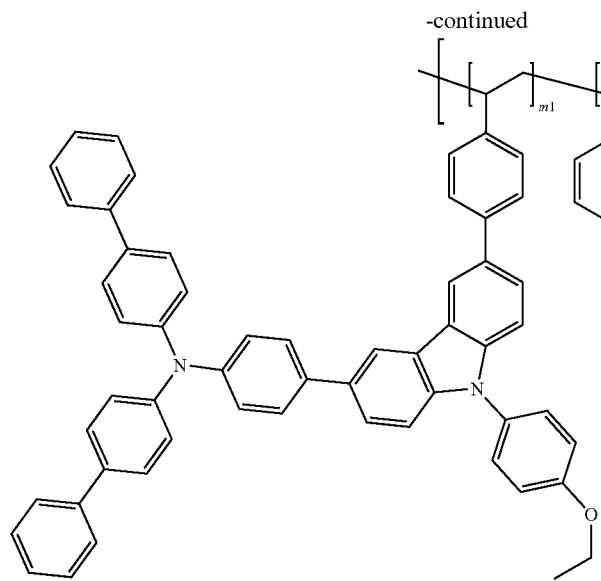
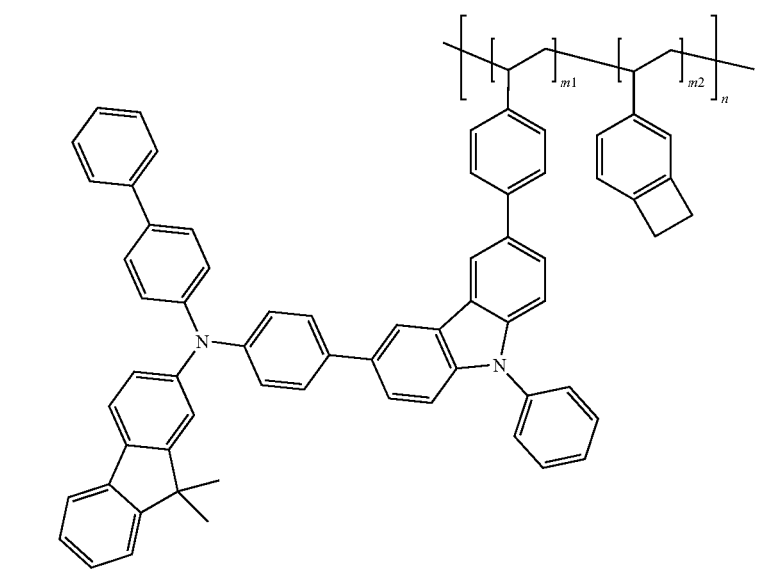
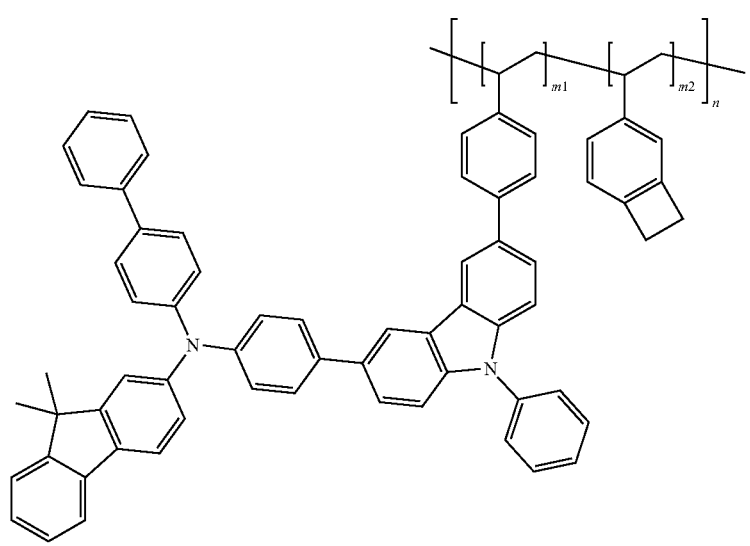

-continued

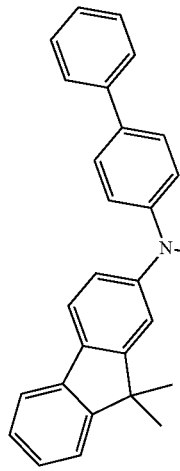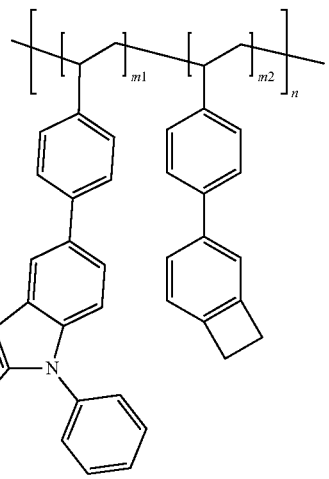

in the structures, m1 is a mole fraction and 0<m1<1, m2 is a mole fraction and 0<m2<1, m1+m2≤1, and n is a repeating number of the unit, and an integer from 1 to 10,000.

9. The polymer of claim 1, wherein the polymer has a number average molecular weight of 5,000 g/mol to 1,000,000 g/mol.

10. A coating composition comprising the polymer according to claim 1.

11. The coating composition of claim 10, further comprising:
a p-doping material.

12. An organic light emitting device comprising:
a first electrode;
a second electrode provided to face the first electrode; and
an organic material layer having at least one layers provided between the first electrode and the second electrode,
wherein the at least one layer of the organic material layer comprises a cured product of the coating composition of claim 10.

13. The organic light emitting device of claim 12, wherein the cured product of the coating composition is in a state in which the coating composition is cured by a heat treatment or a light treatment.

14. The organic light emitting device of claim 12, wherein the at least one layer of the organic material layer comprising the cured product of the coating composition is a hole transport layer, a hole injection layer, or a layer which simultaneously transports and injects holes.

15. The organic light emitting device of claim 12, wherein the at least one layer of the organic material layer comprising the cured product of the coating composition comprises a light emitting layer, and the light emitting layer comprises the cured product of the coating composition.

16. The polymer of claim 1, wherein m1 is 0.5<m1<0.99, and m2 is 0.01<m2<0.5.

17. The polymer of claim 1, wherein X is selected from the following structures.

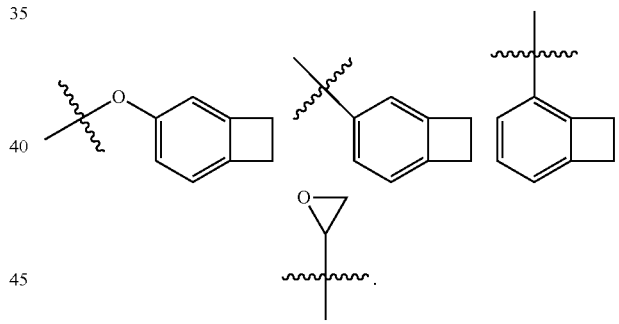

18. The coating composition of claim 10, further comprising a solvent wherein the solvent has a boiling point of 40° C. to 250° C., and a viscosity of from 1 cp to 10 cp.

19. The coating composition of claim 10, which has a concentration of 0.1 wt/v % to 20 wt/v %.

* * * * *